(12) United States Patent
Shibazaki

(10) Patent No.: US 8,773,635 B2
(45) Date of Patent: *Jul. 8, 2014

(54) EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

(*) Notice: Subject to any disclaimer, the term of this patent is extended or adjusted under 35 U.S.C. 154(b) by 907 days.

This patent is subject to a terminal disclaimer.

(21) Appl. No.: 12/640,508

(22) Filed: Dec. 17, 2009

(65) Prior Publication Data

US 2010/0157275 A1   Jun. 24, 2010

Related U.S. Application Data

(60) Provisional application No. 61/139,314, filed on Dec. 19, 2008, provisional application No. 61/213,376, filed on Jun. 2, 2009, provisional application No. 61/272,398, filed on Sep. 21, 2009.

(30) Foreign Application Priority Data

May 20, 2009  (JP) .................................. 2009-122447
Sep. 14, 2009  (JP) .................................. 2009-211573

(51) Int. Cl.
  *G03B 27/42*  (2006.01)
  *G03B 27/32*  (2006.01)
  *G03B 27/58*  (2006.01)

(52) U.S. Cl.
  USPC .................................. 355/53; 355/72; 355/77

(58) Field of Classification Search
  None
  See application file for complete search history.

(56) References Cited

U.S. PATENT DOCUMENTS

| 4,171,162 | A | | 10/1979 | Gerard et al. |
| 4,465,368 | A | | 8/1984 | Matsuura et al. |
| 4,780,617 | A | | 10/1988 | Umatate et al. |
| 5,196,745 | A | | 3/1993 | Trumper |
| 5,448,332 | A | | 9/1995 | Sakakibara et al. |
| 5,610,715 | A | | 3/1997 | Yoshii et al. |
| 5,646,413 | A | | 7/1997 | Nishi |
| 5,666,196 | A | * | 9/1997 | Ishii et al. ..................... 356/499 |

(Continued)

FOREIGN PATENT DOCUMENTS

| EP | 1 796 144 A1 | 6/2007 |
| EP | 2 068 112 A1 | 6/2009 |

(Continued)

OTHER PUBLICATIONS

U.S. Appl. No. 12/561,533, filed Sep. 17, 2009, in the name of Yuichi Shibazaki.

(Continued)

*Primary Examiner* — Peter B Kim
*Assistant Examiner* — Michelle Iacoletti
(74) *Attorney, Agent, or Firm* — Oliff PLC

(57) ABSTRACT

When a wafer on a fine movement stage supported by a coarse movement stage is exposed via a projection optical system with an illumination light at an exposure station, a position of the fine movement stage within an XY plane is measured with good precision by a measurement system. Further, when an alignment to a wafer on a fine movement stage supported by a coarse movement stage is performed at a measurement station, a position of the fine movement stage within an XY plane is measured with good precision by a measurement system.

30 Claims, 47 Drawing Sheets

(56) References Cited

U.S. PATENT DOCUMENTS

| | | |
|---|---|---|
| 5,969,441 A | 10/1999 | Loopstra et al. |
| 6,208,407 B1 | 3/2001 | Loopstra |
| 6,590,634 B1 | 7/2003 | Nishi et al. |
| 6,611,316 B2 | 8/2003 | Sewell |
| 6,778,257 B2 | 8/2004 | Bleeker et al. |
| 6,819,425 B2 | 11/2004 | Kwan |
| 6,956,222 B2 | 10/2005 | Gilissen et al. |
| 7,023,610 B2 | 4/2006 | Ohtsuki et al. |
| 7,025,498 B2 | 4/2006 | del Puerto |
| 7,102,729 B2 | 9/2006 | Renkens et al. |
| 7,161,659 B2 | 1/2007 | Van Den Brink et al. |
| 7,238,931 B2 | 7/2007 | Nabeshima et al. |
| 7,253,875 B1 | 8/2007 | Luttikhuis et al. |
| 7,256,871 B2 | 8/2007 | Loopstra et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 7,804,582 B2 * | 9/2010 | Zaal et al. ............ 355/72 |
| 7,999,918 B2 | 8/2011 | Shibazaki |
| 8,514,373 B2 * | 8/2013 | Shibazaki ............ 355/72 |
| 2002/0041377 A1 | 4/2002 | Hagiwara et al. |
| 2003/0025890 A1 | 2/2003 | Nishinaga |
| 2003/0223079 A1 | 12/2003 | Hill |
| 2004/0263846 A1 | 12/2004 | Kwan |
| 2005/0052632 A1 | 3/2005 | Miyajima |
| 2005/0128461 A1 | 6/2005 | Beems et al. |
| 2005/0236558 A1 | 10/2005 | Nabeshima et al. |
| 2005/0259234 A1 | 11/2005 | Hirukawa et al. |
| 2006/0101928 A1 | 5/2006 | Binnard et al. |
| 2006/0114445 A1 | 6/2006 | Ebihara |
| 2006/0139660 A1 | 6/2006 | Patrick Kwan |
| 2006/0187431 A1 | 8/2006 | Shibazaki |
| 2006/0227309 A1 | 10/2006 | Loopstra et al. |
| 2007/0035267 A1 | 2/2007 | Gao et al. |
| 2007/0052976 A1 | 3/2007 | Pril et al. |
| 2007/0076218 A1 | 4/2007 | Van Empel et al. |
| 2007/0127006 A1 | 6/2007 | Shibazaki |
| 2007/0195296 A1 | 8/2007 | Van Der Pasch et al. |
| 2007/0216882 A1 | 9/2007 | Benschop et al. |
| 2007/0223007 A1 | 9/2007 | Klaver et al. |
| 2007/0263191 A1 | 11/2007 | Shibazaki |
| 2007/0263197 A1 | 11/2007 | Luttikhuis et al. |
| 2007/0267995 A1 | 11/2007 | Binnard et al. |
| 2007/0288121 A1 | 12/2007 | Shibazaki |
| 2008/0043212 A1 | 2/2008 | Shibazaki |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094594 A1 | 4/2008 | Shibazaki |
| 2008/0094604 A1 | 4/2008 | Shibazaki |
| 2008/0105026 A1 | 5/2008 | Loopstra et al. |
| 2008/0106722 A1 | 5/2008 | Shibazaki |
| 2008/0143994 A1 | 6/2008 | Shibazaki |
| 2008/0165345 A1 | 7/2008 | Hill |
| 2008/0218713 A1 | 9/2008 | Shibazaki |
| 2008/0236997 A1 | 10/2008 | Ebihara |
| 2008/0246936 A1 | 10/2008 | Loopstra et al. |
| 2008/0278705 A1 | 11/2008 | Binnard et al. |
| 2008/0297751 A1 | 12/2008 | Shibazaki |
| 2009/0004580 A1 | 1/2009 | Kanaya |
| 2009/0027640 A1 | 1/2009 | Shibazaki et al. |
| 2009/0033900 A1 | 2/2009 | Kanaya |
| 2009/0040488 A1 | 2/2009 | Shibazaki et al. |
| 2009/0051892 A1 | 2/2009 | Shibazaki et al. |
| 2009/0051893 A1 | 2/2009 | Shibazaki et al. |
| 2009/0051894 A1 | 2/2009 | Shibazaki et al. |
| 2009/0051895 A1 | 2/2009 | Shibazaki |
| 2009/0053629 A1 | 2/2009 | Shibazaki et al. |
| 2009/0059194 A1 | 3/2009 | Kanaya |
| 2009/0059198 A1 | 3/2009 | Shibazaki et al. |
| 2009/0073405 A1 | 3/2009 | Kanaya |
| 2009/0115982 A1 | 5/2009 | Kanaya |
| 2009/0122285 A1 | 5/2009 | Kanaya |
| 2009/0122286 A1 | 5/2009 | Kanaya |
| 2009/0122287 A1 | 5/2009 | Kanaya |
| 2009/0153822 A1 | 6/2009 | Shibazaki |
| 2009/0161086 A1 | 6/2009 | Shibazaki |
| 2009/0190110 A1 | 7/2009 | Shibazaki |
| 2009/0207422 A1 | 8/2009 | Loopstra et al. |
| 2009/0225288 A1 | 9/2009 | Shibazaki |
| 2009/0233234 A1 | 9/2009 | Shibazaki |
| 2009/0284716 A1 | 11/2009 | Kanaya |
| 2009/0284717 A1 | 11/2009 | Kanaya |
| 2009/0284723 A1 | 11/2009 | Shibazaki |
| 2009/0284724 A1 | 11/2009 | Kanaya |
| 2010/0045961 A1 | 2/2010 | Li et al. |

FOREIGN PATENT DOCUMENTS

| | | |
|---|---|---|
| JP | A-57-117238 | 7/1982 |
| JP | A-4-265805 | 9/1992 |
| JP | A-09-102453 | 4/1997 |
| JP | A-2002-014005 | 1/2002 |
| JP | A-2005-086093 | 3/2005 |
| WO | WO 01/35168 A1 | 5/2001 |
| WO | WO 03/065428 A1 | 8/2003 |
| WO | WO 2006/038952 A2 | 4/2006 |
| WO | WO 2007/083758 A1 | 7/2007 |
| WO | WO 2007/097379 A1 | 8/2007 |
| WO | WO 2007/097380 A1 | 8/2007 |
| WO | WO 2008/029757 A1 | 3/2008 |
| WO | WO 2008/037131 A1 | 4/2008 |
| WO | WO 2008/038752 A1 | 4/2008 |
| WO | WO 2008/056735 A1 | 5/2008 |
| WO | WO 2008/061186 A2 | 5/2008 |
| WO | WO 2009/050675 A2 | 4/2009 |

OTHER PUBLICATIONS

U.S. Appl. No. 12/561,480, filed Sep. 17, 2009, in the name of Yuichi Shibazaki.
U.S. Appl. No. 12/561,510, filed Sep. 17, 2009, in the name of Yuichi Shibazaki.
U.S. Appl. No. 12/385,577, filed Apr. 13, 2009, in the name of Yuichi Shibazaki.
U.S. Appl. No. 12/640,636, filed Dec. 17, 2009, in the name of Yuichi Shibazaki.
U.S. Appl. No. 12/640,617, filed Dec. 17, 2009, in the name of Yuichi Shibazaki.
U.S. Appl. No. 12/640,299, filed Dec. 17, 2009, in the name of Yuichi Shibazaki.
Written Opinion of the International Searching Authority issued in PCT/JP2009/071711 on Apr. 6, 2010.
International Search Report issued in PCT/JP2009/071711 on Apr. 6, 2010.
Written Opinion of the International Searching Authority issued in PCT/JP2009/071721 on Mar. 25, 2010.
International Search Report issued in PCT/JP2009/071721 on Mar. 25, 2010.
Written Opinion of the International Searching Authority issued in PCT/JP2009/071734 on Mar. 24, 2010.
International Search Report issued in PCT/JP2009/071734 on Mar. 24, 2010.
International Search Report issued in Application No. PCT/JP2009/071722 on Apr. 19, 2010.
Written Opinion of the International Searching Authority issued in Application No. PCT/JP2009/071722 on Apr. 19, 2010.
Mar. 2, 2012 Non-Final Rejection issued in U.S. Appl. No. 12/561,480.
Jul. 23, 2012 Notice of Allowance issued in U.S. Appl. No. 12/561,480.
Mar. 2, 2012 Office Action issued in U.S. Appl. No. 12/561,533.
Dec. 16, 2009 International Search Report and Written Opinion issued in Application No. PCT/JP2009/066847.

(56) References Cited

OTHER PUBLICATIONS

Apr. 14, 2010 International Search Report issued in International Patent Application No. PCT/JP2009/066848.

Apr. 30, 2010 Written Opinion issued in Patent Application No. PCT/JP2009/066848.
Sep. 3, 2013 Office Action issued in Japanese Patent Application No. 2009-287434 (with translation).

* cited by examiner

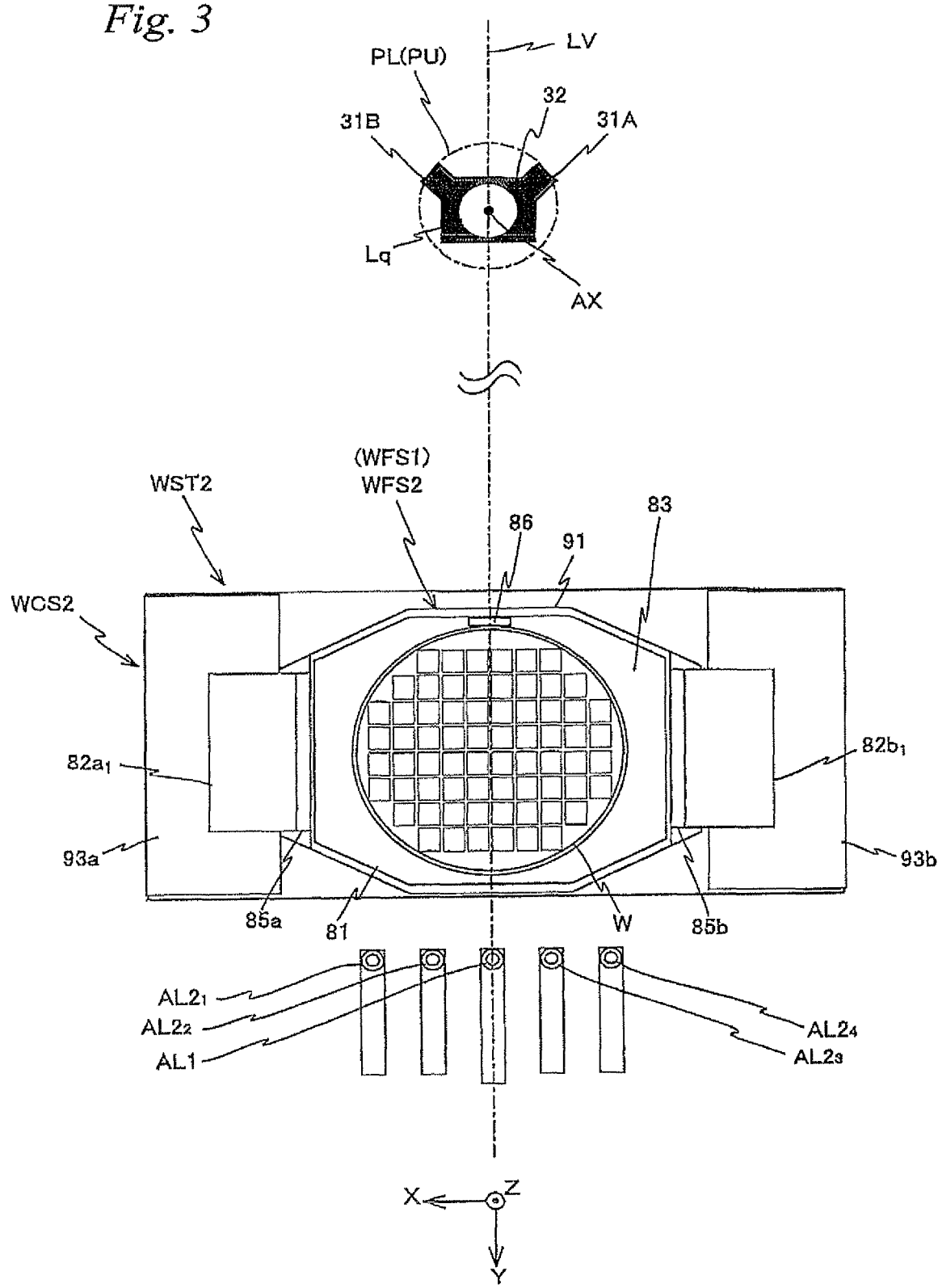

Fig. 20A
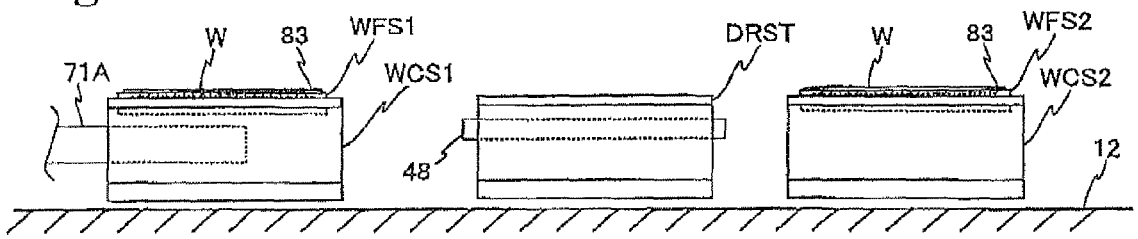
Fig. 20B
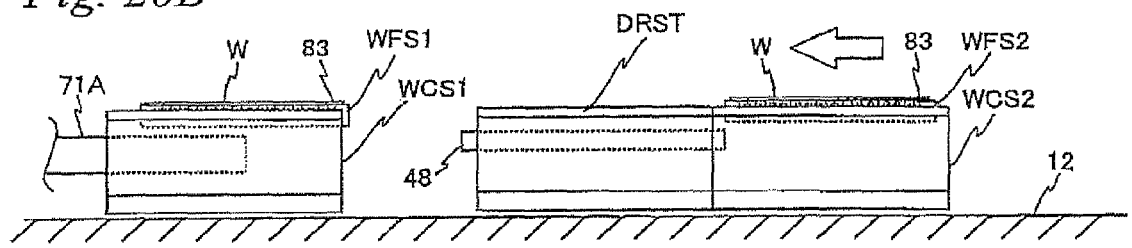
Fig. 20C
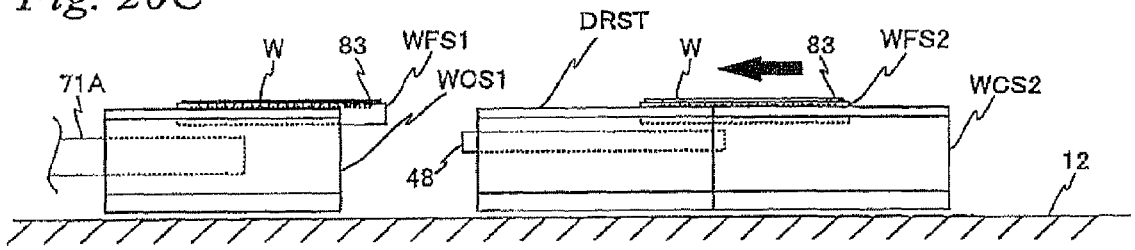
Fig. 20D
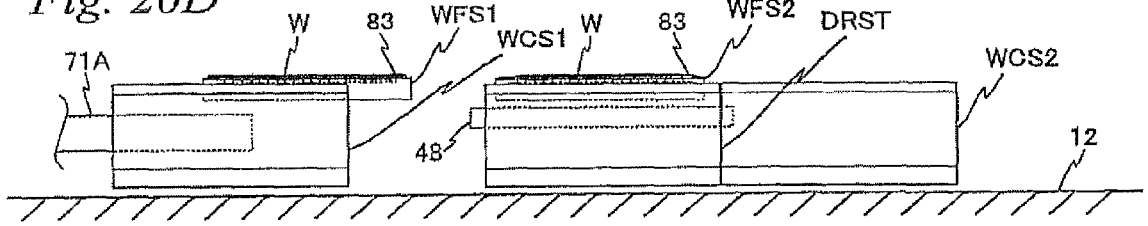
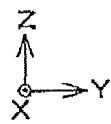

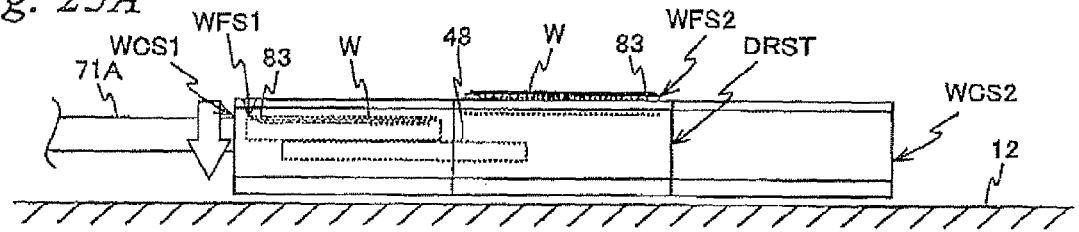
Fig. 25A
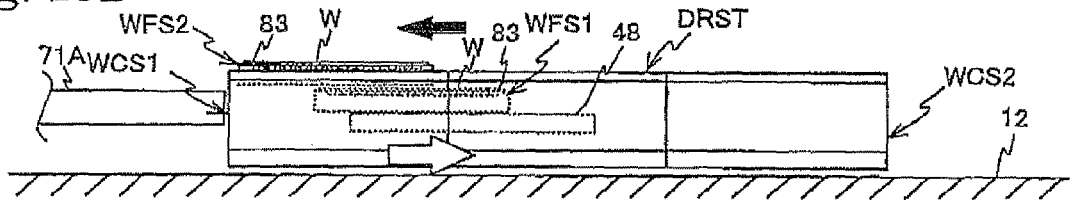
Fig. 25B
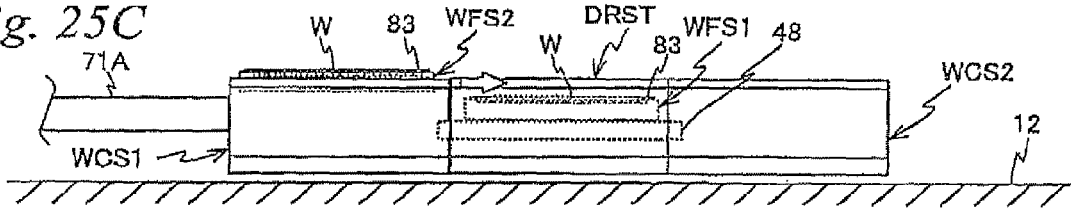
Fig. 25C
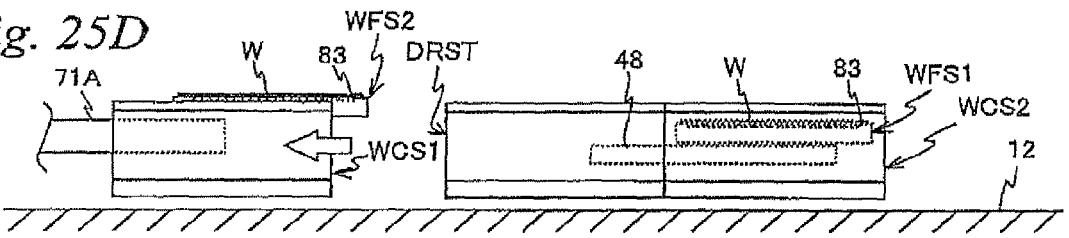
Fig. 25D
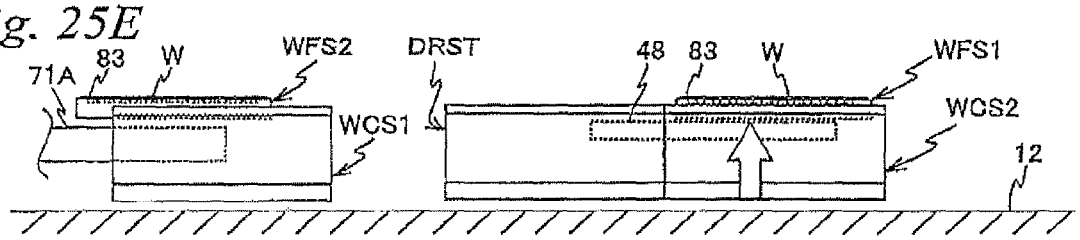
Fig. 25E
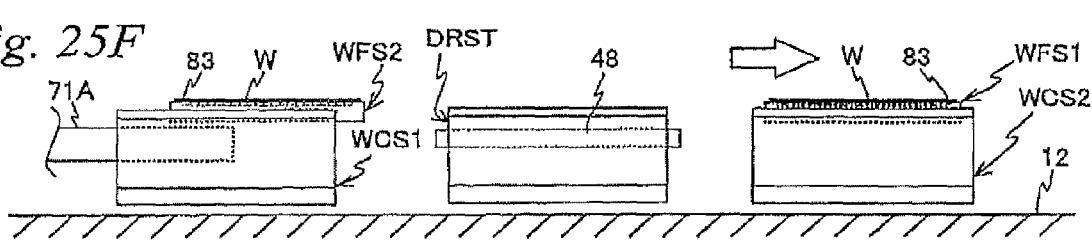
Fig. 25F
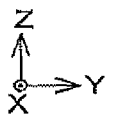

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/139,314 filed Dec. 19, 2008, Provisional Application No. 61/213,376 filed Jun. 2, 2009, and Provisional Application No. 61/272,398 filed Sep. 21, 2009, the disclosures of which are hereby incorporated herein by reference in its entirety.

BACKGROUND OF THE INVENTION

1. Field of the Invention

The present invention relates to exposure apparatuses, exposure methods, and device manufacturing methods, and more particularly to an exposure apparatus and an exposure method which are used in a lithography process to produce electronic devices such as a semiconductor device and the like, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

Substrates such as a wafer, a glass plate or the like subject to exposure which are used in these types of exposure apparatuses are gradually (for example, in the case of a wafer, in every ten years) becoming larger. Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more the number of chips from the current 300 mm wafer, which contributes to reducing the cost. In addition, it is expected that through efficient use of energy, water, and other resources, cost of all resource use will be reduced.

Semiconductor devices are gradually becoming finer, therefore, high resolution is required in exposure apparatuses. As means for improving the resolution, shortening a wavelength of an exposure light, as well as increasing (a higher NA) a numerical aperture of a projection optical system can be considered. To increase the substantial numerical aperture of the projection optical system as much as possible, various proposals are made of a liquid immersion exposure apparatus that exposes a wafer via a projection optical system and liquid (refer to, e.g., U.S. Patent Application Publication 2005/0259234, U.S. Patent Application Publication 2008/0088843 and the like).

However, in the local liquid immersion type exposure apparatuses disclosed in, for example, U.S. Patent Application Publication 2005/0259234, U.S. Patent Application Publication 2008/0088843 and the like, in the case of constantly maintaining a liquid immersion space formed under the projection optical system so as to maximize throughput, a plurality of stages (for example, two wafer stages, or a wafer stage and a measurement stage) has to be placed right under the projection optical system interchangeably.

When the size of the wafer becomes as large as 450 mm, while the number of dies (chips) output from a single wafer increases, a risk also occurs of throughput deceasing due to an increase in the time required to perform an exposure process on a single wafer. Therefore, as a method of improving throughput, employing a twin stage method can be considered where an exposure process on a wafer is performed on one wafer stage, and processing such as wafer exchange, alignment or the like is performed concurrently on another wafer stage, as is disclosed in, for example, U.S. Pat. No. 6,590,634, U.S. Pat. No. 5,969,441, or U.S. Pat. No. 6,208,407 and the like. However, applying the exposure apparatus using the conventional twin stage method to the processing of the 450 mm wafer increased the size of the wafer stage, as well as its weight, which could decrease the position controllability, and consequently decrease an overlay accuracy between a pattern (shot area) already formed on a wafer and a pattern of the next layer.

SUMMARY OF THE INVENTION

According to a first aspect of the present invention, there is provided a first exposure apparatus that exposes an object with an energy beam, the apparatus comprising: a holding member which holds the object, and is also movable at least within a two-dimensional plane including a first axis and a second axis that are orthogonal to each other; an exposure station which has a first measurement system that irradiates at least one first measurement beam from below on the holding member and receives a return light of the first measurement beam so as to measure a positional information of the holding member within the two-dimensional plane when the holding member is in a first area, and in which an exposure processing to irradiate the energy beam on the object is performed; and a measurement station which has a second measurement system which is placed away from the exposure station on one side in a direction parallel to the first axis that irradiates at least one second measurement beam from below on the holding member and receives a return light of the second measurement beam so as to measure a positional information of the holding member within the two-dimensional plane when the holding member is in a second area, and in which a measurement processing on the object is performed.

According to this apparatus, when an exposure processing where an energy beam is irradiated on an object held by a holding member at an exposure station, positional information of the holding member within the two-dimensional plane can be measured with good precision by the first measurement system. Further, when a predetermined measurement processing is performed to an object held by a holding member at a measurement station, positional information of the holding member within the two-dimensional plane can be measured with good precision by the second measurement system.

According to a second aspect of the present invention, there is provided a device manufacturing method, including exposing an object with the first exposure apparatus of the present invention; and developing the object which has been exposed.

According to a third aspect of the present invention, there is provided a second exposure apparatus which exposes a plurality of divided areas on an object with an energy beam and forms a pattern, the apparatus comprising: a movable body which is movable at least along a two-dimensional plane including a first axis and a second axis that are orthogonal to each other; a holding member which is supported by the movable body and is relatively movable with respect to the movable body at least within a plane parallel to the two-dimensional plane holding the object, and whose measurement plane is provided on a plane substantially parallel to the two-dimensional plane; a mark detection system which detects a mark on the object; a first measurement system which has a head section which irradiates at least one first measurement beam on the measurement plane and receives light of the first measurement beam from the measurement plane, and measures positional information at least within the two-dimensional plane of the holding member based on an output of the head section; a drive system which drives the holding member in one of an individual and integral manner with the movable body; and a controller which detects each of a plurality of marks placed on the object corresponding to the plurality of divided areas using the mark detection system while driving the holding member via the drive system, and obtains a target position information so as to align the plurality of divided areas on the object to a predetermined point, based on the detection results and the positional information measured by the first measurement system at the time of each mark detection.

According to this apparatus, each of a plurality of marks placed on the object corresponding to the plurality of divided areas are detected by a controller, using the mark detection system while driving the holding member via the drive system, and a target position information is obtained so as to align the plurality of divided areas on the object to a predetermined point, based on the detection results and the positional information measured by the first measurement system at the time of each mark detection. Accordingly, by driving the holding member which holds the object based on the target position information, it becomes possible to align the plurality of divided areas to a predetermined point with high precision. For example, when the predetermined point serves as a generation position of the pattern, it becomes possible to perform an overlay with high precision between each of the plurality of divided areas and the pattern.

According to a fourth aspect of the present invention, there is provided a device manufacturing method, including forming a pattern on a plurality of divided areas on an object with the second exposure apparatus of the present invention; and developing the object which has been exposed.

According to a fifth aspect of the present invention, there is provided a third exposure apparatus that exposes an object with an energy beam, the apparatus comprising: a movable body which movably supports a holding member that holds the object; a detection system which irradiates an optical beam on the object and detects alignment information of the object; a drive system which drives the movable body and relatively drives the object with respect to the optical beam of the detection system; a first measurement system which has at least a part of the system provided in a measurement member placed below the holding member, and measures positional information of the holding member by irradiating a measurement beam on a measurement plane of the holding member at the time of detection of the alignment information; and a controller which executes detection of alignment information by the detection system, based on positional information of the holding member measured by the first measurement system.

According to the apparatus, the drive system drives the movable body which movably supports the holding member holding the object, and the object is relatively moved with respect to the optical beam of the detection system, and alignment information of the object is detected by the detection system. At the time of detection of alignment information, a measurement beam is irradiated on a measurement plane of the holding member from the first measurement system which has at least a part of the system provided in a measurement member placed below the holding member, and positional information of the holding member is measured. And, the controller executes detection of alignment information by the detection system, based on positional information of the holding member measured by the first measurement system. Therefore, it becomes possible to obtain alignment information with good precision.

According to a sixth aspect of the present invention, there is provided an exposure method in which an object is exposed with an energy beam, the method comprising: detecting alignment information of the object by driving a movable body which movably supports a holding ember that holds the object and relatively moving the object with respect to an optical beam of the detection system, using the detection system; measuring positional information of the holding member by irradiating a measurement beam on a measurement plane of the holding member at the time of detection of the alignment information, from a first measurement system which has at least a part of the system provided in a measurement member placed below the holding member; and executing detection of alignment information by the detection system, based on positional information of the holding member measured by the first measurement system.

According to the method, it becomes possible to obtain alignment information with good precision.

According to a seventh aspect of the present invention, there is provided a device manufacturing method, including exposing an object with the exposure method of the present invention; and developing the object which has been exposed.

BRIEF DESCRIPTION OF THE DRAWINGS

In the accompanying drawings;

FIG. 3 is a planar view showing a placement of an alignment system and a projection unit PU which the exposure apparatus in FIG. 1 is equipped with, along with a wafer stage;

FIG. 4 is a view used to explain a movable blade which the exposure apparatus in FIG. 1 is equipped with;

FIGS. 20A to 20D are views used to explain a parallel processing performed using fine movement stages WFS1 and WFS2 (No. 1) in the exposure apparatus of the first embodiment;

FIGS. 25A to 25F are views used to explain a parallel processing performed using fine movement stages WFS1 and WFS2 (No. 2) in the exposure apparatus of the first embodiment;

FIG. 31 is an enlarged planar view showing the vicinity of an alignment system (aligner) which the exposure apparatus in FIG. 26 is equipped with;

DESCRIPTION OF THE EMBODIMENTS

A First Embodiment

A first embodiment of the present invention will be described below, with reference to FIGS. 1 to 25F.

Figure 1:
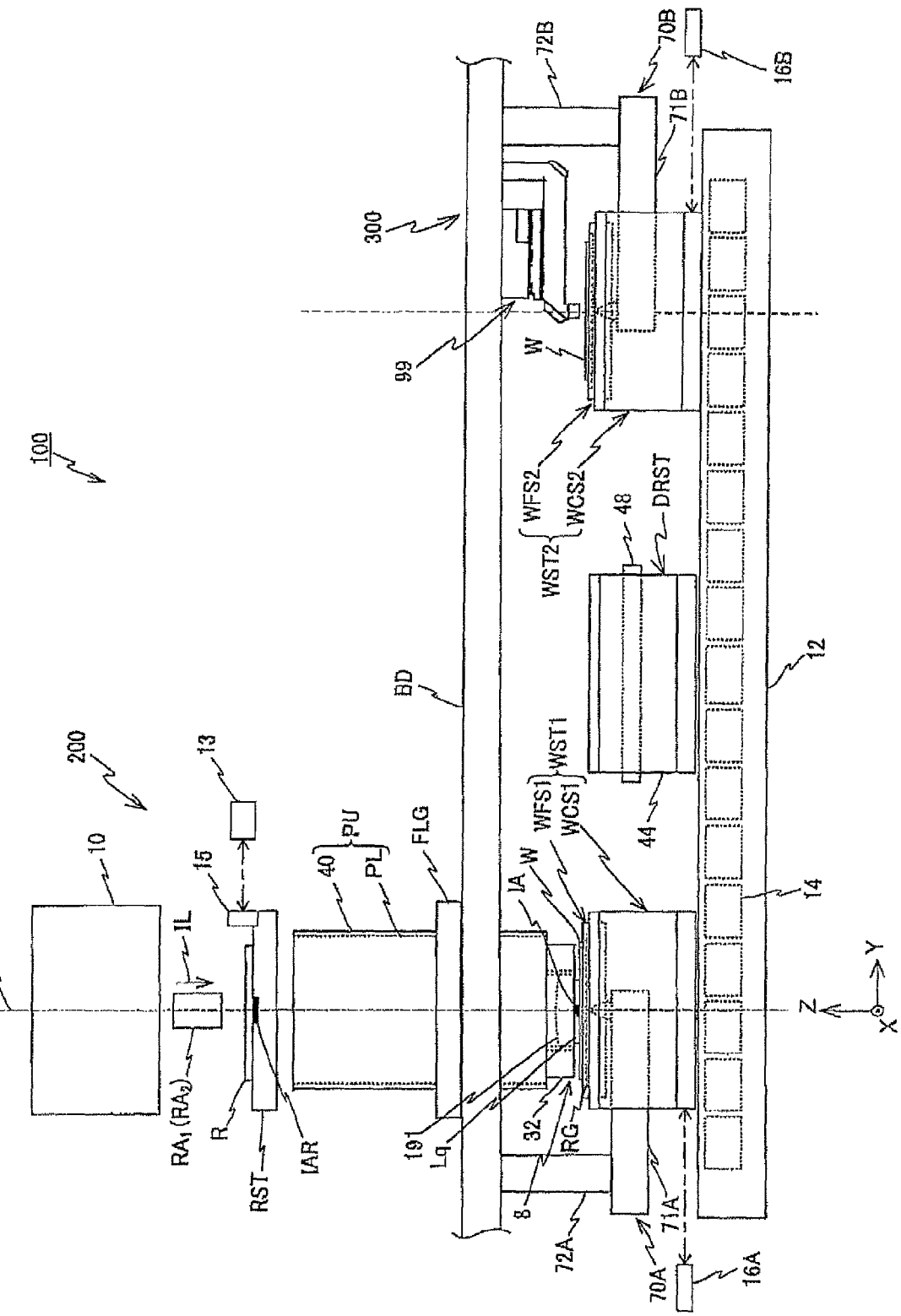
FIG. 1 is a view that schematically shows a configuration of an exposure apparatus of a first embodiment.

FIG. 1 schematically shows a configuration of an exposure apparatus 100 in the first embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively. The same can be said for a second embodiment which will be described later on.

As shown in FIG. 1, exposure apparatus 100 is equipped with an exposure station 200 (exposure processing section) placed close to the end on the −Y side of a base board 12, a measurement station 300 (measurement processing section) placed close to the end on the −Y side of base board 12, two wafer stages WST1 and WST2, a relay stage DRST, and a control system and the like for these parts. Now, base board 12 is supported on the floor surface almost horizontally (parallel to the XY plane) by a vibration isolation mechanism (omitted in drawings). Base board 12 is made of a member having a tabular form, and the degree of flatness of the upper surface is extremely high and serves as a guide surface when the three stages WST1, WST2, and DRST described above move. Incidentally, in FIG. 1, wafer stage WST1 is located at exposure station 200, and wafer W is held on wafer stage WST1 (to be more specific, wafer fine movement stage (hereinafter shortly described as fine movement stage) WFS1). Further, wafer stage WST2 is located at measurement station 300, and another wafer W is held on wafer stage WST2 (to be more specific, fine movement stage WFS2).

Exposure station 200 comprises an illumination system 10, a reticle stage RST, a projection unit PU, a local liquid immersion device 8 and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR which is set on a reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an X) plane, for example, by a reticle stage drive section 11 (not shown in FIG. 1, refer to FIG. 14) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θ z direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface, orthogonal to the X-axis direction) fixed on reticle stage RST. The measurement values of reticle interferometer 13 are sent to a main controller 20 (not shown in FIG. 1, refer to FIG. 14). Incidentally, positional information of reticle stage RST can be measured by an encoder system as is disclosed in, for example, U.S. Patent Application Publication 2007/0288121 and the like.

Projection unit PU is placed below reticle stage RST in FIG. 1. Projection unit PU is supported via flange portion FLG provided in the outer periphery of the projection unit, by a main frame (also called a metrology frame) BD supported horizontally by a support member (not shown). Projection unit PU includes a barrel 40, and projection optical system PL held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination system 10 illuminates illumination area IAR on reticle R with illumination area IL, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on a wafer W whose surface is coated with a resist (a sensitive agent) and is placed on a second surface (image plane surface) side of projection optical system PL, on an area (hereinafter also referred to as an exposure area) IA conjugate with illumination area IAR. And by reticle stage RST holding reticle R and fine movement stage WFS1 (or fine movement stage WFS2) holding wafer W being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W. In the embodiment, main frame BD is supported almost horizontally by a plurality of (e.g. three or four) support members which are each placed on an installation surface (floor surface) via a vibration isolation mechanism. Incidentally, the vibration isolation mechanism can be placed between each of the support members and main frame BD. Further, as is disclosed in, for example, PCT International Publication 2006/038952, math frame BD (projection unit PU) can be supported by suspension with respect to a main frame member or to a reticle base (not shown), placed above projection unit PU.

Local liquid immersion device 8 is provided, corresponding to the point that exposure apparatus 100 of the embodiment performs exposure by a liquid immersion method. Local liquid immersion device 8 includes a liquid supply device 5, a liquid recovery device 6 (both of which are not shown in FIG. 1, refer to FIG. 14), a nozzle unit 32 and the like. As shown in FIG. 1, nozzle unit 32 is supported in a suspended state by main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. Nozzle unit 32 is equipped with a supply opening and a recovery opening of a liquid Lq, a lower surface to which wafer W is placed facing and at which the recovery opening is arranged, and a supply flow channel and a recovery flow channel that are connected to a liquid supply pipe 31A and a liquid recovery pipe 31B (both of which are not shown in FIG. 1, refer to FIG. 14), respectively. One end of a supply pipe (not shown) is connected to liquid supply pipe 31A while the other end of the supply pipe is connected to a liquid supply unit 5 (not shown in FIG. 1, refer to FIG. 14), and one end of a recovery pipe (not shown) is connected to liquid recovery pipe 31B while the other end of the recovery pipe is connected to a liquid recovery device 6 (not shown in FIG. 1, refer to FIG. 14). In the embodiment, main controller 20 controls liquid supply device 5 (refer to FIG. 14), and supplies liquid between tip lens 191 and wafer W via liquid supply pipe 31A and nozzle unit 32, as well as control liquid recovery device 6 (refer to FIG. 14), and recovers liquid from between tip lens 191 and wafer W via nozzle unit 32 and liquid recovery pipe 31B. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as the liquid above, pure water that transmits the ArF excimer laser beam (light with a wavelength of 193 nm) is to be used. Incidentally, refractive index n of the water with respect to the ArF excimer laser beam is around 1.44, and in the pure water, the wavelength of illumination light IL is 193 nm×1/n, shorted to around 134 nm.

Besides this, in exposure station 200, a fine movement stage position measurement system 70A is provided, including a measurement arm 71A supported almost in a cantilevered state (supported in the vicinity of one end) by main frame BD via a support member 72A. However, fine movement stage position measurement system 70A will be described after describing the fine movement stage, which will be described later, for convenience of the explanation.

Measurement station 300 is equipped with an alignment device 99 fixed in a suspended state to main frame BD, and a fine movement stage position measurement system 70B including a measurement arm 71B supported in a cantilevered state (supported in the vicinity of one end) by main frame BD via a support member 72B. Fine movement stage position measurement system 70B faces an opposite direction but has a configuration similar to fine movement stage position measurement system 70A previously described.

Aligner 99, as disclosed in, for example, U.S. Patent Application Publication No. 2008/0088843 and the like, includes five alignment systems AL1, and $AL2_1$ to $AL2_4$, shown in FIG. 3. To be more specific, as shown in FIG. 3, a primary alignment system AL1 is placed on a straight line (hereinafter, referred to as a reference axis) LV, which passes through the center of projection unit PU (optical axis AX of projection optical system PL, which also coincides with the center of exposure area IA previously described in the embodiment) and is also parallel to the Y-axis, in a state where the detection center is located at a position that is spaced apart from optical axis AX at a predetermined distance on the −Y side. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to a reference axis LV are severally arranged. That is, five alignment systems AL1 and $AL2_1$ to $AL2_4$ are placed so that their detection centers are placed along the X-axis direction. Incidentally, in FIG. 1, the five alignment systems AL1 and $AL2_1$ to $AL2_4$ are shown as an aligner 99, including the holding apparatus (sliders) which hold these systems. Incidentally, a concrete configuration and the like of aligner 99 will be described furthermore later on.

As it can be seen from FIGS. 1, 2A and the like, wafer stage WST1 has a wafer coarse movement stage (hereinafter, shortly referred to as a coarse movement stage) WCS1, which is supported by levitation above base board 12 by a plurality of non-contact bearings, such as, for example, air bearings, provided on its bottom surface and is driven in an XY two-dimensional direction by a coarse movement stage drive system 51A (refer to FIG. 14), and a wafer fine movement stage (hereinafter, shortly referred to as a fine movement stage) WFS1, which is supported in a non-contact manner by coarse movement stage WCS1 and is relatively movable with respect to coarse movement stage WCS1. Fine movement stage WFS1 is driven by a fine movement stage drive system 52A (refer to FIG. 14) with respect to coarse movement stage WCS1 in the X-axis direction, the Y-axis direction, the Z-axis direction, the θx direction, the θy direction, and the θz direction (hereinafter expressed as directions of six degrees of freedom, or directions of six degrees of freedom (X, Y, Z, θx, θy, θz)).

Positional information (also including rotation information in the θz direction) in the XY plane of wafer stage WST1 (coarse movement stage WCS1) is measured by a wafer stage position measurement system 16A. Further, positional information in directions of six degrees of freedom (X, Y, Z, θx, θy, and θz) of fine movement stage WFS1 (or fine movement stage WFS2) supported by coarse movement stage WCS1 in exposure station 200 is measured by fine movement stage position measurement system 70A. Measurement results (measurement information) of wafer stage position measurement system 16A and fine movement stage position measurement system 70A are supplied to main controller 20 (refer to FIG. 14) for position control of coarse movement stage WCS1 and fine movement stage WFS1 (or WFS2).

Similar to wafer stage WST1, wafer stage WST2 has a wafer coarse movement stage WCS2, which is supported by levitation above base board 12 by a plurality of non-contact bearings (e.g., air bearings (omitted in drawings)) provided on its bottom surface and is driven in the XY two-dimensional direction by a coarse movement stage drive system 51B (refer to FIG. 14), and a wafer fine movement stage WFS2, which is supported in a non-contact manner by coarse movement stage WCS2 and is relatively movable with respect to coarse movement stage WCS2. Fine movement stage WFS2 is driven by a fine movement stage drive system 52B (refer to FIG. 14) with respect to coarse movement stage WCS2 in directions of six degrees of freedom (X, Y, Z, θx, θy, θz).

Positional information (also including rotation information in the θz direction) in the XY plane of wafer stage WST2 (coarse movement stage WCS2) is measured by a wafer stage position measurement system 16B. Further, positional information in directions of six degrees of freedom (X, Y, Z, θx, θy, and θz) of fine movement stage WFS2 (or fine movement stage WFS1) supported by coarse movement stage WCS2 in measurement station 300 is measured by fine movement stage position measurement system 70B. Measurement results of wafer stage position measurement system 16B and fine movement stage position measurement system 70B are supplied to main controller 20 (refer to FIG. 14) for position control of coarse movement stage WCS2 and fine movement stage WFS2 (or WFS1).

Figure 14:
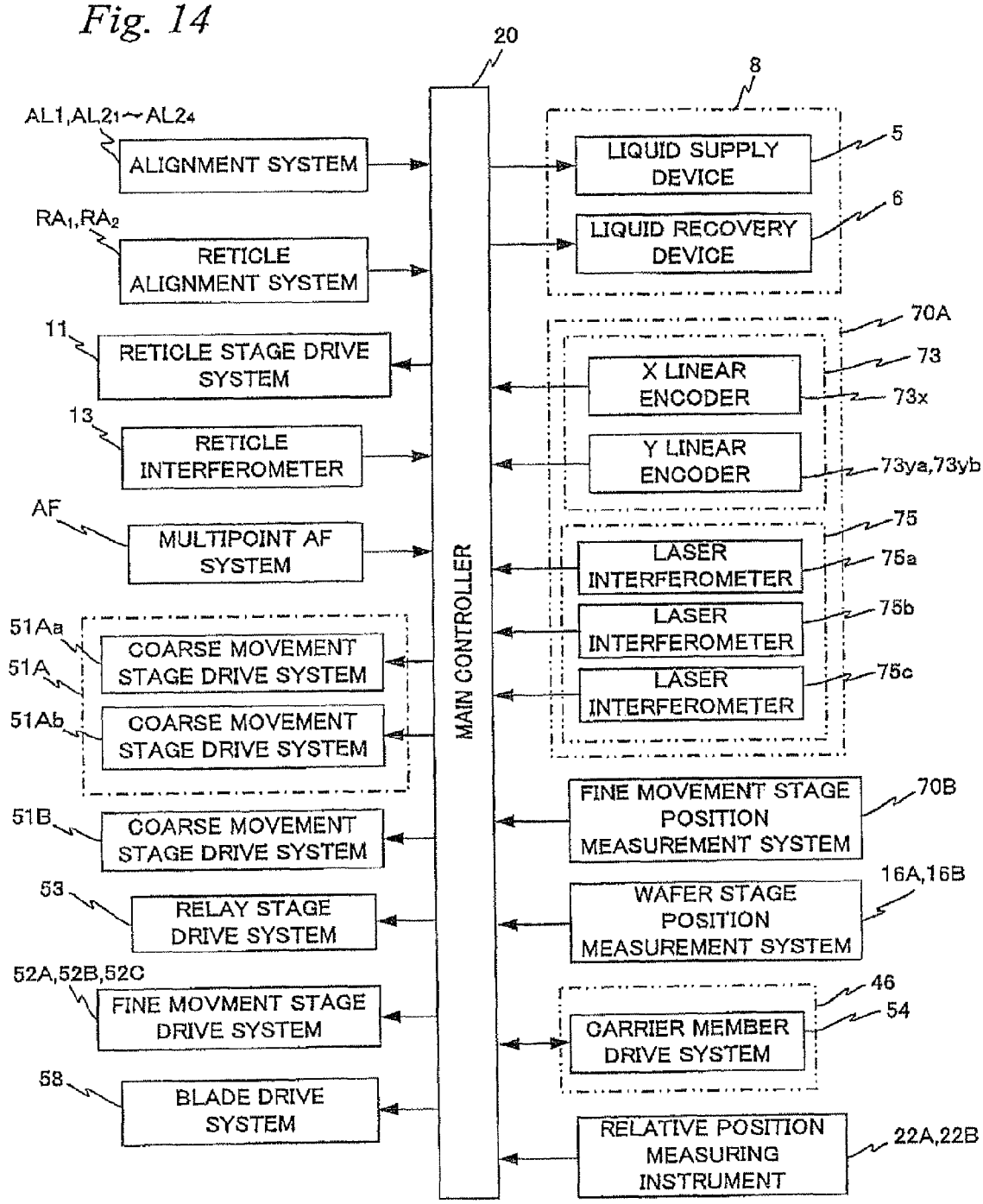
FIG. 14 is a block diagram used to explain an input/output relation of a main controller equipped in the exposure apparatus of the first embodiment (the exposure apparatus in FIG. 1)

Like coarse movement stage WCS1 and WCS2, relay stage DRST is supported by levitation above base board 12 by a plurality of non-contact bearings (e.g., air bearings (omitted in drawings)) provided on its bottom surface, and is driven in the XY two-dimensional direction by a relay stage drive system 53 (refer to FIG. 14).

Positional information (also including rotation information in the θz direction) in the XY plane of relay stage DRST is measured by a position measurement system (not shown) including, for example, an interferometer and/or an encoder and the like. The measurement results of the position measurement system is supplied to main controller 20 (refer to FIG. 14) for position control of relay stage DRST.

When fine movement stage WFS1 (or WFS2) is supported by coarse movement stage WCS1, relative positional information of fine movement stage WFS1 (or WFS2) and coarse movement stage WCS1 in directions of three degrees of freedom, which are X, Y, and θz, can be measured by a relative position measuring instrument 22A (refer to FIG. 14) provided in between coarse movement stage WCS1 and fine movement stage WFS1 (or WFS2).

Similarly, when fine movement stage WFS2 (or WFS1) is supported by coarse movement stage WCS2, relative positional information of fine movement stage WFS2 (or WFS1) and coarse movement stage WCS2 in directions of three degrees of freedom, which are X, Y, and σz, can be measured by a relative position measuring instrument 22B (refer to FIG. 14) provided in between coarse movement stage WCS2 and fine movement stage WFS2 (or WFS1).

As relative position measuring instruments 22A and 22B, for example, an encoder can be used which includes at least two heads arranged at coarse movement stages WCS1 and WCS2, respectively, whose area subject to measurement are gratings provided on fine movement stages WFS1 and WFS2, and measures a position of fine movement stages WFS1 and WFS2 in the X-axis direction, the Y-axis direction, and the θz direction, based on an output of the heads. Measurement results of relative position measuring instruments 22A and 22B are supplied to main controller 20 (refer to FIG. 14).

Configuration and the like of each of the parts configuring the stage system including the various measurement systems described above will be explained in detail, later on.

Figure 4:
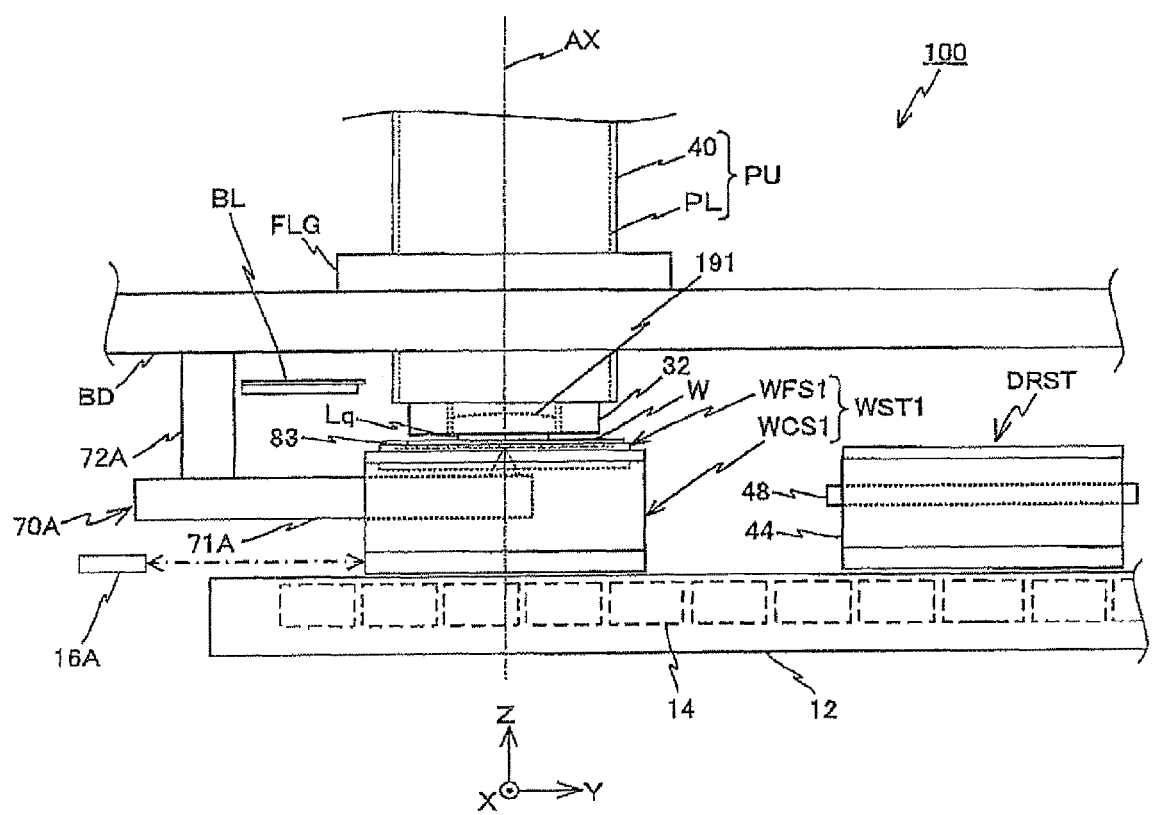

Furthermore, as shown in FIG. 4, in exposure apparatus 100 of the embodiment, a movable blade BL is provided in the vicinity of projection unit PU. Movable blade EL can be driven in the Z-axis direction and the Y-axis direction by a blade drive system 58 (not shown in FIG. 4, refer to FIG. 14). Movable blade EL is made of a tabular member, which has a projecting portion formed on the upper end on the +Y side that projects out more than the other portions.

In the embodiment, the upper surface of movable blade BL has liquid repellency to liquid Lq. In the embodiment, movable blade BL includes a metal base material such as stainless steel and the like, and a film of a liquid-repellent material formed on the surface of the base material. The liquid-repellent material includes, for example, PFA (Tetra fluoro ethylene-perfluoro alkylvinyl ether copolymer), PTFE (Poly tetra fluoro ethylene), Teflon (a registered trademark) and the like. Incidentally, the material forming the film can be an acrylic-based resin or a silicone-based resin. Further, the whole movable blade BL can be formed of at least one of the PFA, PTFE, Teflon (a registered trademark), acrylic-based resin, and silicone-based resin. In the embodiment, the contact angle of the upper surface of movable blade BL to liquid Lq is, for example, 90 degrees or more.

Movable blade BL engages with fine movement stage WFS1 (or WFS2), which is supported by coarse movement stage WCS1, from the −Y side, and a surface appearing to be completely flat (for example, refer to FIG. 22) is formed in the engaged state with the upper surface of fine movement stage WFS1 (or WFS2). Movable blade BL is driven by main controller 20 via blade drive system 58, and performs delivery of a liquid immersion space (liquid Lq) with fine movement stage WFS1 (or WFS2). Incidentally, the delivery of the liquid immersion space (liquid Lq) between movable blade BL and fine movement stage WFS1 (or WFS2) will be described further later on.

Moreover, in exposure apparatus 100 of the embodiment, a multiple point focal point position detection system (hereinafter shortly referred to as a multipoint AF system) AF (not shown in FIG. 1, refer to FIG. 14) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 14) via an AF signal processing system (not shown). Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of aligner 99 (alignment systems AL1, and AL2$_1$ to AL2$_4$), the so-called focus leveling control of wafer W can be performed at the time of exposure, using the surface position information and measurement values of a laser interferometer system 75 (refer to FIG. 14) configuring a part of fine movement stage position measurement system 70A which will be described later on. In this case, multipoint AF system does not have to be provided in the vicinity of projection unit PU. Incidentally, measurement values of an encoder system 73 which will be described later configuring fine movement stage position measurement system 70A can also be used, rather than laser interferometer system 75 in focus leveling control.

Further, in exposure apparatus 100 of the embodiment, as is disclosed in detail in, for example, U.S. Pat. No. 5,646,413 and the like, a pair of reticle alignment systems RA$_1$ and RA$_2$ (reticle alignment system RA$_2$ is hidden behind reticle alignment system RA$_1$ in the depth of the page surface in FIG. 1.) of an image processing method that has an imaging device such as a CCD and the like and uses a light (in the embodiment, illumination light IL) of the exposure wavelength as an illumination light for alignment is placed above reticle stage RST. The pair of reticle alignment systems RA$_1$ and RA$_2$ is used, in a state where a measurement plate to be described later on fine movement stage WFS1 (or WFS2) is positioned directly below projection optical system PL with main controller 20 detecting a projection image of a pair of reticle alignment marks (omitted in drawings) formed on reticle R and a corresponding pair of first fiducial marks on the measurement plate via projection optical system PL, to detect a detection center of a projection area of a pattern of reticle R and a reference position on the measurement plate using projection optical system PL, namely to detect a positional relation with a center of the pair of first fiducial marks. Detection signals of reticle alignment detection systems RA$_1$ and RA$_2$ are supplied to main controller 20 (refer to FIG. 14) via a signal processing system (not shown). Incidentally, reticle alignment systems RA$_1$ and RA$_2$ do not have to be provided. In this case, it is desirable for fine movement stage WFS1 to have a detection system in which a light transmitting section (light-receiving section) is installed so as to detect a projection image of the reticle alignment mark, as disclosed in, for example, U.S. Patent Application Publication No 2002/0041377 and the like.

Now, a configuration and the like of each part of the stage systems will be described in detail. First of all, wafer stages WST1 and WST2 will be described. In the embodiment, wafer stage WST1 and wafer stage WST2 are configured identically, including the drive system, the position measurement system and the like. Accordingly, in the following description, wafer stage WST1 will be taken up and described, representatively.

Figure 2A:
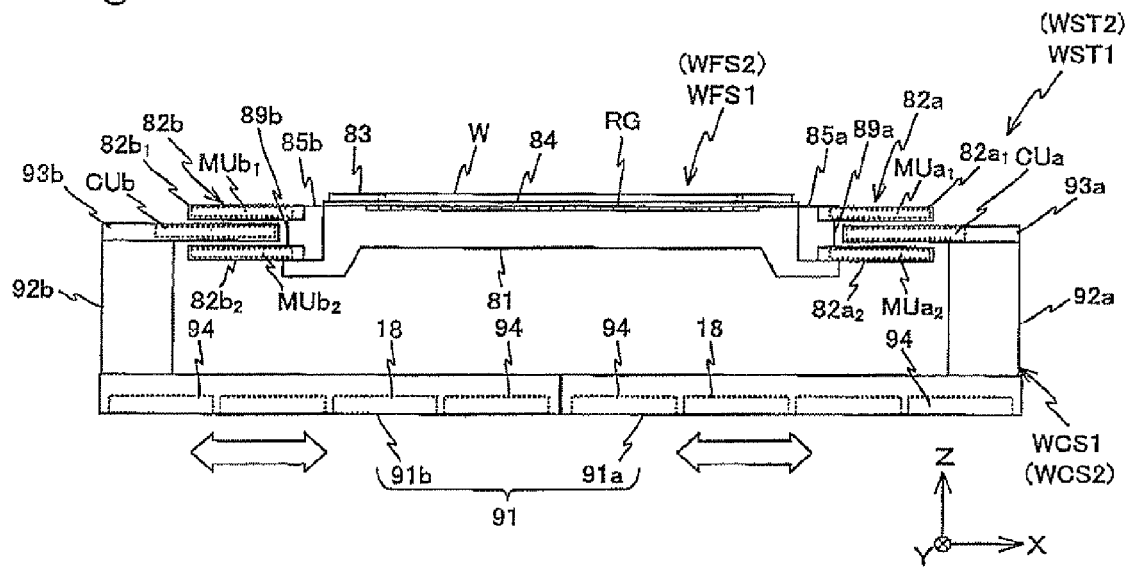
FIG. 2A shows a side view of a wafer stage which the exposure apparatus in FIG. 1 is equipped with when viewed from a −Y direction.
Figure 2B:
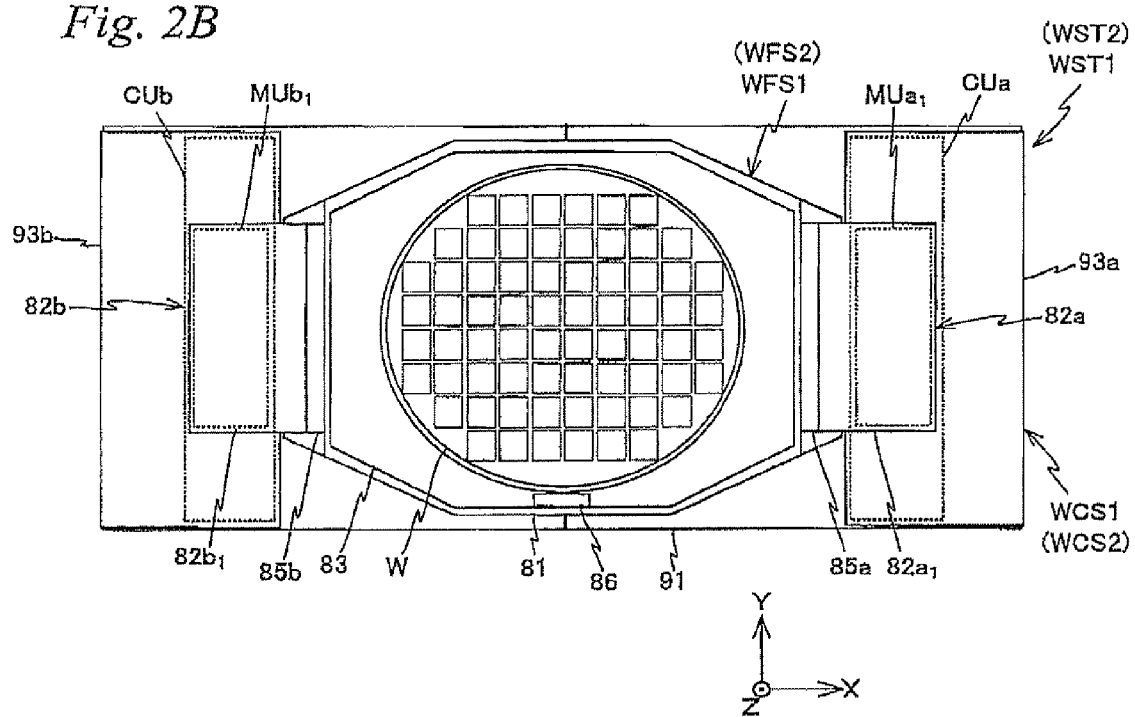
FIG. 2B is the wafer stage shown in a planar view.

As shown in FIGS. 2A and 2B, coarse movement stage WCS1 is equipped with a rectangular plate shaped coarse movement slides section 91 whose longitudinal direction is in the X-axis direction in a planar view (when viewing from the +Z direction), a rectangular plate shaped pair of side wall sections 92a and 92b which are each fixed on the upper surface of coarse movement slider section 91 on one end and the other end in the longitudinal direction in a state parallel to the YZ surface, with the Y-axis direction serving as the longitudinal direction, and a pair of stator sections 93a and 93b that are each fixed on the upper surface of side wall sections 92a and 92b. As a whole, coarse movement stage WCS1 has a box like shape having a low height whose upper surface in a center in the X-axis direction and surfaces on both sides in the Y-axis direction are open. More specifically, in coarse movement stage WCS1, a space is formed inside penetrating in the Y-axis direction.

Figure 5:
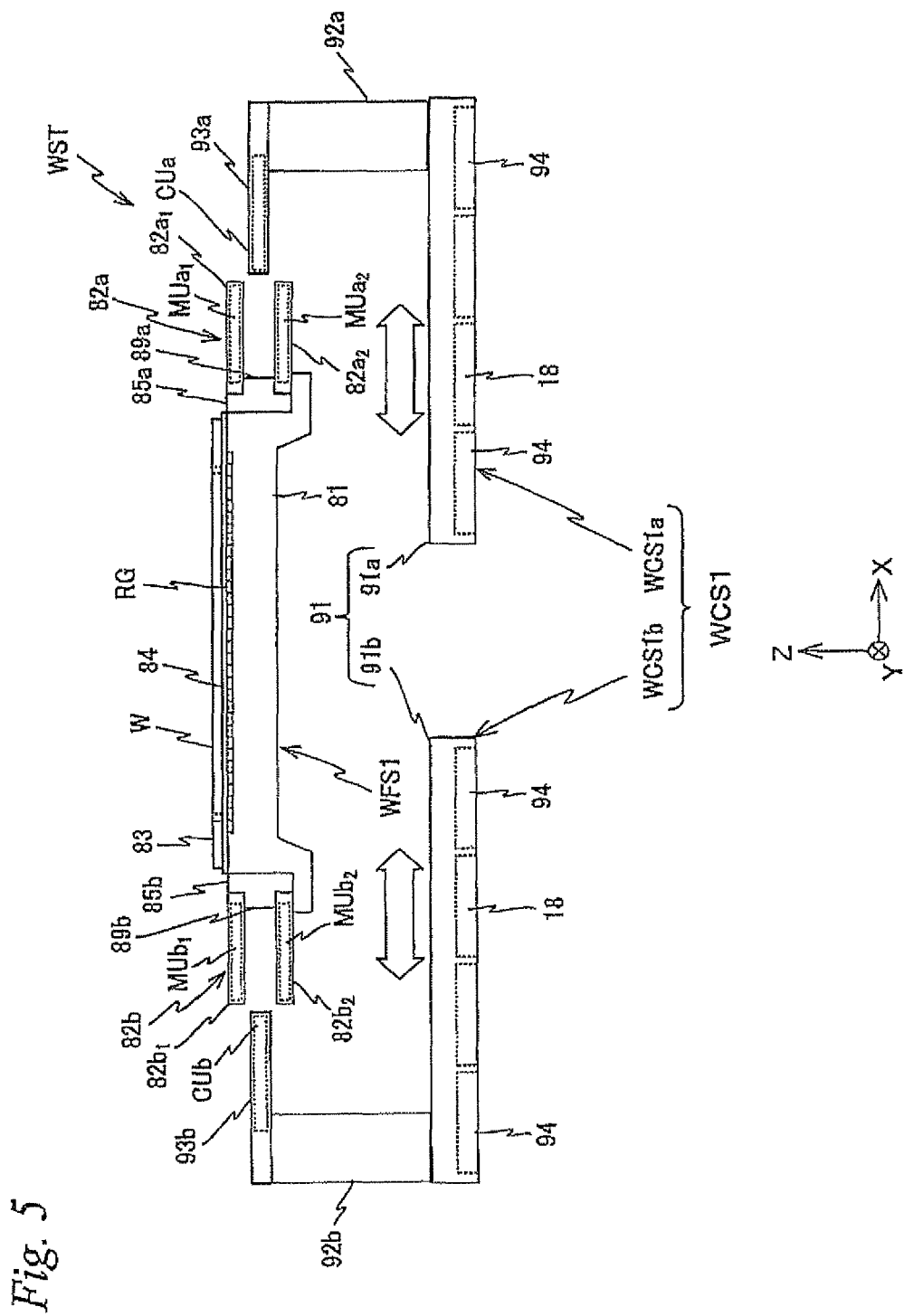
FIG. 5 is a view used to explain a separation structure of a coarse movement stage.

As shown in FIG. 5, coarse movement stage WSC1 is configured separable into two sections, which are a first section WCS1a and a second section WCS1b, with a separation line in the center in the longitudinal direction of coarse movement slider section 91 serving as a boundary. Accordingly, coarse movement slider section 91 is configured of a first slider section 91a which structures a part of the first section WCS1a, and a second slider section 91b which structures a part of the second section WCS1b.

Inside base 12, a coil unit is housed, including a plurality of coils 14 placed in the shape of a matrix with the XY two-dimensional direction serving as a row direction and a column direction, as shown in FIG. 1.

In correspondence with the coil unit, on the bottom surface of coarse movement stage WCS1, or more specifically, on the bottom surface of the first slider section 91a and the second slider section 91b, a magnet unit is provided consisting of a plurality of permanent magnets 18 placed in the shape of a matrix with the XY two-dimensional direction serving as a row direction and a column direction, as shown in FIG. 2A. The magnet unit configures coarse movement stage drive systems 51Aa and 51Ab (refer to FIG. 14), consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 14).

On the bottom surface of each of the first slider section 91a and the second slider section 91b, a plurality of air bearings 94 is fixed around the magnet unit described above. The first section WCS1a and the second section WCS1b of coarse movement stage WCS1 are each supported by levitation on base board 12 by a predetermined clearance, such as around several by air bearings 94, and are driven in the X-axis direction, the Y-axis direction, and the σz direction by coarse movement stage drive systems 51Aa and 51Ab.

The first section WCS1a and the second section WCS1b are normally locked integrally, via a lock mechanism (not shown). More specifically, the first section WCS1a and the second section WCS1b normally operate integrally. Therefore, in the following description, a drive system consisting of a planar motor that drives coarse movement stage WCS1, which is made so that the first section WCS1a and the second section WCS1b are integrally formed, will be referred to as a coarse movement stage drive system 51A (refer to FIG. 14).

Incidentally, as coarse movement stage drive system 51A, the drive method is not limited to the planar motor using the Lorentz electromagnetic force drive method, and for example, a planar motor by a variable reluctance drive system can also be used. Besides this, coarse movement stage drive system 51A can be configured by a planar motor of a magnetic levitation type. In this case, the air bearings will not have to be arranged on the bottom surface of coarse movement slider section 91.

As shown in FIGS. 2A and 2B, the pair of stator sections 93a and 93b is each made of a member with a tabular outer shape, and in the inside, coil units CUa and CUb are housed consisting of a plurality of coils to drive fine movement stage WFS1 (or WFS2). The magnitude and direction of current supplied to each of the coils configuring coil units CUa and CUb are controlled by main controller 20 (refer to FIG. 3). The configuration of coil units CUa, and CUb will be described further, later in the description. While fine movement stage WFS1 and fine movement stage WFS2 are configured and are supported and driven similarly in a non-contact manner by coarse movement stage WCS1 in this case, in the following description, fine movement stage WFS1 will be taken up and described, representatively.

As shown in FIGS. 2A and 2B, the pair of stator sections 93a and 93b each have a rectangle tabular shape whose longitudinal direction is in the Y-axis direction. Stator section 93a has an end on the +X side fixed to the upper surface of side wall section 92a, and stator section 93b has an end on the −X side fixed to the upper surface of side wall section 92b.

As shown in FIGS. 2A and 2B, fine movement stage WFS1 is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion and as an example in the embodiment, synthetic quarts (glass) is used. Incidentally, main body section 81 can be structured all by the transparent material or only the section which the measurement beam of the encoder system passes through can be structured by the transparent material, and only the section which this measurement beam passes through can be formed solid.

In the center of the upper surface of main body section 81 (to be more precise, a cover glass which will be described later) of fine movement stage WFS1, a wafer holder (not shown) is arranged which holds wafer W by vacuum suction or the like. In the embodiment, for example, a wafer holder of a-so-called pin chuck method on which a plurality of support sections (pin members) supporting wafer W are formed within a loop shaped projecting section (rim section) is used, and grating RG to be described later is provided on the other surface (rear surface) of the wafer holder whose one surface (surface) is a wafer mounting surface. Incidentally, the wafer holder can be formed integrally with fine movement stage WFS1, or can be fixed to main body section 81, for example, via an electrostatic chuck mechanism, a clamping mechanism, or by adhesion and the like. In the former case, grating RG is to be provided on a back surface side of fine movement stage WFS1.

Furthermore, on the upper surface of main body section 81 on the outer side of the wafer holder (mounting area of wafer W), as shown in FIGS. 2A and 2B, a plate (a liquid repellent plate) 83 is attached that has a circular opening one size larger than wafer W (the wafer holder) formed in the center, and also has an octagonal outer shape (contour) corresponding to main body section 81. A liquid repellent treatment against liquid Lq is applied to the surface of plate 83 (a liquid repellent surface is formed). Plate 83 is fixed to the upper surface of main body section 81, so that its entire surface (or a part of its surface) becomes substantially flush with the surface of wafer W. Further, in plate 83, on the −Y side end of plate 83, as shown in FIG. 2B, a measurement plate 86, which has a narrow rectangular shape in the X-axis direction, is set in a state where its surface is substantially flush with the surface of plate 83, or more specifically, the surface of wafer W. On the surface of measurement plate 86, at least a pair of first fiducial marks detected by each of the pair of reticle alignment systems $RA_1$ and $RA_2$ and a second fiducial mark detected by primary alignment system AL1 are formed (both the first and second fiducial marks are omitted in the drawing). Incidentally, instead of attaching plate 83 to main body section 81, for example, the wafer holder can be formed integrally with fine movement stage WFS1, and a liquid repellent treatment can be applied to the upper surface of fine movement stage WFS1 in a periphery area (an area the same as plate 83 (can include the surface of measurement plate 86) surrounding the wafer holder.

As shown in FIG. 2A, on the upper surface of main body section 81, a two-dimensional grating (hereinafter merely referred to as a grating) RG is placed horizontally (parallel to the wafer W surface). Grating RG is fixed (or formed) on the upper surface of main body section 81 consisting of a transparent material. Grating RG includes a reflection diffraction grating (X diffraction grating) whose periodic direction is in the X-axis direction and a reflection diffraction grating (Y diffraction grating) whose periodic direction, is in the Y-axis direction. In the embodiment, the area (hereinafter, forming area) on main body section 81 where the two-dimensional grating is fixed or formed, as an example, is in a circular shape which is one size larger than wafer W. Incidentally, the type of diffraction grating used for grating RG is not limited to the diffraction grating made up of grooves or the like that are mechanically formed, and for example, can also be a grating that is created by exposing interference fringe on a photosensitive resin.

Grating RG is covered and protected with a protective member, such as, for example, a cover glass 84. In the embodiment, on the upper surface of cover glass 84, the holding mechanism (electrostatic chuck mechanism and the like) previously described to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG. Further, while the protective member (cover glass 84) can be formed of the same material as main body section 81, besides this, the protective member can be formed of, for example, metal or ceramics. Further, although a plate shaped protective member is desirable because a sufficient thickness is required to protect grating RG, a thin film protective member can also be used depending on the material.

Incidentally, of the forming area of grating RG, on a surface of cover glass 84 corresponding to an area where the forming area spreads to the periphery of the wafer holder, it is desirable, for example, to provide a reflection member (e.g. a thin film and the like) which covers the forming area, so that the measurement beam of the encoder system irradiated on grating RG does not pass through cover glass 84, or more specifically, so that the intensity of the measurement beam does not change greatly in the inside and the outside of the area on the rear surface of the wafer holder.

Moreover, the other surface of the transparent plate which has grating RG fixed or formed on one surface can be placed in contact or in proximity to the rear surface of the wafer holder and a protective member (cover glass 84) can also be provided on the one surface side of the transparent plate, or, the one surface of the transparent plate which has grating RG fixed or formed can be placed in contact or in proximity to the rear surface of the wafer holder, without having the protective member (cover glass 84) arranged. Especially in the former case, grating RG can be fixed to or formed on an opaque member such as ceramics instead of the transparent plate, or grating RG can be is fixed to or formed on the rear side of the wafer holder. Or, the hold wafer holder and grating RG can simply be held by a conventional fine movement stage. Further, the wafer holder can be made of a solid glass member, and grating RG can be placed on the upper surface (a wafer mounting surface) of the glass member.

As it can also be seen from FIG. 2A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is formed in a plate shape whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 2A and 25, mover section 82a includes two plate-like members $82a_1$ and $82a_2$ having a rectangular shape in a planar view whose size (length) in the Y-axis direction and size (width) in the X-axis direction are both shorter than stator section 93a (around half the size). The two plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side of main body section 81. In this case, the −X side end of plate-like member $82a_2$ is clamped by spacer 85a and the extending section on the +X side of main body section 81. Between the two plate-like members $82a_1$ and $82a_2$, an end on the −X side of stator section 93a of coarse movement stage WCS1 is inserted in a non-contact manner. Inside plate-like members $82a_1$ and $82a_2$, magnet units $MUa_1$ and $MUa_2$ which will be described later are housed.

Mover section 82b includes two plate-like members $82b_1$ and $82b_2$ maintained at a predetermined distance in the Z-axis direction (vertically), and is configured in a similar manner with mover section 82a, although being symmetrical.

Between the two plate-like members $82b_1$ and $82b_2$, an end on the +X side of stator section 93b of coarse movement stage WCS1 is inserted in a non-contact manner. Inside plate-like members $82b_1$ and $82b_2$, magnet units $MUb_1$ and $MUb_2$ are housed, which are configured similar to magnet units $MUa_1$ and $MUa_2$.

Now, as is previously described, because the surface on both sides in the Y-axis direction is open in coarse movement stage WCS1, when attaching fine movement stage WFS1 to coarse movement stage WCS1, the position of fine movement stage WFS1 in the Z-axis direction should be positioned so that stator section 93a, 93b are located between plate-like members $82a_1$ and $82a_2$, and $82b_1$ and $82b_2$, respectively, and then fine movement stage WFS1 can be moved (slid) in the Y-axis direction.

Next, a configuration of fine movement stage drive system 52A to relatively drive fine movement stage WFS1 with respect to coarse movement stage WCS1 will be described.

Fine movement stage drive system 52A includes the pair of magnet units $MUa_1$ and $MUa_2$ that mover section 82a previously described has, coil unit CUa that stator section 93a has, the pair of magnet units $MUb_1$ and $MUb_2$ that mover section 82b has, and coil unit CUb that stator section 93b has.

This will be explained further in detail. As it can be seen from FIGS. 6, 7A, and 7B, at the end on the −X side inside stator section 93a, two lines of coil rows are placed a predetermined distance apart in the X-axis direction, which are a plurality of (in this case, twelve) YZ coils (hereinafter appropriately referred to as "coils") 55 and 57 that have a rectangular shape in a planar view and are placed equally apart in the Y-axis direction. YZ coil 55 has an upper part winding 55a and a lower part winding 55b in a rectangular shape in a planar view that are disposed such that they overlap in the vertical direction (the Z-axis direction). Further, between the two lines of coil rows described above inside stator section 93a, an X coil (hereinafter shortly referred to as a "coil" as appropriate) 56 is placed, which is narrow and has a rectangular shape in a planar view and whose longitudinal direction is in the Y-axis direction. In this case, the two lines of coil rows and X coil 56 are placed equally spaced in the X-axis direction. Coil unit CUa is configured including the two lines of coil rows and X coil 56.

Incidentally, in the description below, while one of the stator sections 93a of the pair of stator sections 93a and 93b and mover section 82a supported by this stator section 93a will be described using FIGS. 6 to 8C, the other (the −X side) stator section 93b and mover section 82b will be structured similar to these sections and will function in a similar manner. Accordingly, coil unit CUb, and magnet units $MUb_1$ and $MUb_2$ are structured similar to coil unit CUa, and magnet units $MUa_1$ and $MUa_2$.

Figure 6:
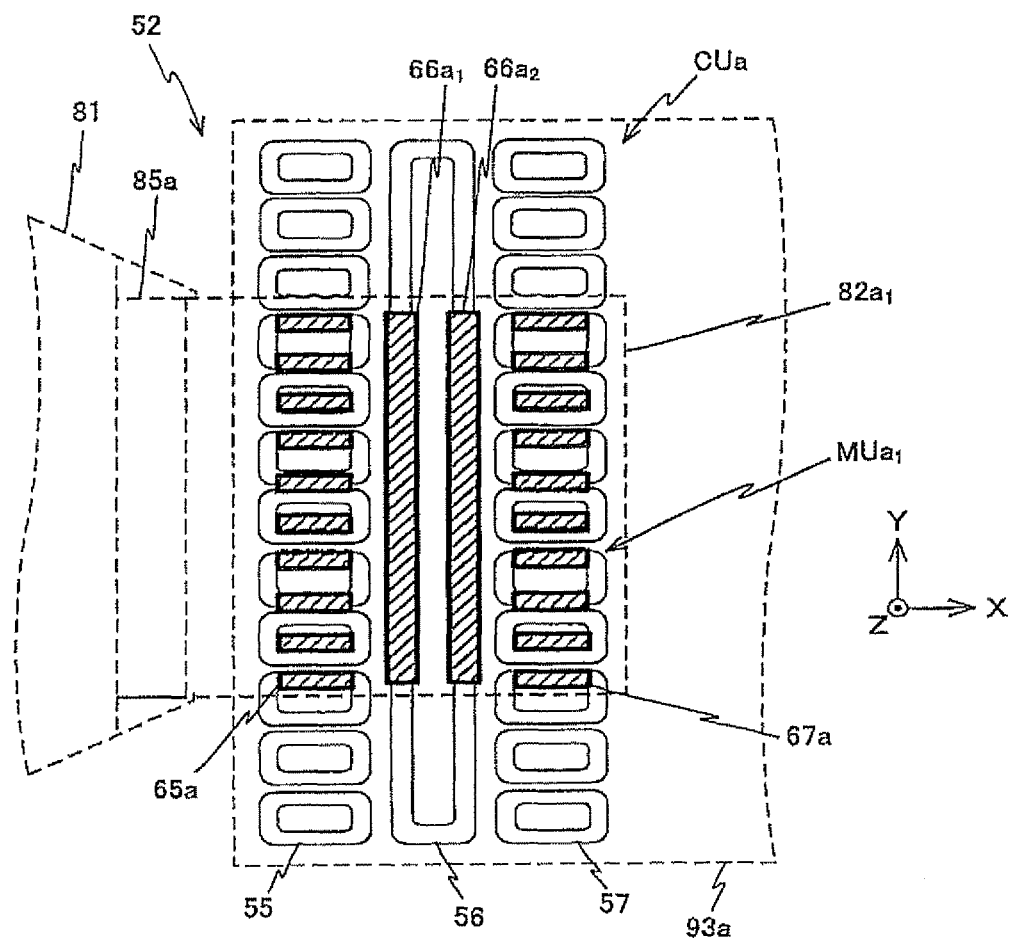
FIG. 6 is a planar view showing a placement of a magnet unit and a coil unit that structure a fine movement stage drive system.
Figure 7A:
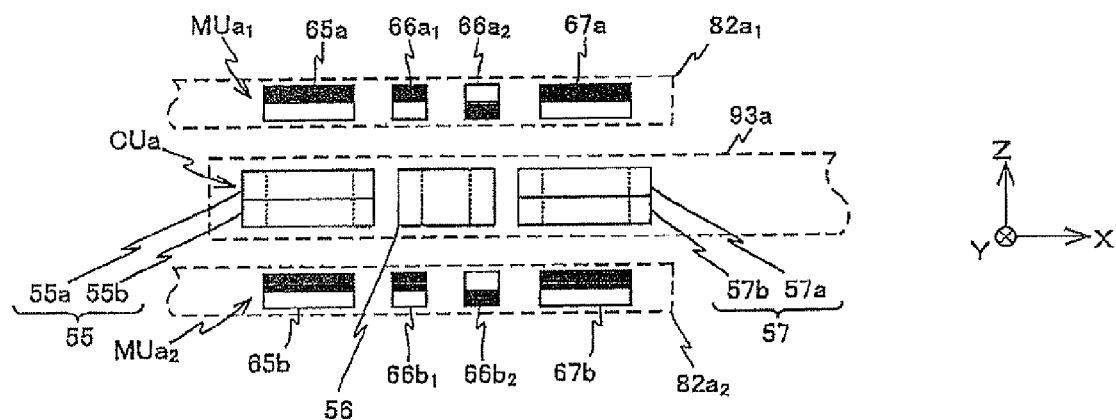
FIG. 7A is a side view showing a placement of a magnet unit and a coil unit that structure a fine movement stage drive system when viewed from the −Y direction.
Figure 7B:
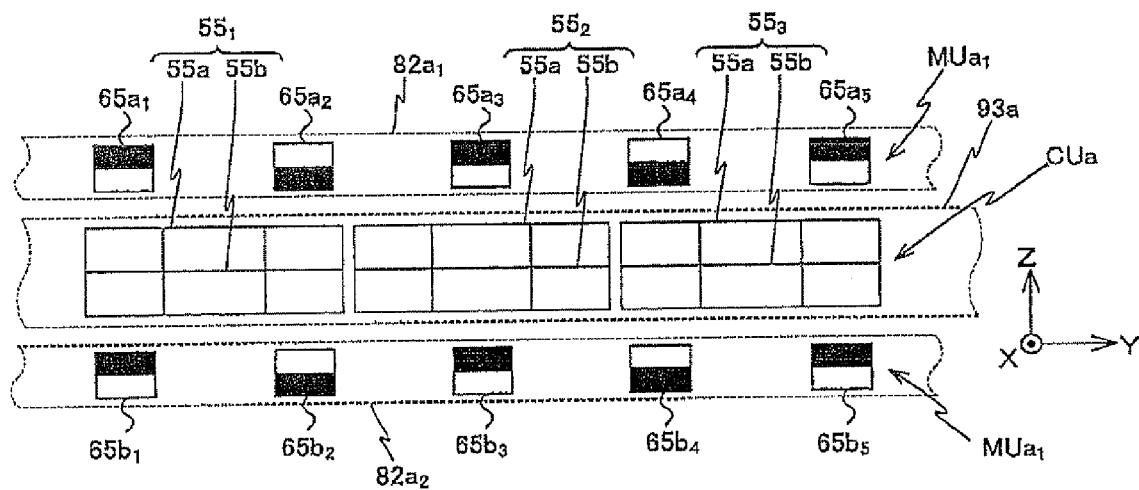
FIG. 7B is a side view showing a placement of a magnet unit and a coil unit that structure a fine movement stage drive system when viewed from the +X direction.

Inside plate-like member $82a_1$ on the +Z side configuring a part of movable section 82a of fine movement stage WFS1, as it can be seen when referring to FIGS. 6, 7A, and 7B, two lines of magnet rows are placed a predetermined distance apart in the X-axis direction, which are a plurality of (in this case, ten) permanent magnets 65a and 67a that have a rectangular shape in a planar view and whose longitudinal direction is in the X-axis direction. The two lines of magnet rows are placed facing coils 55 and 57, respectively.

As shown in FIG. 7B, the plurality of permanent magnets 65a are configured such that permanent magnets whose upper surface sides (+Z sides) are N poles and the lower surface sides (−Z sides) are S poles and permanent magnets whose upper surface sides (+Z sides) are S poles and the lower surface sides (−Z sides) are N poles are arranged alternately in the Y-axis direction. The magnet row consisting of the plurality of permanent magnets 67a is structured similar to the magnet row consisting of the plurality of permanent magnets 65a.

Further, between the two lines of magnet rows described above inside plate-like member $82a_1$, a pair (two) of permanent magnets $66a_1$ and $65a_2$ whose longitudinal direction is in the Y-axis direction is placed set apart in the X axis direction, facing coil 56. As shown in FIG. 7A, permanent magnet $66a_1$ is configured such that its upper surface side (+Z side) is an N pole and its lower surface side (−Z side) is an S pole, whereas with permanent magnet $66a_2$, its upper surface side (+Z side) is an S pole and its lower surface side (−Z side) is an N pole.

Magnet unit $MUa_1$ is configured by the plurality of permanent magnets 65a and 67a, and $66a_1$ and $66a_2$ described above.

As shown in FIG. 7A, also inside plate-like member $82a_2$ on the −Z side, permanent magnets 65b, $66b_1$, $66b_2$, and 67b are placed in a placement similar to plate-like member 82a1 on the +Z side described above. Magnet unit MUa2 is configured by these permanent magnets 65b, $66b_1$, $66b_2$, and 67b. Incidentally, in FIG. 6, permanent magnets 65b, $66b_1$, $66b_2$, and 67b inside plate-like members 82a2 on the −Z side are placed in the depth of the page surface, with magnets 65a, $66a_1$, $66a_2$, and 67a placed on top.

Now, with fine movement stage drive system 52A, as shown in FIG. 7B, positional relation (each distance) in the Y-axis direction between the plurality of permanent magnets 65 and the plurality of YZ coils 55 is set so that when in the plurality of permanent magnets (in FIG. 7B, permanent magnets $65a_1$ to $65a_5$ which are sequentially arranged along the Y-axis direction) placed adjacently in the Y-axis direction, two adjacent permanent magnets $65a_1$ and $65a_2$ each face the winding section of YZ coil $55_1$, then permanent magnet $65a_3$ adjacent to these permanent magnets does not face the winding section of YZ coil $55_2$ adjacent to YZ coil $55_1$ described above (so that permanent magnet $65a_3$ faces the hollow center in the center of the coil, or faces a core, such as an iron core, to which the coil is wound). Incidentally, as shown in FIG. 7B, permanent magnets $65a_4$ and $65a_5$ each face the winding section of YZ coil $55_3$, which is adjacent to YZ coil $55_2$. The distance between permanent magnets 65b, 67a, and 67b in the Y-axis direction is also similar (refer to FIG. 7B).

Figure 8A:
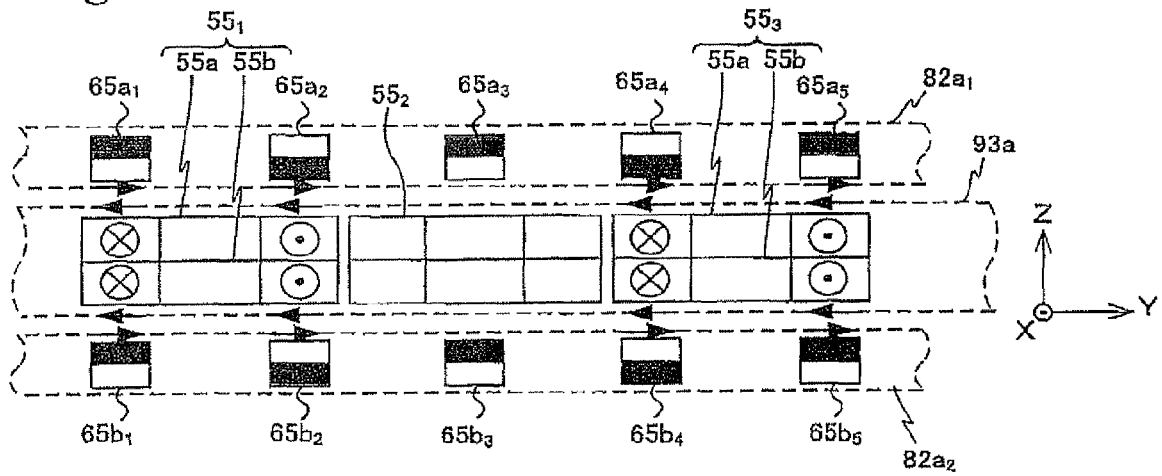
FIG. 8A is a view used to explain a drive principle when a fine movement stage is driven in the Y-axis direction.

Accordingly, in fine movement stage drive system 52A, as an example, when a clockwise electric current when viewed from the +Z direction is supplied to the upper part winding and the lower part winding of coils $55_1$ and $55_3$, respectively, as shown in FIG. 8A in a state shown in FIG. 7B, a force (Lorentz force) in the −Y direction acts on coils $55_1$ and $55_3$, and as a reaction force, a force in the +Y direction acts on permanent magnets 65a and 65b. By these action of forces, fine movement stage WFS1 moves in the +Y direction with respect to coarse movement stage WCS1. When a counterclockwise electric current when viewed from the +Z direction is supplied to each of the coils $55_1$ and $55_3$ conversely to the case described above, fine movement stage WFS1 moves in the −Y direction with respect to coarse movement stage WCS1.

By supplying an electric current to coil 57, electromagnetic interaction is performed between permanent magnet 67 (67a, 67b) and fine movement stage WFS1 can be driven in the Y-axis direction. Main controller 20 controls a position of fine movement stage WFS1 in the Y-axis direction by controlling the current supplied to each coil.

Figure 8B:
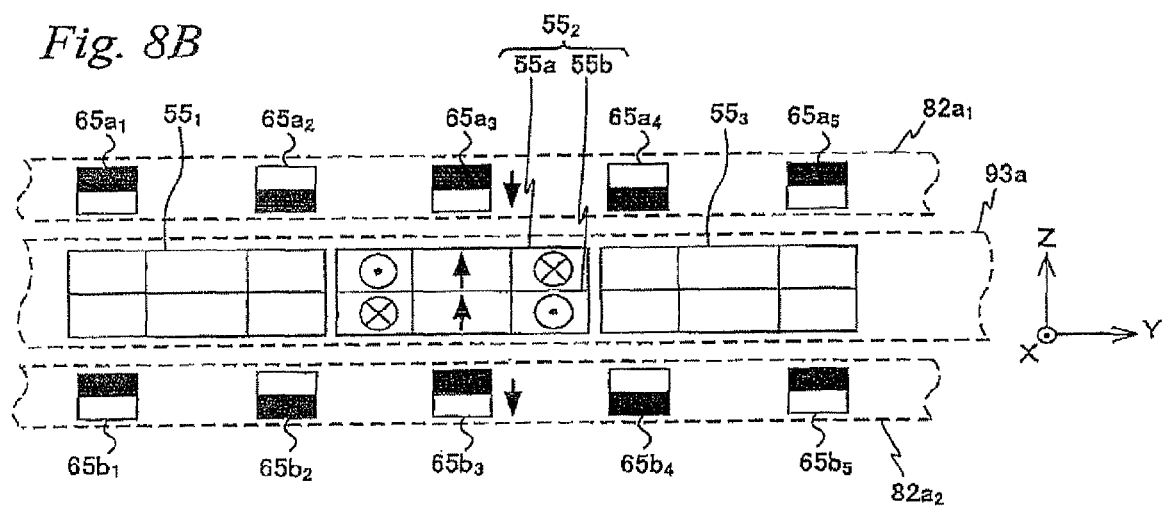
FIG. 8B is a view used to explain a drive principle when a fine movement stage is driven in the Z-axis direction.

Further, in fine movement stage drive system 52A, as an example, when a counterclockwise electric current when viewed from the +Z direction is supplied to the upper part winding of coil $55_2$ and a clockwise electric current when viewed from the +Z direction is supplied to the lower part winding as shown in FIG. 8B in a state shown in FIG. 7B, an attraction force is generated between coil $55_2$ and permanent magnet $65a_3$ whereas a repulsive force (repulsion) is generated between coil $55_2$ and permanent magnet $65b_3$, respectively, and by these attraction force and repulsive force, fine movement stage WFS1 is moved downward (−Z direction) with respect to coarse movement stage WSC1, or more particularly, moved in a descending direction. When a current in a direction opposite to the case described above is supplied to the upper part winding and the lower part winding of coil $55_2$, respectively, fine movement stage WFS1 moves upward (+Z direction) with respect to coarse movement stage WCS1, or mare particularly, moves in an upward direction. Main controller 20 controls a position of fine movement stage WFS1 in the Z-axis direction which is in a levitated state by controlling the current supplied to each coil.

Figure 8C:
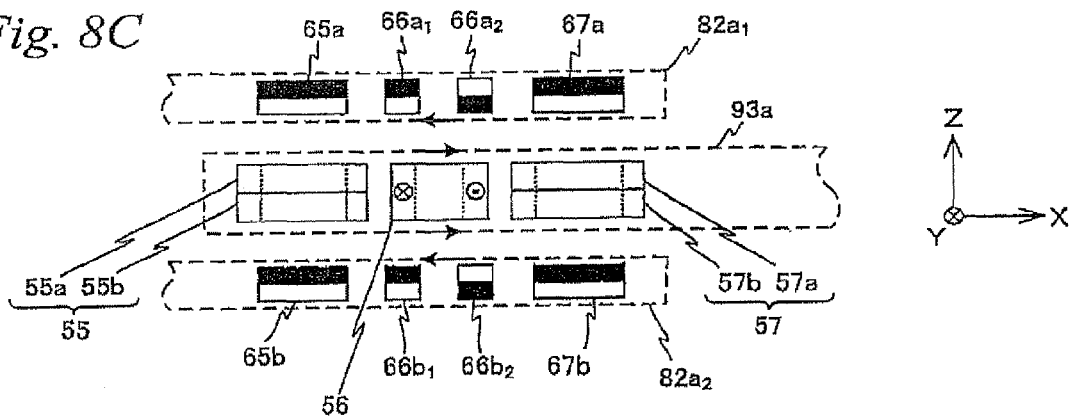
FIG. 8C is a view used to explain a drive principle when a fine movement stage is driven in the X-axis direction.

Further, in a state shown in FIG. 7A, when a clockwise electric current when viewed from the +Z direction is supplied to coil 56, a force in the +X direction acts on coil 56 as shown in FIG. 8C, and as its reaction, a force in the −X direction acts on permanent magnets $66a_1$ and $66a_2$, and $66b_1$ and $66b_2$, respectively, and fine movement stage WFS1 is moved in the −X direction with respect to coarse movement stage WSC1. Further, when a counterclockwise electric current when viewed from the +Z direction is supplied to coil 56 conversely to the case described above, a force in the +X direction acts on permanent magnets $66a_1$ and $66a_2$, and $66b_1$ and $66b_2$, and fine movement stage WFS1 is moved in the +X direction with respect to coarse movement stage WCS1. Main controller 20 controls a position of fine movement stage WFS1 in the X-axis direction by controlling the current supplied to each coil.

As is obvious from the description above, in the embodiment, main controller 20 drives fine movement stage WFS1 in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS1 in the Y-axis direction, main controller 20 generates a drive force in the Z-axis direction separately from the drive force in the Y-axis direction and makes fine movement stage WFS1 levitate from coarse movement stage WCS1. And, main controller 20 drives fine movement stage WFS1 in the Y-axis direction while maintaining the levitated state of fine movement stage WFS1 with respect to coarse movement stage WCS1, namely a noncontact state, by sequentially switching the coil subject to current supply according to the position of fine movement stage WFS1 in the Y-axis direction. Further, main controller 20 can also drive fine movement stage WFS1 independently in the X-axis direction along with the Y-axis direction, in a state where fine movement stage WFS1 is levitated from coarse movement stage WCS1.

Figure 9A:
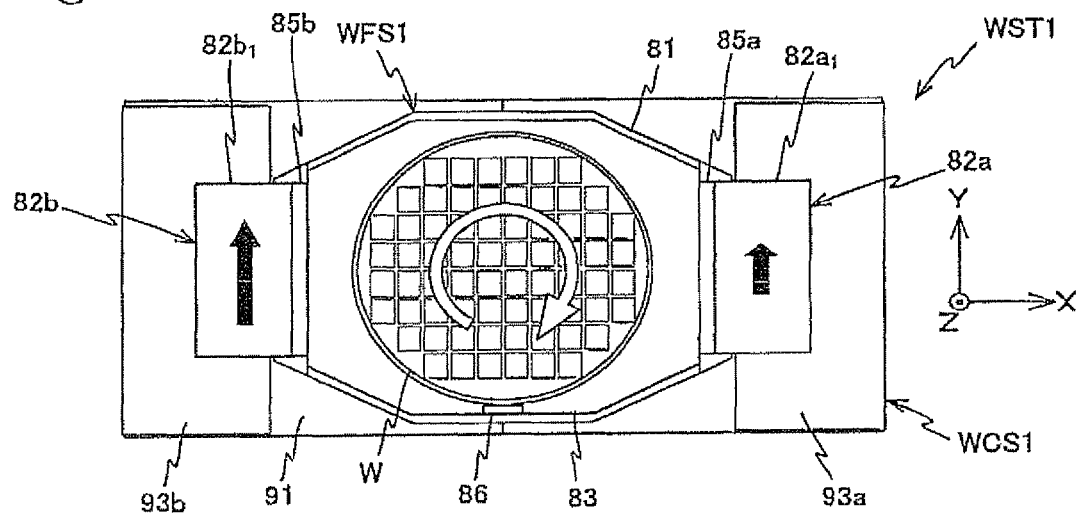
FIG. 9A is a view used to explain an operation when a fine movement stage is rotated around the Z-axis with respect to a coarse movement stage.

Further, as shown in FIG. 9A, for example, main controller 20 can make fine movement stage WFS1 rotate around the Z-axis (θz rotation) (refer to the outlined arrow in FIG. 9A), by applying a drive force (thrust) in the Y-axis direction having a different magnitude to both mover section 82a on the +X side and mover section 82b on the −X side of fine movement stage WFS1 (refer to the black arrow in FIG. 9A). Incidentally, in contrast with FIG. 9A, by making the drive force applied to mover section 82a on the +X side larger than the −X side, fine movement stage WFS1 can be made to rotate counterclockwise with respect to the Z-axis.

Figure 9B:
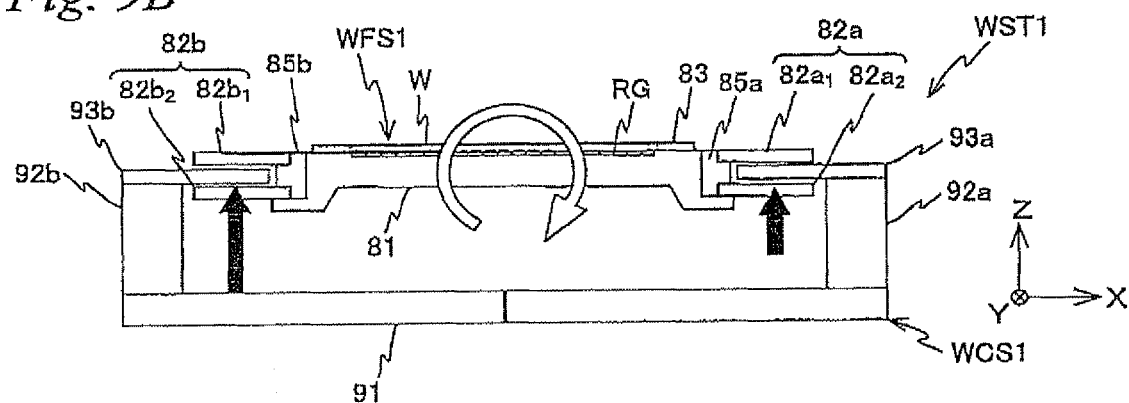
FIG. 9B is a view used to explain an operation when a fine movement stage is rotated around the Y-axis with respect to a coarse movement stage.

Further, as shown in FIG. 9B, main controller 20 can make fine movement stage WFS1 rotate around the Y-axis (θy drive) (refer to the outlined arrow in FIG. 9B), by applying a different levitation force (refer to the black arrows in FIG. 93) to both mover section 82a on the +X side and mover section 82b on the −X side of fine movement stage WFS1. Incidentally, in contrast with FIG. 9B, by making the levitation force applied to mover section 82a on the +X side larger than the −X side, fine movement stage WFS1 can be made to rotate counterclockwise with respect to the Y-axis.

Figure 9C:
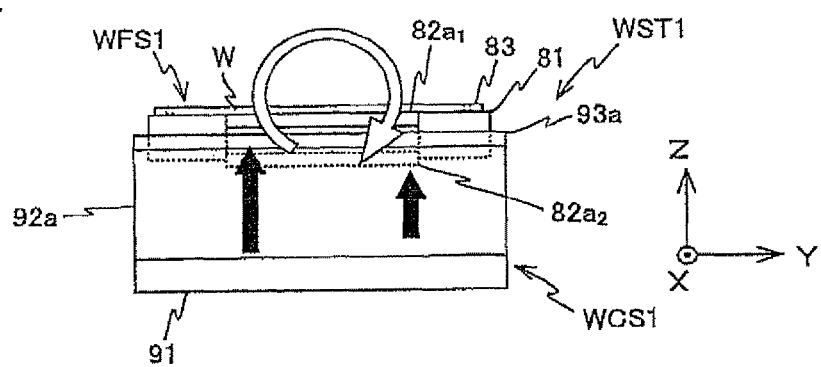
FIG. 9C is a view used to explain an operation when a fine movement stage is rotated around the X-axis with respect to a coarse movement stage.

Further, as shown in FIG. 9C, for example, main controller 20 can make fine movement stage WFS1 rotate around the X-axis (θx drive) (refer to the outlined arrow in FIG. 9C), by applying a different levitation force to both mover sections 82a and 82b of fine movement stage WFS1 on the + side and the − side in the Y-axis direction (refer to the black arrow in FIG. 9C). Incidentally, in contrast with FIG. 9C, by making the levitation force applied to mover section 82a (and 82b) on the −Y side smaller than the levitation force on the +Y side, fine movement stage WFS1 can be made to rotate counterclockwise with respect to the X-axis.

As it can be seen from the description above, in the embodiment, fine movement stage drive system 52A supports fine movement stage WFS1 by levitation in a non-contact state with respect to coarse movement stage WCS1, and can also drive fine movement stage WFS1 in a non-contact manner in directions of six degrees of freedom (X, Y, Z, θx, θy, θz) with respect to coarse movement stage WCS1.

Figure 10:
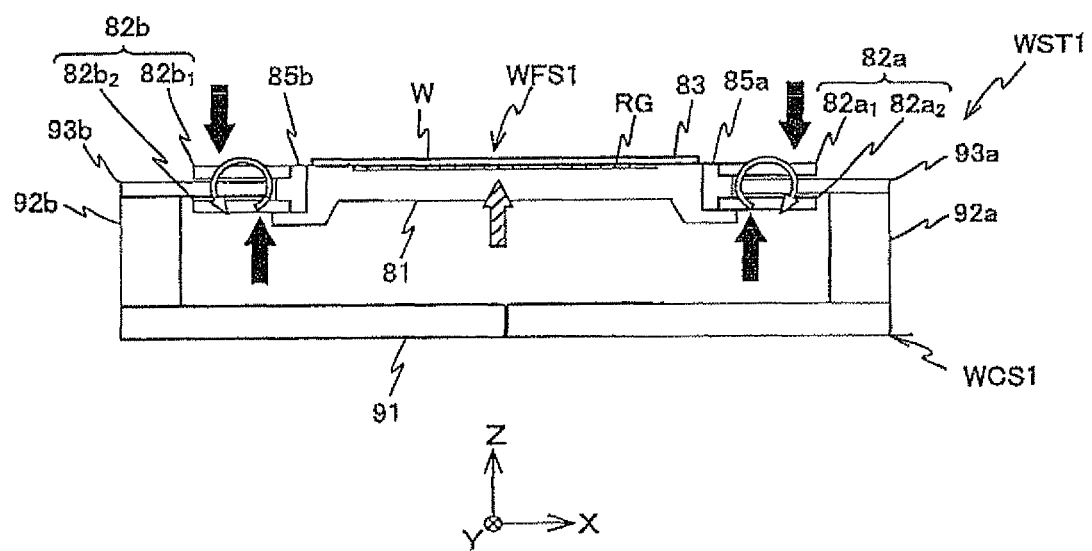
FIG. 10 is a view used to explain an operation when a center section of the fine movement stage is deflected in the +Z direction.

Further, in the embodiment, by supplying electric current to the two lines of coils 55 and 57 (refer to FIG. 6) placed inside stator section 93a in directions opposite to each other when applying the levitation force to fine movement stage WFS1, for example, main controller 20 can apply a rotational force (refer to the outlined arrow in FIG. 10) around the Y-axis simultaneously with the levitation force (refer to the black arrow in FIG. 10) with respect to mover section 82a, as shown in FIG. 10. Further, by applying a rotational force around the Y-axis to each of the pair of mover sections 82a and 82b in directions opposite to each other, main controller 20 can deflect the center of fine movement stage WFS1 in the +Z direction or the −Z direction (refer to the hatched arrow in FIG. 10). Accordingly, as shown in FIG. 10, by bending the center of fine movement stage WFS1 in the +Z direction, the deflection in the middle part of fine movement stage WFS1 (main body section 81) in the X-axis direction due to the self-weight of wafer W and main body section 81 can be canceled out, and degree of parallelization of the wafer W surface with respect to the ICY plane (horizontal surface) can be secured. This is particularly effective, in the case such as when the diameter of wafer W becomes large and fine movement stage WFS1 also becomes large.

Further, when wafer W is deformed by its own weight and the like, there is a risk that the surface of wafer W mounted on fine movement stage WFS1 will no longer be within the range of the depth of focus of projection optical system PL within the irradiation area (exposure area IA) of illumination light IL. Therefore, similar to the case described above where main controller 20 deflects the center in the X-axis direction of fine movement stage WFS1 to the +Z direction, by applying a rotational force around the Y-axis to each of the pair of mover sections 82a and 82b in directions opposite to each other, wafer W is deformed to be substantially flat, and the surface of wafer W within exposure area IA can fall within the range of the depth of focus of projection optical system PL. Incidentally, while FIG. 10 shows an example where fine movement stage WFS1 is bent in the +Z direction (a convex shape), fine movement stage WFS1 can also be bent in a direction opposite to this (a concave shape) by controlling the direction of the electric current supplied to the coils.

Incidentally, the method of making fine movement stage WFS1 (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA.

In exposure apparatus 100 of the embodiment, at the time of exposure operation by the step-and-scan method to wafer W, positional information (including the positional information in the θz direction) in the XY plane of fine movement stage WFS1 is measured by main controller 20 using an encoder system 73 (refer to FIG. 14) of fine movement stage position measurement system 70A which will be described later on. The positional information of fine movement stage WFS1 is sent to main controller 20, which controls the position of fine movement stage WFS1 based on the positional information.

On the other hand, when wafer stage WST1 (fine movement stage WFS1) is located outside the measurement area of fine movement stage position measurement system 70A, the positional information of wafer stage WST1 (fine movement stage WFS1) is measured by main controller 20 using wafer stage position measurement system 16A (refer to FIGS. 1 and 14). As shown in FIG. 1, wafer stage position measurement system 16A includes a laser interferometer which irradiates a measurement beam on a reflection surface formed on the coarse movement stage WCS1 side surface by mirror-polishing and measures positional information of wafer stage WST1 in the XY plane. Incidentally, although illustration is omitted in FIG. 1, in actual practice, a Y reflection surface perpendicular to the Y-axis and an X reflection surface perpendicular to the X-axis is formed on coarse movement stage WCS1, and corresponding to these surfaces, an X interferometer and a Y interferometer are provided which irradiate measurement beams, respectively, on to the X reflection surface and the Y reflection surface. Incidentally, in wafer stage position measurement system 16A, for example, the Y interferometer has a plurality of measurement axes, and positional information (rotation) in the θz direction of wafer stage WST1 can also be measured, based on an output of each of the measurement axes. Incidentally, the positional information of wafer stage WST1 in the XY plane can be measured using other measurement devices, such as for example, an encoder system, instead of wafer stage position measurement system 16A described above. In this case, for example, a two-dimensional scale can be placed on the upper surface of base board 12, and an encoder head can be arranged on the bottom surface of coarse movement stage WCS1.

As is previously described, fine movement stage WFS2 is configured identical to fine movement stage WFS1 described above, and can be supported in a non-contact manner by coarse movement stage WCS1 instead of fine movement stage WFS1. In this case, coarse movement stage WCS1 and fine movement stage WFS2 supported by coarse movement stage WCS1 configure wafer stage WST1, and a pair of mover sections (one pair each of magnet units $MUa_1$ and $MUa_2$, and $MUb_1$ and $MUb_2$) equipped in fine movement stage WFS2 and a pair of stator sections 93a and 93b (coil units CUa and CUb) of coarse movement stage WCS1 configure fine movement stage drive system 52A. And by this fine movement stage drive system 52A, fine movement stage WFS2 is driven in a non-contact manner in directions of six degrees of freedom with respect to coarse movement stage WCS1.

Further, fine movement stages WFS2 and WFS1 can each make coarse movement stage WCS2 support them in a non-contact manner, and coarse movement stage WCS2 and fine movement stage WFS2 or WFS1 supported by coarse movement stage WCS2 configure wafer stage WST2. In this case, a pair of mover sections (one pair each of magnet units $MUa_1$ and $MUa_2$, and $MUb_1$ and $MUb_2$) equipped in fine movement stage WFS2 or WFS1 and a pair of stator sections 93a and 93b (coil units CUa and CUb) of coarse movement stage WCS2 configure fine movement stage drive system 52B (refer to FIG. 14). And by this fine movement stage drive system 52B, fine movement stage WFS2 or WFS1 is driven in a non-contact manner in directions of six degrees of freedom with respect to coarse movement stage WCS2.

Referring back to FIG. 1, relay stage DRST is equipped with a stage main section 44 configured similar to coarse movement stages WCS1 and WCS2 (however, it is not structured so that it can be divided into a first section and a second section), and a carrier apparatus 46 (refer to FIG. 14) provided inside stage main section 44. Accordingly, stage main section 44 can support (hold) fine movement stage WFS1 or WFS2 in a non-contact manner as in coarse movement stages WCS1 and WCS2, and the fine movement stage supported by relay stage DRST can be driven in directions of six degrees of freedom (X, Y, Z, θx, θy, and θz) by fine movement stage drive system 52C (refer to FIG. 14) with respect to relay stage DRST. However, the fine movement stage should be slidable at least in the Y-axis direction with respect to relay stage DRST.

Carrier apparatus 46 is equipped with a carrier member main section which is reciprocally movable in the Y-axis direction with a predetermined stroke along both of the side walls in the X-axis direction of stage main section 44 of relay stage DRST and is vertically movable also in the Z-axis direction with a predetermined stroke, a carrier member 48 including a movable member which can relatively move in the Y-axis direction with respect to the carrier member main section while holding fine movement stage WFS1 or WFS2, and a carrier member drive system 54 (refer to FIG. 14) which can individually drive the carrier member main section configuring carrier member 48 and the movable member.

Next, a concrete configuration and the like of aligner 99 shown in FIG. 1 will be described, referring to FIG. 11.

Figure 11:
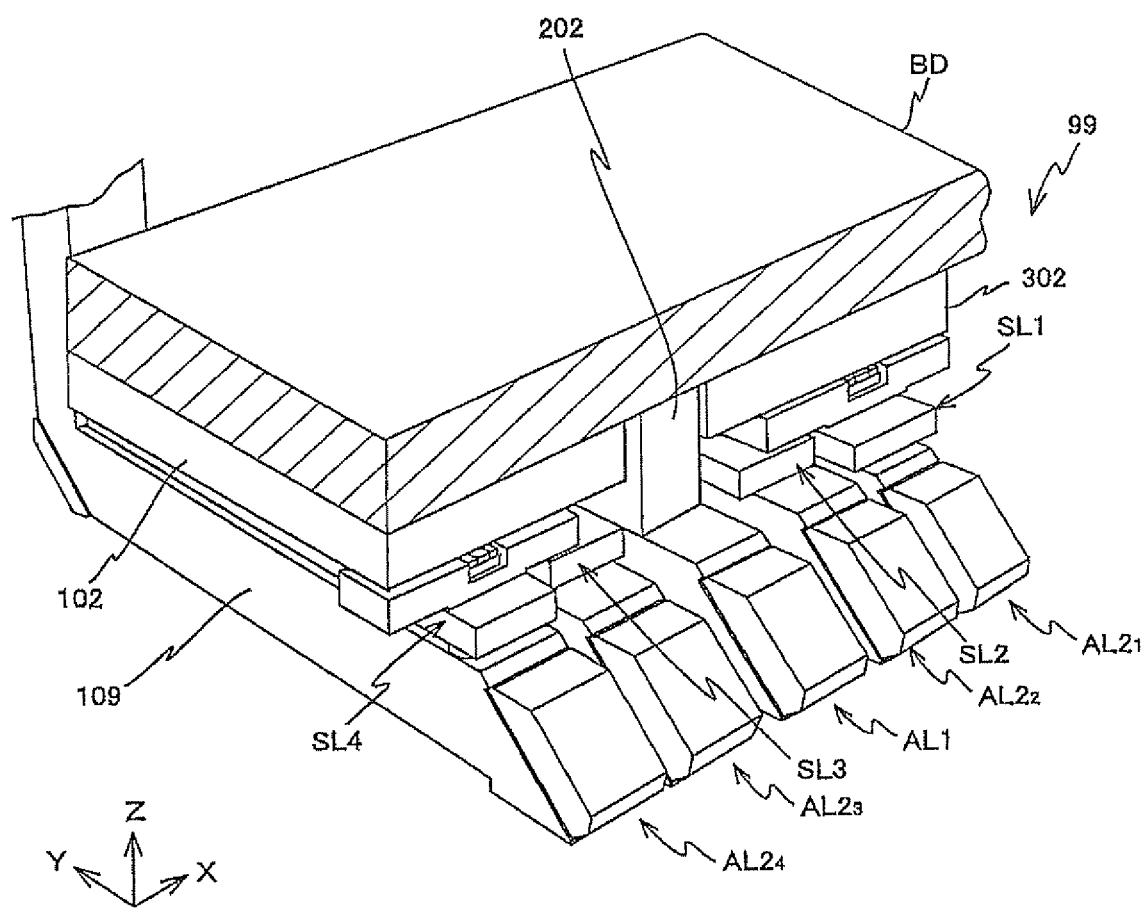
FIG. 11 is a perspective view showing an aligner.

FIG. 11 shows a perspective view of aligner 99 in a state where main frame BD is partially broken. As described above, aligner 99 is equipped with primary alignment system AL1 and four secondary alignment systems $AL2_1$, $AL2_2$, $AL2_3$, and $AL2_4$. The pair of secondary alignment systems $AL2_1$ and $AL2_2$ placed on the +X side of primary alignment system AL1 and the pair of secondary alignment systems $AL2_3$ and $AL2_4$ placed on the −X side have a symmetric configuration centered on primary alignment system AL1. Further, as is disclosed in, for example, PCT International Publication No. 2008/056735 (the corresponding U.S. Patent Application Publication No. 2009/0233234), secondary alignment systems AL21 to AL24 are independently movable by a drive system which includes a slider, a drive mechanism and the like that will be described later on.

Primary alignment system AL1 is supported via a support member 202, in a suspended state at the lower surface of main frame BD. As primary alignment system AL1, for example, an FIA (Field Image Alignment) system by an image processing method is used that irradiates a broadband detection beam that does not expose the resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signals from this primary alignment system AL1 are supplied to main controller 20 (refer to FIG. 14).

Sliders SL1 and SL2 are fixed to the upper surface of secondary alignment systems $AL2_1$ and $AL2_2$, respectively. On the +Z side of sliders SL1 and SL2, an FIA surface plate 302 is provided fixed to the lower surface of main frame BD. Further, sliders SL3 and SL4 are fixed to the upper surface of secondary alignment systems $AL2_3$ and $AL2_4$, respectively. On the +Z side of sliders SL3 and SL4, an FIA surface plate 102 is provided fixed to the lower surface of main frame BD.

Secondary alignment system $AL2_4$ is an FIA system like primary alignment system AL1, and includes a roughly L-shaped barrel 109 in which an optical member such as a lens has been arranged. On the upper surface (a surface on the +Z side) of the portion extending in the Y-axis direction of barrel 109, slider SL4 previously described is fixed, and this slider SL4 is arranged facing FIA surface plate 102 previously described.

FIA surface plate 102 is made of a member (e.g., Invar and the like) which is a magnetic material also having a low thermal expansion, and an armature unit including a plurality of armature coils are arranged in a part of the plate (near the end on the +Y side). As an example, the armature unit includes two Y drive coils and a pair of X drive coil groups. Further, in the inside of FIA surface plate 102, a liquid flow channel (not shown) is formed, and by the cooling liquid which flows through the flow channel, the temperature of FIA surface plate 102 is controlled (cooled) to a predetermined temperature.

Slider SL4 includes a slider main section, a plurality of static gas bearings provided in the slider main section, a plurality of permanent magnets, and a magnet unit. As the static gas bearings, a static gas bearing of a so-called ground gas supply type is used that supplies gas via a gas flow channel within FIA surface plate 102. The plurality of permanent magnets face FIA surface plate 102 made of the magnetic material previously described, and a magnetic attraction acts constantly between the plurality of permanent magnets and FIA surface plate 102. Accordingly, while gas is not supplied to the plurality of static gas bearings, slider SL4 moves closest to (is in contact with) the lower surface of FIA surface plate 102 by a magnetic attraction. When gas is supplied to the plurality of static gas bearings, a repulsion occurs between FIA surface plate 102 and slider SL4 due to static pressure of the gas. By a balance between the magnetic attraction and the static pressure (repulsion) of the gas, slider SL4 is maintained (held) in a state where a predetermined clearance is formed between the upper surface of the slider and the lower surface of FIA surface plate 102. Hereinafter, the former is referred to as a "landed state", and the latter will be referred to as a "floating state".

The magnet unit is provided corresponding to the armature unit previously described, and in the embodiment, by an electromagnetic interaction between the magnet unit and the armature unit (the two Y drive coils and the pair of X drive coil groups), a drive force in the X-axis direction, a drive force in the Y-axis direction, and a drive force in a rotational ($\theta z$) direction around the Z-axis can be applied to slider SL4. Incidentally, in the description below, a drive mechanism (an actuator) configured by the magnet unit and the armature unit described above will be referred to as an "alignment system motor".

Secondary alignment system $AL2_3$ placed on the +X side of secondary alignment system $AL2_4$ is configured in a similar manner as secondary alignment system $AL2_4$ described above, and slider SL3 is also structured almost the same as slider SL4. Further, between slider SL3 and FIA surface plate 102, a drive mechanism (an alignment system motor) as in the drive mechanism previously described is provided.

When driving (adjusting the position of) secondary alignment systems $AL2_4$ and $AL2_3$, main controller 20 supplies gas to the static gas bearings previously described, and by forming a predetermined clearance between sliders SL4 and SL3 and FIA surface plate 102, makes sliders SL4 and SL3 move into the floating state described above. Then, by controlling the electric current supplied to the armature unit configuring each of the alignment system motors based on the measurement values of the measurement devices (not shown in a state maintaining the floating state, main controller 20 finely drives slider SL4 (secondary alignment system $AL2_4$) and slider SL3 (secondary alignment system $AL2_3$) in the X-axis, the Y-axis and the $\theta z$ directions.

Referring back to FIG. 11, secondary alignment systems $AL2_1$ and $AL2_2$ also have a configuration like secondary alignment systems $AL2_3$ and $AL2_4$ described above, while slider SL2 has a configuration in symmetry with slider SL3 described above, and slider SL1 has a configuration in symmetry with slider SL4 described above. Further, the configuration of FIA surface plate 302 is in symmetry with the configuration of FIA surface plate 102 described above.

Next, a configuration of fine movement stage position measurement system 70A (refer to FIG. 14) used to measure the positional information of fine movement stage WFS1 or WFS2 (configuring wafer stage WST1), which is movably held by coarse movement stage WCS1 in exposure station 200, will be described. In this case, the case will be described where fine movement stage position measurement system 70A measures the positional information of fine movement stage WFS1.

As shown in FIG. 1, fine movement stage position measurement system 70A is equipped with an arm member (a measurement arm 71A) which is inserted in a space inside coarse movement stage WCS1 in a state where wafer stage WST1 is placed below projection optical system PL. Measurement arm 71A is supported in a cantilevered state (the vicinity of one end is supported) by main frame BD of exposure apparatus 100 via a support member 72A. Accordingly, measurement arm 71A is inserted from the −Y side into the space within coarse movement stage WCS1 with the movement of coarse movement stage WCS1. Incidentally, in the case a configuration is employed where the arm member does not interfere with the movement of the wafer stage, the configuration is not limited to the cantilever support, and both ends in the longitudinal direction can be supported. Further, the arm member should be located further below (the −Z side) grating RG (the placement plane substantially parallel to the XY plane) previously described, and for example, can be placed lower than the upper surface of base board 12. Furthermore, while the arm member was to be supported by main frame BD, for example, the arm member can be installed on an installation surface (such as a floor surface) via a vibration isolation mechanism. In this case, it is desirable to arrange a measuring device which measures a relative positional relation between main frame BD and the arm member. The arm member can also be referred to as a metrology arm or a measurement member.

Measurement arm 71A is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of a material which is the same that transmits light, such as, for example, a glass member affixed in plurals. Measurement arm 71A is formed solid, except for the portion where the encoder head (an optical system) which will be described later is housed. In the state where wafer stage WST1 is placed below projection optical system PL as previously described, the tip of measurement arm 71A is inserted into the space of coarse movement stage WCS1, and its upper surface faces the lower surface (to be more precise, the lower surface of main body section 81 (not shown in FIG. 1, refer to FIG. 2A) of fine movement stage WFS1 as shown in FIG. 1. The upper surface of measurement arm 71A is placed almost parallel with the lower surface of fine movement stage WFS1, in a state where a predetermined clearance, such as, for example, around several mm, is formed with the lower surface of fine movement stage WFS1. Incidentally, the clearance between the upper surface of measurement arm 71A and the lower surface of fine movement stage WFS can be more than or less than several mm.

As shown in FIG. 14, fine movement stage position measurement system 70A is equipped with encoder system 73 which measures the position of fine movement stage WFS1 in the X-axis direction, the Y-axis direction, and the θz direction, and laser interferometer system 75 which measures the position of fine movement stage WFS1 in the Z-axis direction, the ex direction, and the θy direction. Encoder system 73 includes an X linear encoder $73x$ measuring the position of fine movement stage WFS1 in the X-axis direction, and a pair of Y linear encoders $73ya$ and $73yb$ (hereinafter, also appropriately referred to together as Y linear encoder $73y$) measuring the position of fine movement stage WFS1 in the Y-axis direction. In encoder system 73, a head of a diffraction interference type is used that has a configuration similar to an encoder head (hereinafter shortly referred to as a head) disclosed in, for example, U.S. Pat. No. 7,238,931, and PCT International Publication No. 2007/083758 (the corresponding U.S. Patent Application Publication No. 2007/0288121). However, in the embodiment, a light source and a photodetection system (including a photodetector) of the head are placed external to measurement arm 71A as in the description later on, and only an optical system is placed inside measurement arm 71A, or more specifically, facing grating RG. Hereinafter, the optical system placed inside measurement arm 71A will be referred to as a head, besides the case when specifying is especially necessary.

Figure 12A:
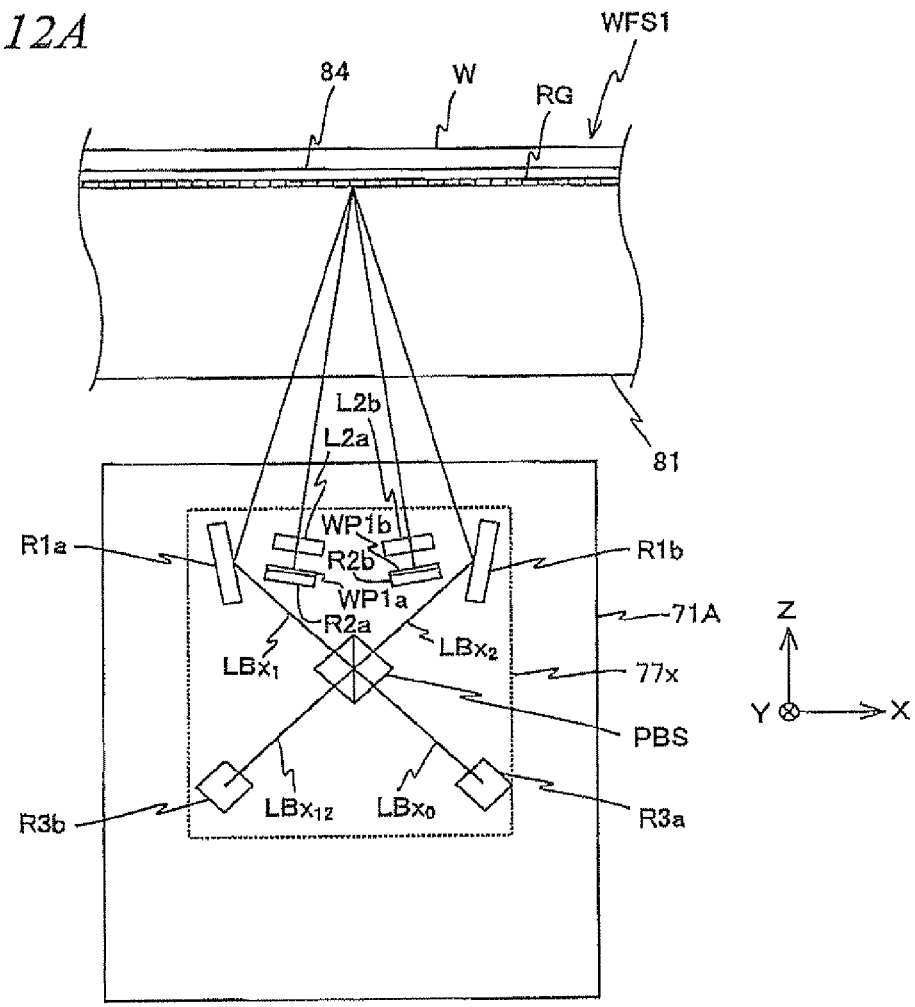
FIG. 12A is a view showing a rough configuration of an X head 77x.
Figure 12B:
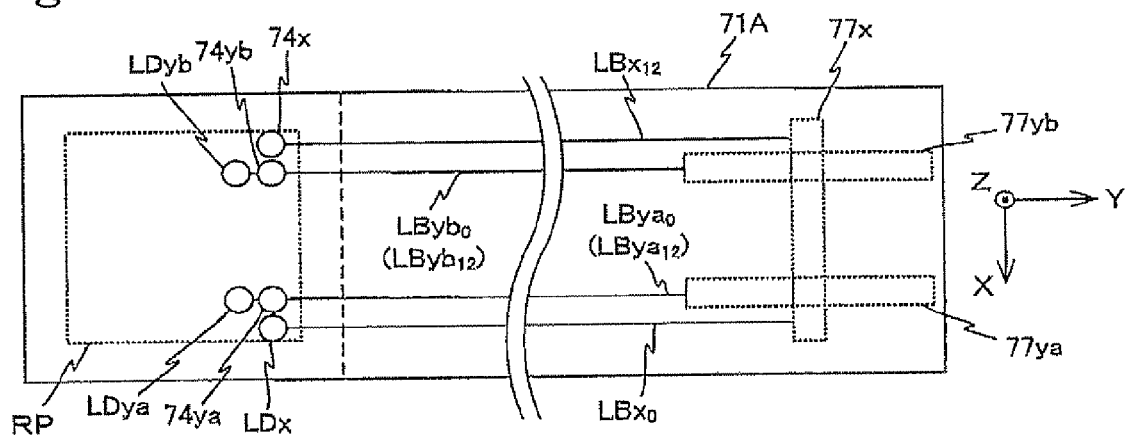
FIG. 12B is a view used to explain a placement of each of the X head 77x, Y heads 77ya and 77yb inside the measurement arm.

Encoder system 73 measures the position of fine movement stage WFS1 in the X-axis direction using one X head $77x$ (refer to FIGS. 12A and 12B), and the position in the Y-axis direction using a pair of Y heads $77ya$ and $77yb$ (refer to FIG. 12B). More specifically, X linear encoder $73x$ previously described is configured by X head $77x$ which measures the position of fine movement stage WFS1 in the X-axis direction using an X diffraction grating of grating RG, and the pair of Y linear encoders $73ya$ and $73yb$ is configured by the pair of Y heads $77ya$ and $77yb$ which measures the position of fine movement stage WFS1 in the Y-axis direction using a Y diffraction grating of grating RG.

A configuration of three heads $77x$, $77ya$, and $77yb$ which configures encoder system 73 will now be described. FIG. 12A representatively shows a rough configuration of X head $77x$, which represents three heads $77x$, $77ya$, and $77yb$. Further, FIG. 12B shows a placement of each of the X head $77x$, and Y heads $77ya$ and $77yb$ within measurement arm 71A.

As shown in FIG. 12A, X head $77x$ is equipped with a polarization beam splitter PBS whose separation plane is parallel to the YZ plane, a pair of reflection mirrors R1$a$ and R1$b$, lenses L2$a$ and L2$b$, quarter wavelength plates (hereinafter, described as λ/4 plates) WP1$a$ and WP1$b$, reflection mirrors R2$a$ and R2$b$, and reflection mirrors R3$a$ and R3$b$ and the like, and these optical elements are placed in a predetermined positional relation. Y heads $77ya$ and $77yb$ also have an optical system with a similar structure. As shown in FIGS. 12A and 12B, X head $77x$, Y heads $77ya$ and $77yb$ are unitized and each fixed inside of measurement arm 71A.

As shown in FIG. 12B, in X head $77x$ (X linear encoder $73x$), a laser beam $LBx_0$ is emitted in the −Z direction from a light source LDx provided on the upper surface (or above) at the end on the −Y side of measurement arm 71A, and its optical path is bent to become parallel with the Y-axis direction via a reflection surface RP which is provided on a part of measurement arm 71A inclined at an angle of 45 degrees with respect to the XY plane. This laser beam $LBx_0$ travels through the solid section inside measurement arm 71A in parallel with the longitudinal direction (the Y-axis direction) of measurement arm 71A, and reaches reflection mirror R3$a$ shown in FIG. 12A. Then, the optical path of laser beam $LBx_0$ is bent by reflection mirror R3$a$ and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS1, via reflection mirror R1$a$, and measurement beam $LBx_2$ reflected off polarization beam splitter PBS reaches grating RG via reflection mirror R1$b$. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1$a$ and WP1$b$ via lenses L2$a$ and L2$b$, and reflected by reflection mirrors R2$a$ and R2$b$ and then the beams pass through λ/4 plates WP1$a$ and WP1$b$ again and reach polarization beam splitter PBS by tracing the same optical path in the reversed direction.

Each of the polarization directions of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. Accordingly, the first-order diffraction beams of each of the measurement beams $LBx_1$ and $LBx_2$ are coaxially synthesized as a synthetic beam $LBx_{12}$. Synthetic beam $LBx_{12}$ has its optical path bent by reflection mirror R3$b$ so it becomes parallel to the Y-axis, travels inside measurement arm 71A parallel to the Y-axis, and then is sent to an X photodetection system $74x$ provided on the upper surface (or above) at the end on the −Y side of measurement arm 71A shown in FIG. 12B via reflection surface RP previously described.

In X photodetection system $74x$, the polarization direction of the first-order diffraction beams of beams $LBx_1$ and $LBx_2$ synthesized as synthetic beam $LBx_{12}$ is arranged by a polarizer (analyzer) (not shown) and the beams overlay each other so as to form an interference light, which is detected by the photodetector and is converted into an electric signal in accordance with the intensity of the interference light. When fine movement stage WFS1 moves in the measurement direction (in this case, the X-axis direction) here, a phase difference between the two beams changes, which changes the intensity of the interference light. This change of the intensity of the interference light is supplied to main controller 20 (refer to FIG. 14) as positional information related to the X-axis direction of fine movement stage WFS1.

As shown in FIG. 12B, laser beams $LBya_0$ and $LByb_0$, which are emitted from light sources LDya and LDyb, respectively, and whose optical paths are bent by an angle of 90 degrees so as to become parallel to the Y-axis by reflection surface RP previously described, are incident on Y heads 77ya and 77yb, and similar to the previous description, synthetic beams $LBya_{12}$ and $LByb_{12}$ of the first-order diffraction beams by grating RG (Y diffraction grating) of each of the measurement beams split by polarization by the polarization beam splitter are output from Y heads 77ya and 77yb, respectively, and return to Y photodetection systems 74ya and 74yb. Now, laser beams $LBya_0$ and $LByb_0$ emitted from light sources LDya and LDyb, and synthetic beams $LBya_{12}$ and $LByb_{12}$ returning to Y photodetection systems 74ya and 74yb, each pass an optical path which are overlaid in a direction perpendicular to the page surface of FIG. 12B. Further, as described above, in Y heads 77ya and 77yb, optical paths are appropriately bent (omitted in drawings) inside so that laser beams $LBya_0$ and $LByb_0$ irradiated from the light source and synthetic beams $LBya_{12}$ and $LByb_{12}$ returning to Y photodetection systems 74ya and 74yb pass optical paths which are parallel and distanced apart in the Z-axis direction.

Figure 13A:
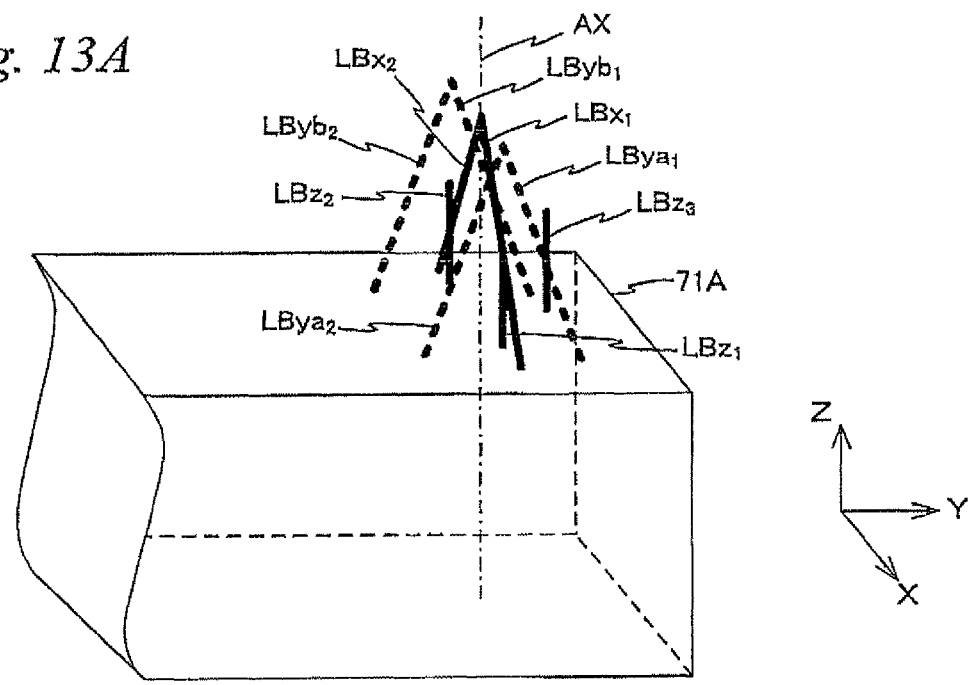
FIG. 13A shows a perspective view of a tip of a measurement arm.
Figure 13B:
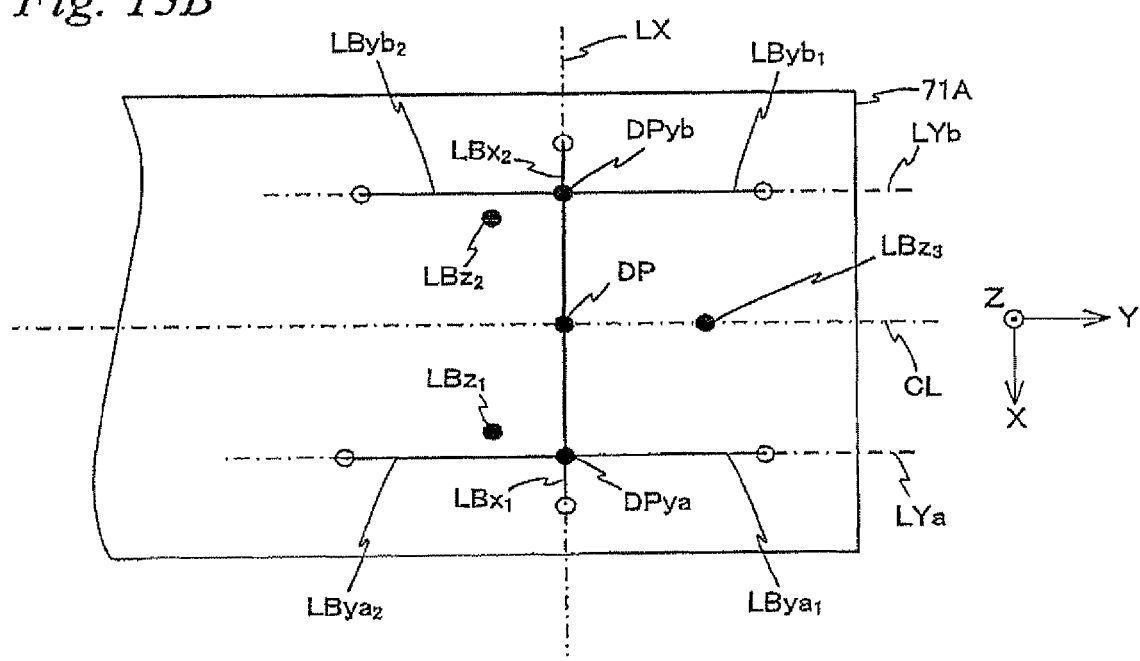
FIG. 13B is a planar view when viewed from the +Z direction of an upper surface of the tip of the measurement arm.

FIG. 13A shows a tip of measurement arm 71A in a perspective view, and FIG. 13B shows an upper surface of the tip of measurement arm 71A in a planar view when viewed from the +Z direction. As shown in FIGS. 13A and 13B, X head 77x irradiates measurement beams $LBx_1$ and $LBx_2$ (indicated by a solid line in FIG. 13A) from two points (refer to the white circles in FIG. 13B) on a straight line LX parallel to the X-axis that are at an equal distance from a center line CL (a straight line parallel to the Y-axis which passes through a midpoint of the X-axis direction) of measurement arm 71A, on the same irradiation point on grating RG. The irradiation point of measurement beams $LBx_1$ and $LBx_2$, that is, a detection point of X head 77x (refer to reference code DP in FIG. 13B) coincides with an exposure position which is the center of an irradiation area (exposure area) IA of illumination light IL irradiated on wafer W (refer to FIG. 1). Incidentally, while measurement beams $LBx_1$ and $LBx_2$ are actually refracted at a boundary and the like of main body section 81 and an atmospheric layer, it is shown simplified in FIG. 12A and the like.

As shown in FIG. 12B, each of the pair of Y heads 77ya and 77yb are placed on the +X side and the −X side of center line CL of measurement arm 71A. As shown in FIGS. 14A and 14B, Y head 77ya irradiates measurement beams $LBya_1$ and $LBya_2$ that are each shown by a broken line in FIG. 14A on a common irradiation point on grating RG from two points (refer to the white circles in FIG. 14B) which are distanced equally from straight line LX on a straight line LYa which is parallel to the Y-axis. The irradiation point of measurement beams $LBya_1$ and $LBya_2$, that is, a detection point of Y head 77ya is shown by reference code DPya in FIG. 13B.

Y head 77yb irradiates measurement beams $LByb_1$ and $LByb_2$ from two points (refer to the white circles in FIG. 13B) which are symmetrical to the two outgoing points of measurement beams $LBya_1$ and $LBya_2$ with respect to center line CL, on a common irradiation point DPyb on grating RG. As shown in FIG. 13B, detection points DPya and DPyb of Y heads 77ya and 77yb, respectively, are placed on straight line LX which is parallel to the X-axis.

Now, main controller 20 determines the position of fine movement stage WFS1 in the Y-axis direction, based on an average of the measurement values of the two Y heads 77ya and 77yb. Accordingly, in the embodiment, the position of fine movement stage WFS1 in the Y-axis direction is measured with a midpoint DP of detection points DPya and DPyb serving as a substantial measurement point. Midpoint DP coincides with the irradiation point of measurement beams $LBx_1$ and $LBx_2$ on grating RG.

More specifically, in the embodiment, there is a common detection point regarding measurement of positional information of fine movement stage WFS1 in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 20 can constantly perform measurement of the positional information of fine movement stage WFS1 in the XY plane, directly under (at the back side of fine movement stage WFS1) the exposure position when transferring a pattern of reticle R on a predetermined shot area of wafer W mounted on fine movement stage WFS1. Further, main controller 20 measures a rotational amount of fine movement stage WFS1 in the θz direction, based on a difference of the measurement values of the pair of Y heads 77ya and 77yb.

As shown in FIG. 13A, laser interferometer system 75 makes three measurement beams $LBz_1$, $LBz_2$, and $LBz_3$ enter the lower surface of fine movement stage WFS1 from the tip of measurement arm 71A. Laser interferometer system 75 is equipped with three laser interferometers 75a to 75c (refer to FIG. 14) that irradiate three measurement beams $LBz_1$, $LBz_2$, and $LBz_3$, respectively.

In laser interferometer system 75, as shown in FIGS. 13A and 13B, three measurement beams $LBz_1$, $LBz_2$, and $LBz_3$ are each emitted in parallel to the Z-axis, from three points (three points that are not collinear on the upper surface of measurement arm 71A) which correspond to each apex of an isosceles triangle (or an equilateral triangle) whose centroid coincides with the exposure area which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from center line CL. In the embodiment, main controller 20 measures the position in the Z-axis direction, the rotational amount in the θz direction and the θy direction of fine movement stage WFS1, using laser interferometer system 75. Incidentally, laser interferometers 75a to 75c are provided on the upper surface (or above) at the end on the −Y side of measurement arm 71A. Measurement beams $LBz_1$, $LBz_2$, and $LBz_3$ emitted in the −Z direction from laser interferometers 75a to 75c travel within measurement arm 71A along the Y-axis direction via reflection surface RP1 previously described, and each of their optical paths is bent so that the beams are emitted from the three points described above.

In the embodiment, on the lower surface of fine movement stage WFS1, a wavelength selection filter (omitted in drawings) which transmits each measurement beam from encoder system 73 and blocks the transmission of each measurement beam from laser interferometer system 75 is provided. In this case, the wavelength selection filter also serves as a reflection surface of each of the measurement beams from laser interferometer system 75. As the wavelength selection filter, a thin film and the like having wavelength-selectivity is used, and in the embodiment, the filter is provided, for example, on one surface of the transparent plate (main body section 81), and grating RG is placed on the wafer holder side with respect to the one surface.

As it can be seen from the description so far, main controller 20 can measure the position of fine movement stage WFS1 in directions of six degrees of freedom by using encoder system 73 and laser interferometer system 75 of fine movement stage position measurement system 70A. In this case, since the optical path lengths of the measurement beams are extremely short and also are almost equal to each other in encoder system 73, the influence of air fluctuation can mostly be ignored. Accordingly, by encoder system 73, positional information (including the θz direction) of fine movement stage WFS1 within the XY plane can be measured with high accuracy. Further, because the substantial detection points on the grating in the X-axis direction and the Y-axis direction by encoder system 73 and detection points on the lower surface of fine movement stage WFS1 lower surface in the Z-axis direction by laser interferometer system 75 coincide with the center (exposure position) of exposure area IA, respectively, generation, of the so-called Abbe error is suppressed to a substantially ignorable degree. Accordingly, by using fine movement stage position measurement system 70A, main controller 20 can measure the position of fine movement stage WFS1 in the X-axis direction, the Y-axis direction, and the Z-axis direction with high precision, without any Abbe errors. Further, in the case coarse movement stage WCS1 is below projection unit PU and fine movement stage WFS2 is movably supported by coarse movement stage WCS1, by using fine movement stage position measurement system 70A, main controller 20 can measure the position in directions of six degrees of freedom of fine movement stage WFS2 and especially the position of fine movement stage WFS2 in the X-axis direction, the Y-axis direction, and the Z-axis direction can be measured with high precision, without any Abbe errors.

Further, fine movement stage position measurement system 70B which measurement station 300 is equipped with, is configured similar to fine movement stage position measurement system 70A, but in a symmetric manner, as shown in FIG. 1. Accordingly, measurement arm 71B which fine movement stage position measurement system 70B is equipped with has a longitudinal direction in the Y-axis direction, and the vicinity of the end on the +Y side is supported almost cantilevered from main frame BD, via support member 72B. Measurement arm 71B is inserted from the +Y side into the space within coarse movement stage WCS2 with the movement of coarse movement stage WCS2.

In the case coarse movement stage WCS2 is below aligner 99 and fine movement stage WFS2 or WFS1 is movably supported by coarse movement stage WCS2, by using fine movement stage position measurement system 70B, main controller 20 can measure the position in directions of six degrees of freedom of fine movement stage WFS2 (or WFS1) and especially the position of fine movement stage WFS2 (or WFS1) in the X-axis direction, the Y-axis direction, and the Z-axis direction can be measured with high precision, without any Abbe errors.

FIG. 14 shows a block diagram showing an input/output relation of main controller 20, which centrally configures a control system of exposure apparatus 100 and has overall control over each part. Main controller 20 includes a workstation (or a microcomputer) and the like, and has overall control over each part of exposure apparatus 100, such as local liquid immersion device 8, coarse movement stage drive systems 51A and 51B, fine movement stage drive systems 52A and 52B, and relay stage drive system 53 and the like previously described.

In exposure apparatus 100 of the embodiment structured in the manner described above, when manufacturing a device, exposure by the step-and-scan method is performed on wafer W held by one of the fine movement stages (in this case, WFS1, as an example) held by coarse movement stage WCS1 located in exposure station 200, and a pattern of reticle R is transferred on each of a plurality of shot areas on wafer W. The exposure operation by this step- and scan method is performed by main controller 20, by repeating a movement operation between shots in which wafer stage WST1 is moved to a scanning starting position (an acceleration starting position) for exposure of each shot area on wafer W, and a scanning exposure operation in which a pattern formed on reticle R is transferred onto each of the shot areas by the scanning exposure method, based on results of wafer alignment (for example, information on array coordinates of each shot area on wafer W obtained by enhanced global alignment (EGA) that has been converted into a coordinate which uses the second fiducial marks as a reference) that has been performed beforehand, and results of reticle alignment and the like. Incidentally, the exposure operation described above is performed, in a state where liquid Lq is held in a space between tip lens 191 and wafer W, or more specifically, by liquid immersion exposure. Further, exposure is performed in the following order, from the shot area located on the +Y side on wafer W to the shot area located on the −Y side. Incidentally, details on EGA are disclosed in, for example, U.S. Pat. No. 4,780,617 and the like.

In exposure apparatus 100 of the embodiment, during the series of exposure operations described above, main controller 20 measures the position of fine movement stage WFS1 (wafer N) using fine movement stage position measurement system 70A, and the position of wafer W is controlled based on the measurement results.

Figure 15A:
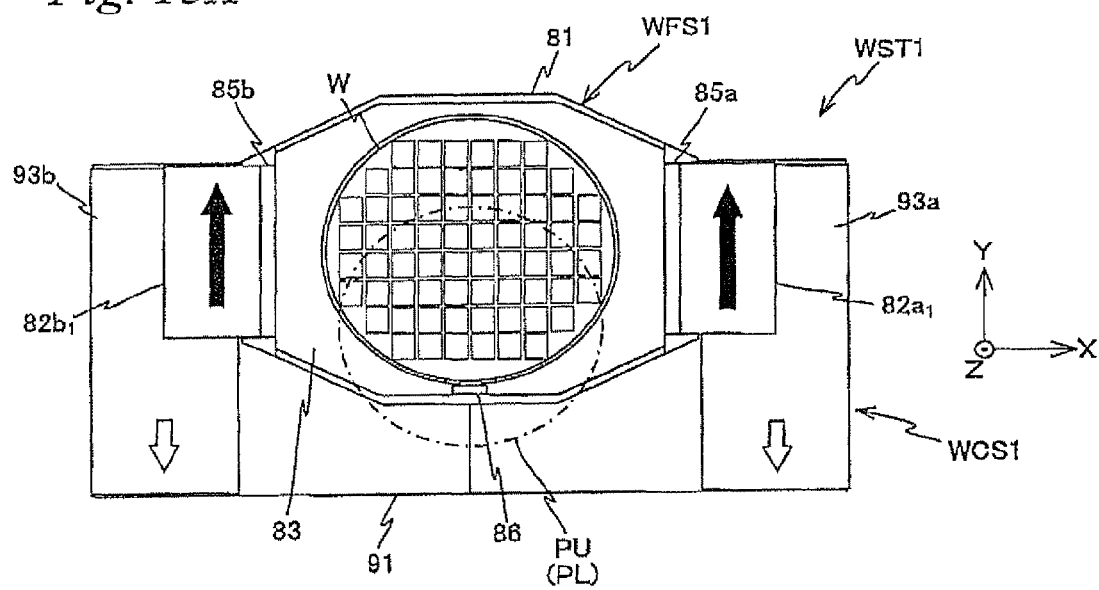
FIG. 15A is a view used to explain a drive method of a wafer at the time of scanning exposure.

Incidentally, while wafer W has to be driven with high acceleration in the Y-axis direction at the time of scanning exposure operation described above, in exposure apparatus 100 of the embodiment, main controller 20 scans wafer W in the Y-axis direction by driving (refer to the black arrow in FIG. 15A) only fine movement stage WFS1 in the Y-axis direction (and in directions of the other five degrees of freedom, if necessary), without driving coarse movement stage WCS1 in principle at the time of scanning exposure operation as shown in FIG. 15A. This is because when moving only fine movement stage WFS1, weight of the drive object is lighter when comparing with the case where coarse movement stage WCS1 is driven, which allows an advantage of being able to drive wafer W with high acceleration. Further, because position measuring accuracy of fine movement stage position measurement system 70A is higher than wafer stage position measurement system 16A as previously described, it is advantageous to drive fine movement stage WFS1 at the time of scanning exposure. Incidentally, at the time of this scanning exposure, coarse movement stage WCS1 is driven to the opposite side of fine movement stage WFS1 by an operation of a reaction force (refer to the outlined arrow in FIG. 15A) by the drive of fine movement stage WFS1. More specifically, because coarse movement stage WCS1 functions as a countermass, momentum of the system consisting of the entire wafer stage WST1 is conserved, and centroid shift does not occur, inconveniences such as unbalanced load acting on base board 12 by the scanning drive of fine movement stage WFS1 do not occur.

Figure 15B:
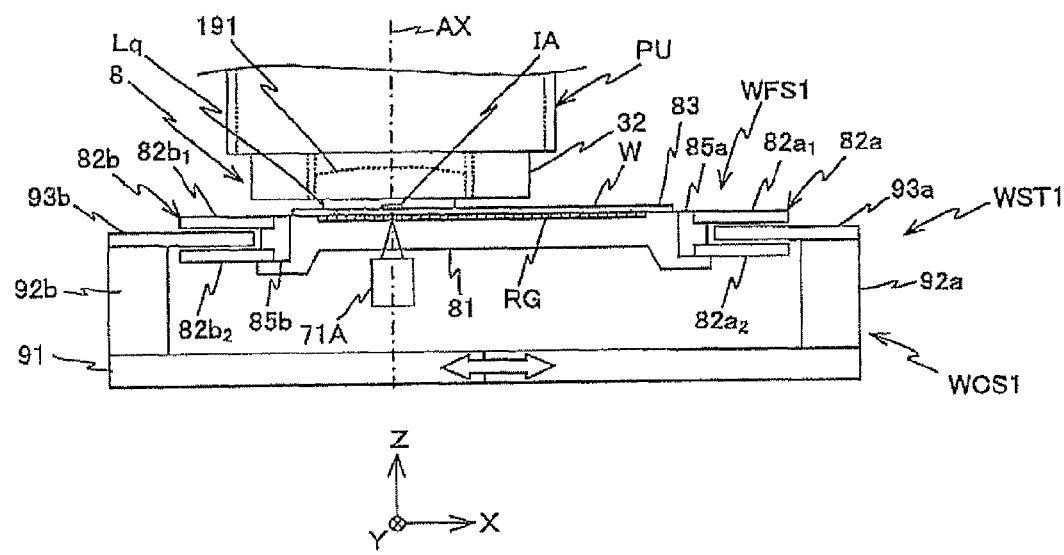
FIG. 15B is a view used to explain a driving method of a wafer at the time of stepping.

Meanwhile, when movement (stepping) operation between shots in the X-axis direction is performed, because movement capacity in the X-axis direction of fine movement stage WFS1 is small, main controller 20 moves wafer W in the X-axis direction by driving coarse movement stage WCS1 in the X-axis direction as shown in FIG. 15B.

In the embodiment, in parallel with exposure to wafer W on fine movement stage WFS1 described above, wafer exchange, wafer alignment, and the like are performed on the other fine movement stage WFS2. Wafer exchange is performed, by unloading wafer W which has been exposed from above fine movement stage WFS2 by a wafer carrier system (not shown), as well as loading a new wafer W on fine movement stage WFS2 when coarse movement stage WCS2 supporting fine movement stage WFS2 is at measurement station 300 or at a predetermined wafer exchange position in the vicinity of measurement station 300. In this case, the wafer carrier system is equipped, for example, with a wafer exchange arm (not shown) consisting of an arm of a multijoint robot, and the exchange arm has a disc-shaped Bernoulli chuck (also called a float chuck) at the tip. As is known, the Bernoulli chuck is a chuck that utilizes the Bernoulli effect and fixes (suctions) the object in a non-contact manner by locally increasing the flow velocity of a blown out fluid (e.g., air). The Bernoulli effect, here, refers to an effect that the Bernoulli's theorem (principle) in which an increase in the speed of the fluid occurs simultaneously with a decrease in pressure has on fluid machinery. In the Bernoulli chuck, the holding state (suction/floating state) is decided, according to the weight of the object to be suctioned (fixed), and the flow rate of the fluid which is blown out from the chuck. More specifically, in the case the size of the object is known, the dimension of the gap between the chuck and the object to be held upon holding is decided, depending on the flow rate of the fluid which is blown out from the chuck. In the embodiment, the Bernoulli chuck is used to suction (to fix or to hold) wafer W.

Figure 16:
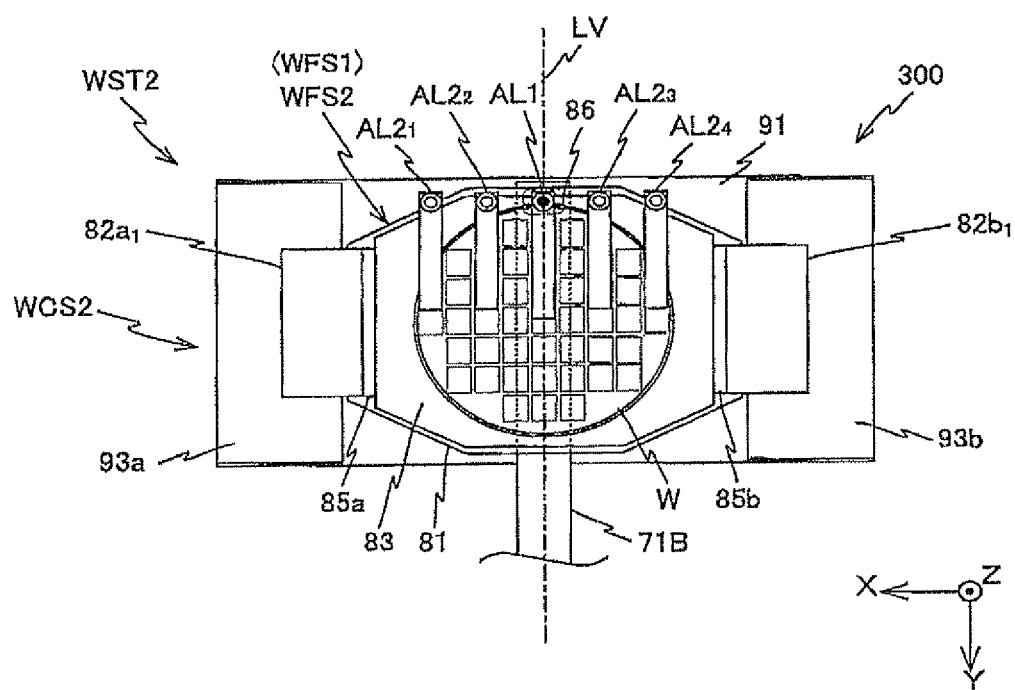
FIG. 16 is a view used to explain a wafer alignment procedure performed (No. 1) in the exposure apparatus of the first embodiment.

On wafer alignment, first of all, as shown in FIG. 16, main controller 20 drives fine movement stage WFS2 so as to position measurement plate 86 on fine movement stage WFS2 right under primary alignment system AL1, and detects the second fiducial mark using primary alignment system AL1. Then, main controller 20 makes a link between a position coordinate (X, Y) of the second fiducial mark which uses the detection results, or namely, the detection center (the index center) of primary alignment system AL1 as a reference, and measurement values of fine movement stage position measurement system 70B at the time of the detection of the second fiducial mark, and stores them in memory (not shown).

And while making wafer stage WST2 perform a stepping movement, at each stepping position, main controller 20 detects one, or more than one alignment marks arranged on a plurality of specific shot areas (sample shot areas) on wafer W, or more specifically, the alignment marks formed on a street (also called a scribe line) dividing the shot areas, using at least one alignment system including primary alignment system AL1. Then, on each detection, main controller 20 makes a link between a position coordinate (X, Y) of the alignment mark which uses the detection results, or namely, the detection center (the index center) of primary alignment system AL1 or $AL2_n$ and measurement values of fine movement stage position measurement system 70B at the time of the detection of the alignment mark, and stores them in memory (not shown).

In the following description, a wafer alignment procedure will be described, in the case of picking wafer W having 43 shot areas as shown in FIG. 16 as an example and choosing all the shot areas on wafer W as a sample shot area, and detecting the one or two specific alignment marks (hereinafter referred to as sample marks) provided in each of the sample shot areas. In this case, on wafer W, three shot areas each are formed in the first row and the seventh row, seven shot areas each are formed in the second row, the third row, the fifth row, and the sixth row, and nine shot areas are formed in the fourth row. Incidentally, in the following description, the primary alignment system and the secondary alignment system will both be shortly described appropriately as an alignment system. Further, while the positional information of wafer stage WST2 (fine movement stage WFS2) during the wafer alignment is measured by fine movement stage position measurement system 70B, in the following description of the wafer alignment procedure, explanation related to fine movement stage position measurement system 70B will be omitted.

Figure 17A:
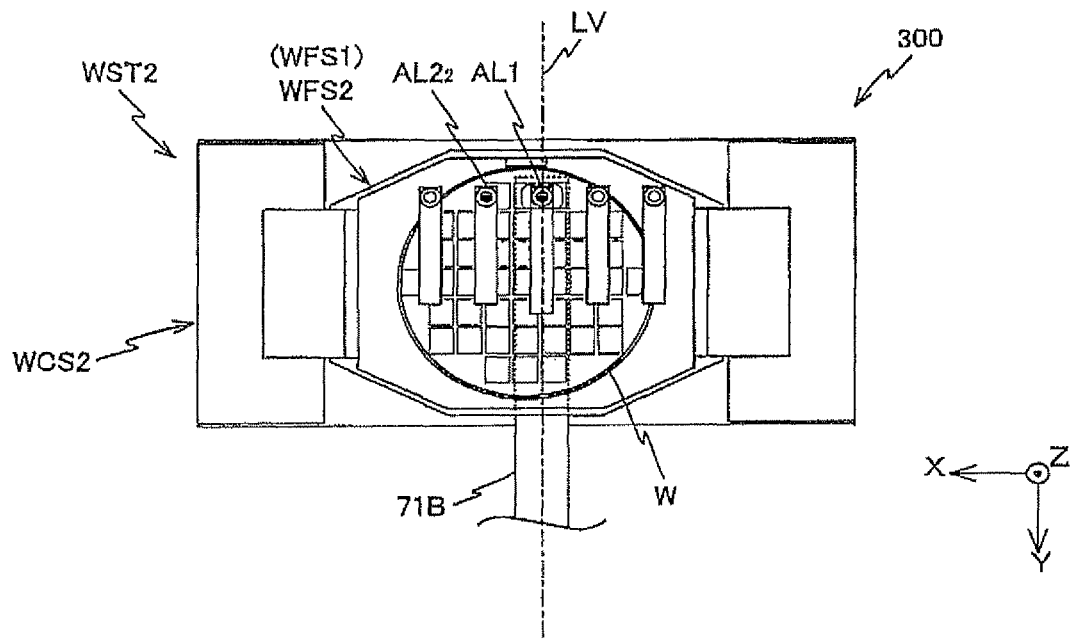
FIGS. 17A and 17B are views used to explain a wafer alignment procedure performed (No. 2) in the exposure apparatus of the first embodiment.

After having detected the second fiducial mark, main controller 20 steps wafer stage WST2 to a position a predetermined distance in the −Y direction and a predetermined distance in the +X direction from the position shown in FIG. 16, and positions one sample mark each arranged in the first and third shot areas in the first row on wafer W so that the sample marks are within a detection field of alignment systems $AL2_2$ and AL1, respectively, as shown in FIG. 17A. Main controller 20, in this case, can move wafer stage WST2 directly (diagonally) from the position shown in FIG. 16 to the position shown in FIG. 17A, or can step wafer stage WST2 in the order of the −Y direction and the +X direction, or in the order of the +X direction and then the −Y direction. In any case, main controller 20 detects the two sample marks simultaneously and individually using alignment systems AL1 and $AL2_2$, after positioning wafer stage WST2 at the position shown in FIG. 17A.

Figure 17B:
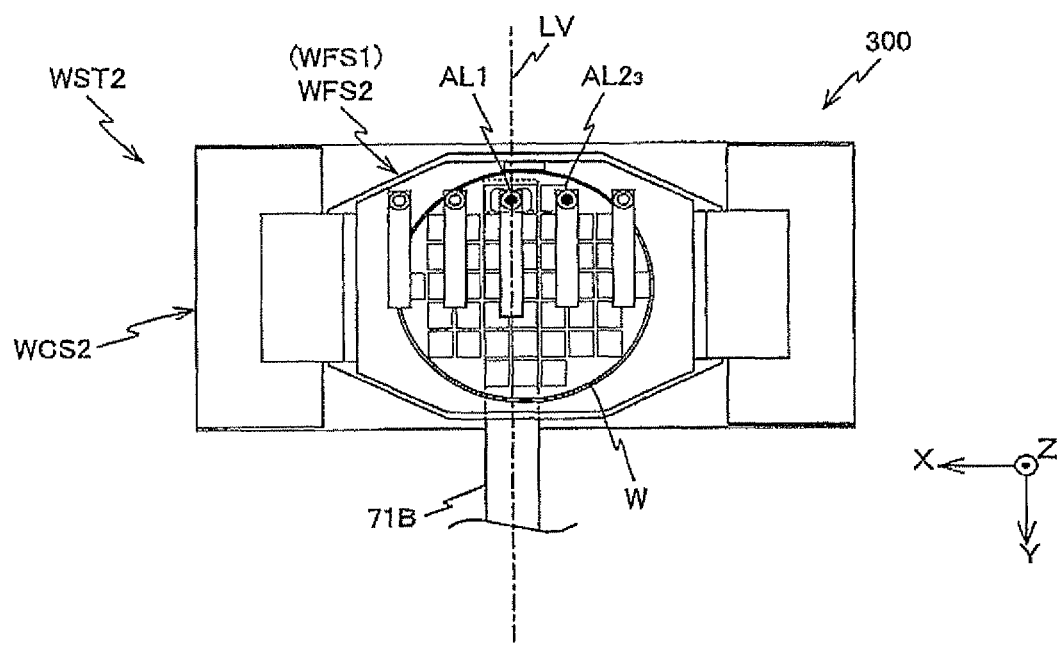

Next, main controller 20 steps wafer stage WST2 located at the position shown in FIG. 17A in the −X direction, and positions one sample mark each arranged in the second and third shot areas in the first row on wafer W so that the sample marks are within a detection field of alignment systems AL1 and $AL2_3$, respectively, as shown in FIG. 17B. And, main controller 20 detects the two sample marks simultaneously and individually, using alignment systems AL1 and $AL2_3$. This completes the detection of the sample marks in the shot areas of the first row.

Figure 18A:
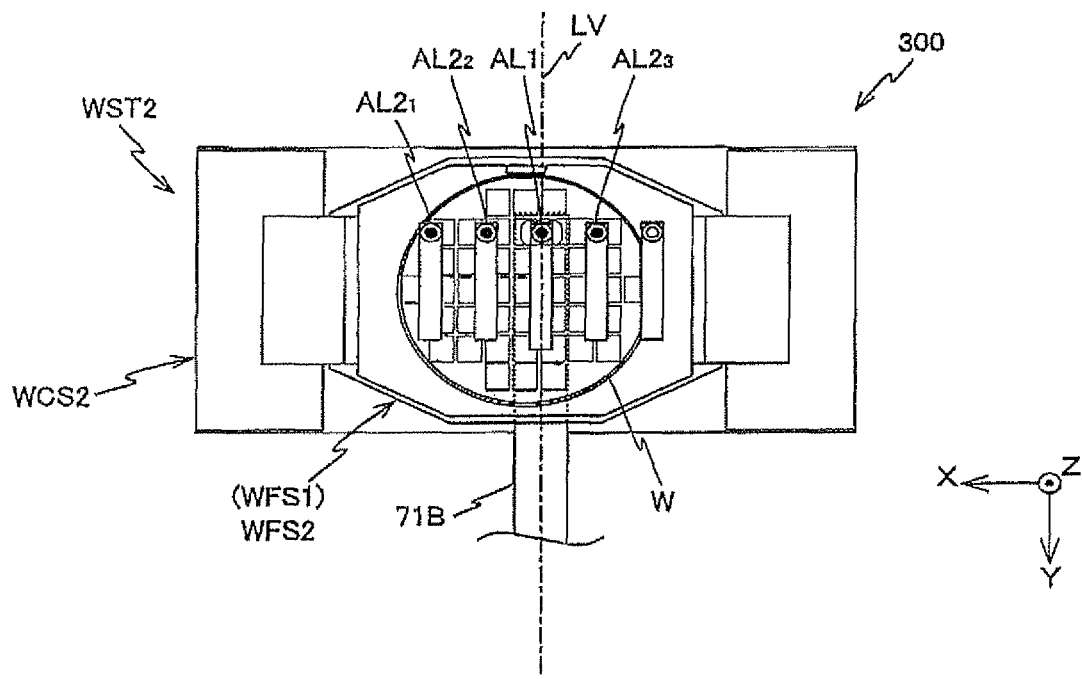
FIGS. 18A and 18B are views used to explain a wafer alignment procedure performed (No. 3) in the exposure apparatus of the first embodiment.
Figure 18B:
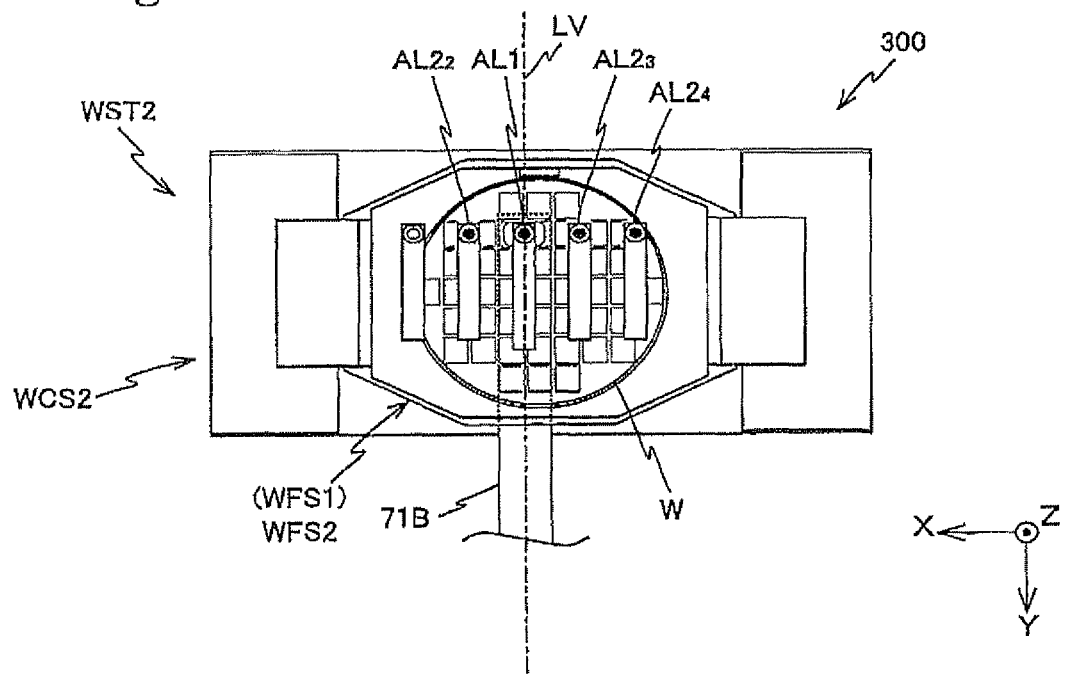

Next, main controller 20 steps wafer stage WST2 to a position a predetermined distance in the −Y direction and a predetermined distance in the +X direction from the position shown in FIG. 17B, and positions one sample mark each arranged in the first, third, fifth, and seventh shot areas in the second row on wafer W so that the sample marks are within a detection field of alignment systems $AL2_1$, $AL2_2$, AL1, and $AL2_3$, respectively, as shown in FIG. 18A. And, main controller 20 detects the four sample marks simultaneously and individually, using alignment systems $AL2_1$, $AL2_2$, AL1, and $AL2_3$. Next, main controller 20 steps wafer stage WST2 from the position shown in FIG. 18A in the −X direction, and positions one sample mark each arranged in the second, fourth, sixth, and seventh shot areas in the second row on wafer W so that the sample marks are within a detection field of alignment systems $AL2_2$, AL1, $AL2_3$, and $AL2_4$, respectively, as shown in FIG. 18B. And, main controller 20 detects the four sample marks simultaneously and individually, using alignment systems $AL2_2$, AL1, $AL2_3$, and $AL2_4$. This completes the detection of the sample marks in the shot areas of the second row.

Next, main controller 20 performs detection of the sample marks in the shot areas of the third row, in a procedure similar to the detection of the sample marks in the shot areas of the second row.

Figure 19A:
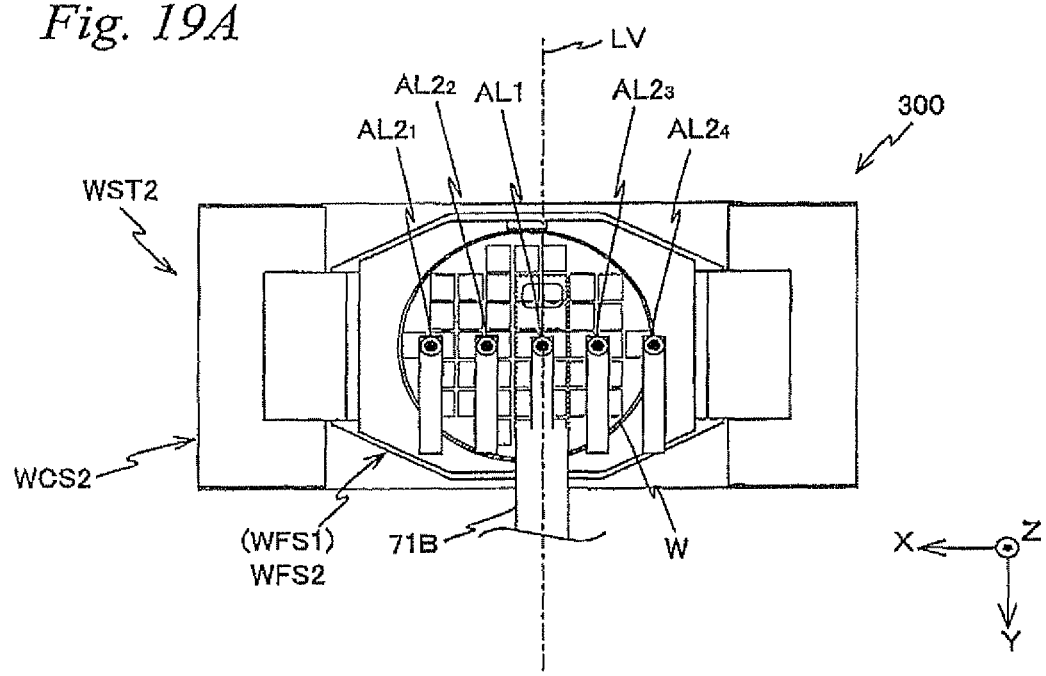
FIGS. 19A and 19B are views used to explain a wafer alignment procedure performed (No. 4) in the exposure apparatus of the first embodiment.
Figure 19B:
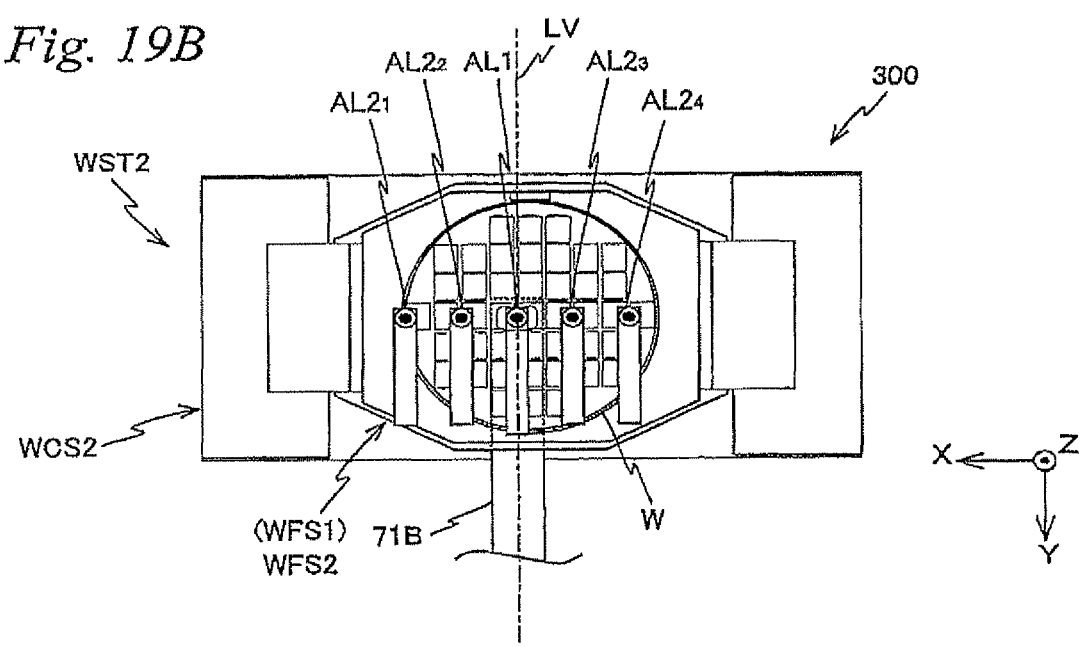

And, when the detection of the sample marks in the shot areas of the third row is completed, main controller 20 steps wafer stage WST2 from the position set at that point in time to a position a predetermined distance in the −Y direction and a predetermined distance in the +X direction, and positions one sample mark each arranged in the first, third, fifth, seventh, and ninth shot areas in the fourth row on wafer W so that the sample marks are within a detection field of alignment systems $AL2_1$, $AL2_2$, AL1, $AL2_3$, and $AL2_4$, respectively, as shown in FIG. 19A. And, main controller 20 detects the five sample marks simultaneously and individually, using alignment systems $AL2_1$, $AL2_2$, AL1, $AL2_3$, and $AL2_4$. Next, main controller 20 steps wafer stage WST2 from the position shown in FIG. 19A in the −X direction, and positions one sample mark each arranged in the second, fourth, sixth, eighth, and ninth shot areas in the fourth row on wafer W so that the sample marks are within a detection field of alignment systems $AL2_1$, $AL2_2$, AL1, $AL2_3$, and $AL2_4$, respectively, as shown in FIG. 19B. And, main controller 20 detects the five sample marks simultaneously and individually, using alignment systems $AL2_1$, $AL2_2$, AL1, $AL2_3$, and $AL2_4$.

Furthermore, main controller 20 performs detection of the sample marks in the shot areas of the fifth and sixth rows, in a manner similar to the detection of the sample marks in the shot areas of the second row. Finally, main controller 20 performs detection of the sample marks in the shot areas of the seventh row, in a manner similar to the detection of the sample marks in the shot areas of the first row.

When detection of the sample marks in all of the shot areas is completed in the manner described above, main controller 20 computes an array (position coordinates) of all of the shot areas on wafer W by performing a statistical computation which is disclosed in, for example, U.S. Pat. No. 4,780,617 and the like, using detection results of the sample marks and measurement values of fine movement stage position measurement system 70B at the time of the sample mark detection. More specifically, EGA (Enhanced Global Alignment) is performed. Then, main controller 20 converts the computation results to an array (position coordinates) which uses a position of the second fiducial marks as a reference, using detection results of the second fiducial marks and measurement values of fine movement stage position measurement system 70B at the time of the detection.

As described above, as for the Y-axis direction, main controller 20 gradually steps wafer stage WST2 in the −Y direction, while driving wafer stage WST2 reciprocally in the +X direction and the −X direction for the X-axis direction, so as to detect the alignment marks (sample marks) provided in all of the shot areas on wafer W. In this case, in exposure apparatus 100 of the embodiment, because five alignment systems AL1, and $AL2_1$ to $AL2_4$ can be used, the distance of the reciprocal drive in the X-axis direction is short, and the number of times of position setting in one reciprocal movement is few, which is two times. Therefore, alignment marks can be detected in quite a short amount of time when compared with the case when using a single alignment system. Incidentally, in case no problems occur from the viewpoint of throughput, the wafer alignment previously described where all of the shot areas are sample shots can be performed, using only primary alignment system AL1. In this case, a baseline of secondary alignment systems $AL2_1$ to $AL2_4$, namely, a relative position of secondary alignment systems $AL2_1$ to $AL2_4$ with respect to primary alignment system AL1 will not be required.

In the embodiment, main controller 20 performs position measurement including the detection of the second fiducial marks, and in the case of the wafer alignment, performs position measurement of fine movement stage WFS2 in the XY plane supported by coarse movement stage WCS2 at the time of the wafer alignment, using fine movement stage position measurement system 70B including measurement arm 71B. However, besides this, in the case of performing the movement of fine movement stage WFS2 at the time of wafer alignment integrally with coarse movement stage WCS2, main controller 20 can perform wafer alignment while measuring the position of wafer W via wafer stage position measurement system 16B (relative position measuring instrument 22B) previously described. Or, for example, wafer alignment can be performed while measuring the θz rotation of wafer W (fine movement stage WFS2) using wafer stage position measurement system 16B and relative position measuring instrument 22B, and measuring the X position and Y position of fine movement stage WFS2 using fine movement stage position measurement system 70B.

Further, because measurement station 300 and exposure station 200 are arranged apart, the position of fine movement stage WFS2 is controlled on different coordinate systems at the time of wafer alignment and at the time of exposure. Therefore, main controller 20 converts array coordinates of each shot area on wafer W acquired from the wafer alignment into array coordinates which are based on the second fiducial marks.

While wafer alignment to wafer W held by fine movement stage WFS2 is completed in the manner described above, exposure of wafer W which is held by fine movement stage WFS1 in exposure station 200 is still being continued. FIG. 20A shows a positional relation of coarse movement stages WCS1, WCS2 and relay stage DRST at the stage when wafer alignment to wafer W has been completed.

Main controller 20 drives wafer stage WST2 by a predetermined distance in the −Y direction via coarse movement stage drive system 51B, as shown in an outlined arrow in FIG. 20B, and makes wafer stage WST2 be in contact or be in proximity by around 500 μm to relay stage DRST which is standing still at a predetermined waiting position (for example, substantially coincides with a center position between an optical axis AX of projection optical system PL and a detection center of primary alignment system AL1).

Next, main controller 20 controls the current flowing in Y drive coils of fine movement stage drive systems 52B and 52C so as to drive fine movement stage WFS2 in the −Y direction by a Lorentz force, as is shown by the black arrow in FIG. 20C, and moves fine movement stage WFS2 from coarse movement stage WCS2 onto relay stage DRST. FIG. 20D shows a state where fine movement stage WFS2 has been moved and mounted on relay stage DRST.

Main controller 20 waits for the exposure to wafer W on fine movement stage WFS1 to be completed, in a state where relay stage DRST and coarse movement stage WCS2 are waiting at a position shown in FIG. 20D.

Figure 22:
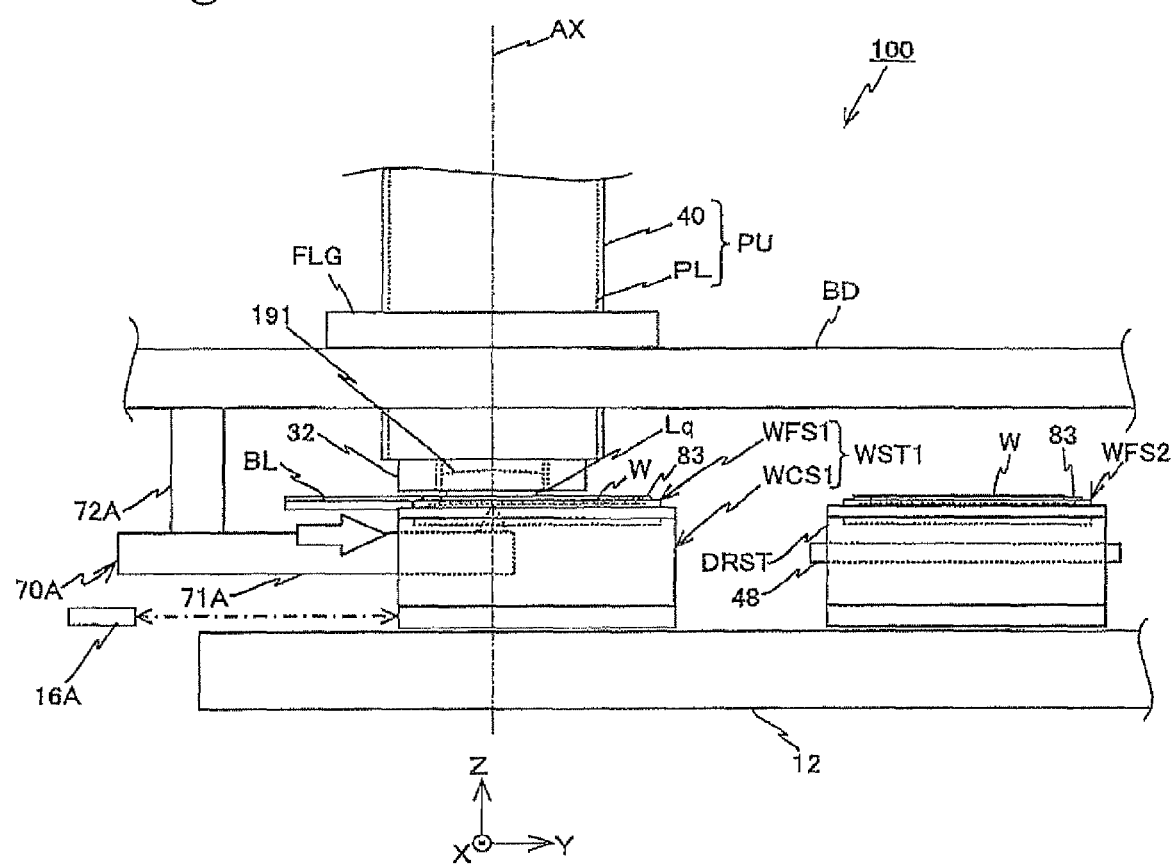
FIG. 22 is a view used to explain a delivery of a liquid immersion space (liquid Lq) performed between a fine movement stage and a movable blade (No. 2)

FIG. 22 shows a state of wafer stage WST1 immediately after completing the exposure.

Figure 21:
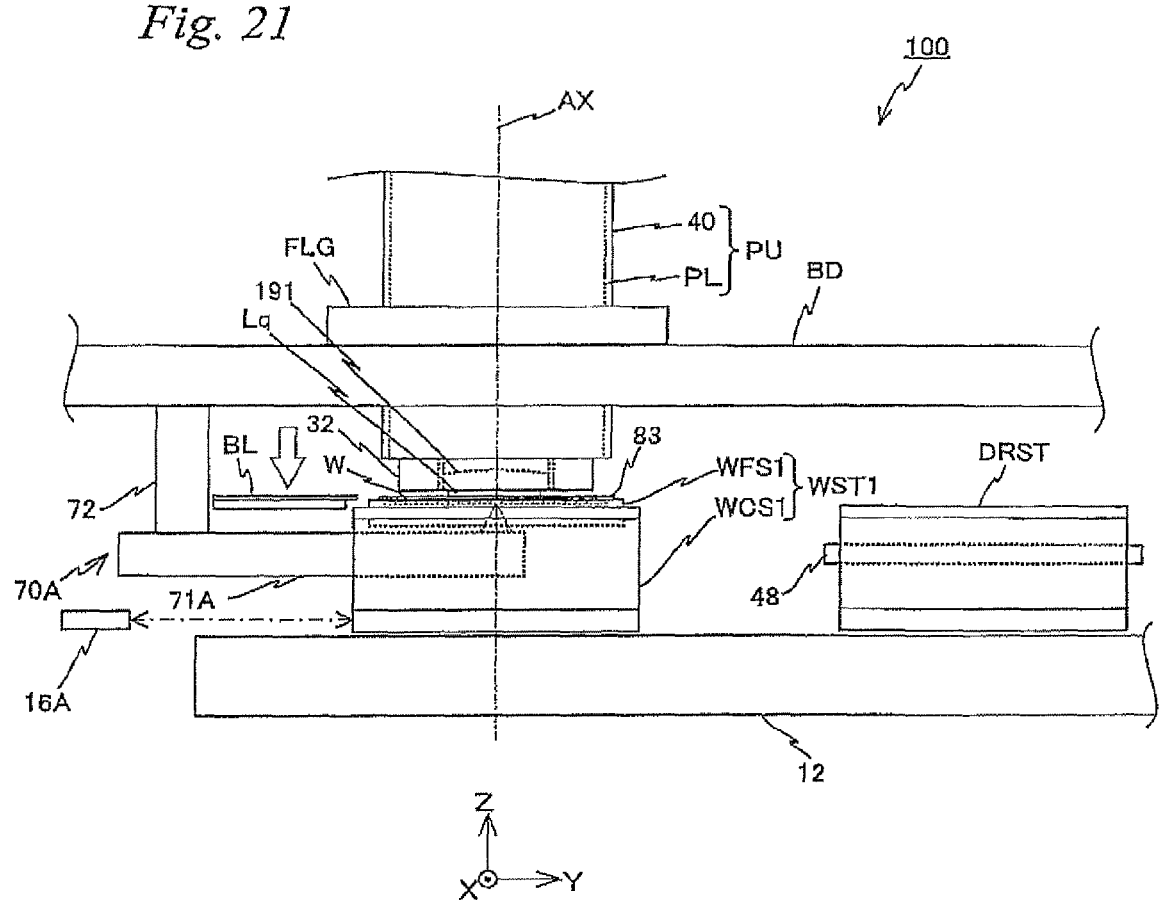
FIG. 21 is a view used to explain a delivery of a liquid immersion space (liquid Lq) performed between a fine movement stage and a movable blade (No. 1)

Prior to the completion of exposure, main controller 20 drives movable blade BL downward by a predetermined amount from a state shown in FIG. 4 via blade drive system 58 as is shown by an outlined arrow in FIG. 21. By this drive, the upper surface of movable blade BL is positioned to be flush with the upper surface of fine movement stage WFS1 (and wafer W) located below projection optical system PL, as shown in FIG. 21. Then, main controller 20 waits for the exposure to be completed in this state.

Then, when exposure has been completed, main controller 20 drives movable blade BL in the +Y direction by a predetermined amount (refer to the outlined arrow in FIG. 22) via blade drive system 58, so as to make movable blade BL be in contact or in proximity by a clearance of around 300 µm to fine movement stage WFS1. More specifically, main controller 20 sets movable blade BL and fine movement stage WFS1 to a scrum state.

Figure 23:
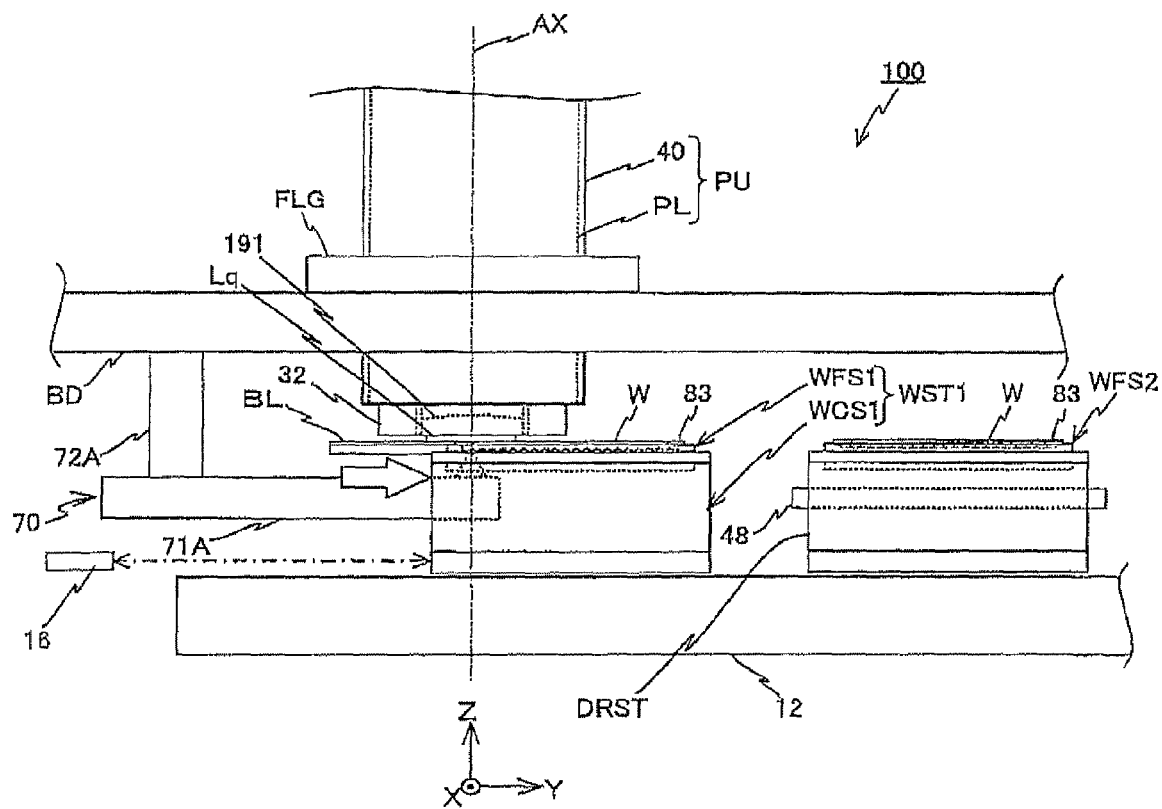
FIG. 23 is a view used to explain a delivery of a liquid immersion space (liquid Lq) performed between a fine movement stage and a movable blade (No. 3)

Next, as shown in FIG. 23, main controller 20 drives movable blade BL in the +Y direction (refer to the outlined arrow in FIG. 23) integrally with wafer stage WST1, while maintaining a scrum state between movable blade BL and fine movement stage WFS1. By this operation, the liquid immersion space formed by liquid Lq held between tip lens 191 and fine movement stage WFS1 is passed from fine movement stage WFS1 to movable blade BL. FIG. 23 shows a state just before the liquid immersion space formed by liquid Lq is passed from fine movement stage WFS1 to movable blade BL. In the state shown in FIG. 23, liquid Lq is held between tip lens 191, and fine movement stage WFS1 and movable blade BL. Incidentally, in the case of driving movable blade BL and fine movement stage WFS1 in proximity, it is desirable to set a gap (clearance) between movable blade BL and fine movement stage WFS1 so as to prevent or to suppress leakage of liquid Lq. In this case, in proximity includes the case where the gap (clearance) between blade BL and fine movement stage WFS1 is zero, or in other words, the case when both movable blade BL and fine movement stage WFS1 are in contact.

Figure 24:
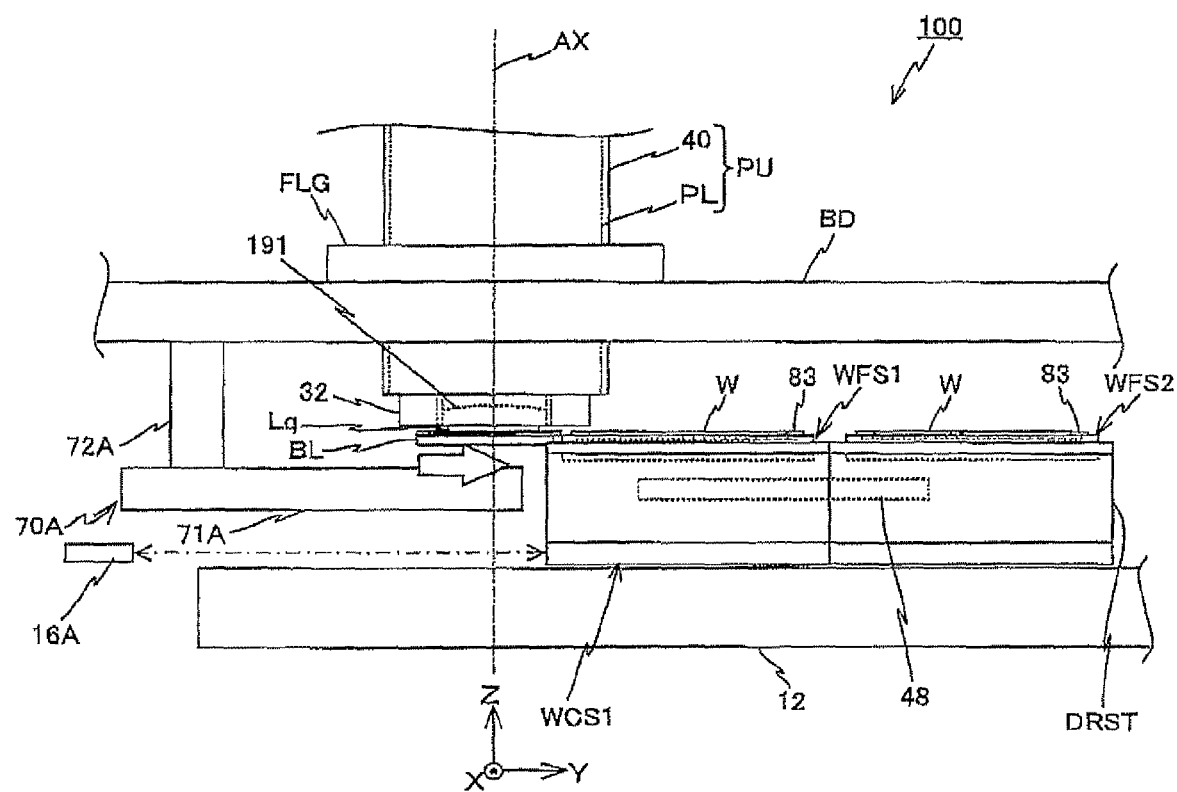
FIG. 24 is a view used to explain a delivery of a liquid immersion space (liquid Lq) performed between a fine movement stage and a movable blade (No. 4)

Then, when the liquid immersion space has been passed from fine movement stage WFS1 to movable blade BL, as shown in FIG. 24, main controller 20 makes coarse movement stage WCS1 holding fine movement stage WFS1 come into contact or in proximity by a clearance of around 300 µm to relay stage DRST waiting in a proximity state with coarse movement stage WCS2, holding fine movement stage WFS2 at the waiting position previously described. During the stage where coarse movement stage WCS1 holding fine movement stage WFS1 moves in the +Y direction, main controller 20 inserts carrier member 48 of carrier apparatus 46 into the space of coarse movement stage WCS1, via carrier member drive system 54.

And, at the point when coarse movement stage WCS1 holding fine movement stage WFS1 comes into contact or in proximity to relay stage DRST, main controller 20 drives carrier member 48 upward so that fine movement stage WFS1 is supported from below.

And, in this state, main controller 20 releases the lock mechanism (not shown), and separates coarse movement stage WCS1 into the first section WCS1a and the second section WCS1b. By this operation, fine movement stage WFS1 is detachable from coarse movement stage WCS1. Then, main controller 20 drives carrier member 48 supporting fine movement stage WFS1 downward, as is shown by the outlined arrow in FIG. 25A.

And then, main controller 20 locks the lock mechanism (not shown) after the first section WCS1a and the second section WCS1b are joined together.

Next, math controller 20 moves carrier member 48 which supports fine movement stage WFS1 from below to the inside of stage main section 44 of relay stage DRST. FIG. 25B shows the state where carrier member 48 is being moved. Further, concurrently with the movement of carrier member 48, main controller 20 controls the current flowing in Y drive coils of fine movement stage drive systems 52C and 52A, and drives fine movement stage WFS2 in the −Y direction as is shown by the black arrow in FIG. 25B by a Lorentz force, and moves (a slide movement) fine movement stage WFS2 from relay stage DRST onto coarse movement stage WCS1.

Further, after housing the carrier member main section of carrier member 48 into the space of relay stage DRST so that fine movement stage WFS1 is completely housed in the space of relay stage DRST, main controller 20 moves the movable member holding fine movement stage WFS1 in the +Y direction on the carrier member main section (refer to the outlined arrow in FIG. 25C).

Next, main controller 20 moves coarse movement stage WCS1 which holds fine movement stage WFS2 in the −Y direction, and delivers the liquid immersion space held with tip lens 191 from movable blade BL to fine movement stage WFS2. The delivery of this liquid immersion space (liquid Lq) is performed by reversing the procedure of the delivery of the liquid immersion area from fine movement stage WFS1 to movable blade BL previously described.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS2 and the like. FIG. 25D shows fine movement stage WFS2 during reticle alignment, along with coarse movement stage WCS1 holding the fine movement stage. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. As is obvious from FIGS. 25E and 25F, in this exposure, fine movement stage WFS2 is returned to the −Y side after reticle alignment, and then exposure is performed in the order from shot areas on the side on wafer W to the shot areas on the −Y side.

Concurrently with the delivery of the liquid immersion space, reticle alignment, and exposure described above, the following operations are performed.

More specifically, as shown in FIG. 25D, main controller 20 moves carrier member 48 holding fine movement stage WFS1 into the space of coarse movement stage WCS2. At this point, with the movement of carrier member 48, main controller 20 moves the movable member holding fine movement stage WFS1 on the carrier member main section in the +Y direction.

Next, main controller 20 releases the lock mechanism (not shown), and separates coarse movement stage WCS2 into the first section WCS2a and the second section WCS2b, and also drives carrier member 48 holding fine movement stage WFS1 upward as is shown by the outlined arrow in FIG. 25E so that each of the pair of mover sections equipped in fine movement stage WFS1 are positioned at a height where the pair of mover sections are engageable with the pair of stator sections of coarse movement stage WCS2.

And then, main controller 20 brings together the first section WCS2a and the second section WCS2b of coarse movement stage WCS2. By this, fine movement stage WFS1 holding wafer W which has been exposed is supported by coarse movement stage WCS2. Therefore, main controller 20 locks the lock mechanism (not shown).

Next, main controller 20 drives coarse movement stage WCS2 supporting fine movement stage WFS1 in the +Y direction as shown by the outlined arrow in FIG. 25F, and moves coarse movement stage WCS2 to measurement station 300.

Then, by main controller 20, on fine movement stage WFS1, wafer exchange, detection of the second fiducial marks, wafer alignment and the like are performed, in procedures similar to the ones previously described.

Then, main controller 20 converts array coordinates of each shot area on wafer W acquired from the wafer alignment into array coordinates which are based on the second fiducial marks. In this case as well, position measurement of fine movement stage WFS1 on alignment is performed, using fine movement stage position measurement system 70B.

While wafer alignment to wafer W held by fine movement stage WFS1 is completed in the manner described above, exposure of wafer W which is held by fine movement stage WFS2 in exposure station 200 is still being continued.

Then, in a manner similar to the previous description, main controller 20 moves fine movement stage WFS1 to relay stage DRST. Main controller 20 waits for the exposure to wafer W on fine movement stage WFS2 to be completed, in a state where relay stage DRST and coarse movement stage WCS2 are waiting at the waiting position previously described.

Hereinafter, a similar processing is repeatedly performed, alternately using fine movement stages WFS1 and WFS2, and an exposure processing to a plurality of wafer Ws is continuously performed.

As described in detail above, according to exposure apparatus 100 of the embodiment, in exposure station 200, wafer W mounted on fine movement stage WFS1 (or WFS2) held relatively movable by coarse movement stage WCS1 is exposed with exposure light IL, via reticle R and projection optical system PL. In doing so, positional information in the X plane of fine movement stage WFS1 (or WFS2) held movable by coarse movement stage WCS1 is measured by main controller 20, using encoder system 73 of fine movement stage position measurement system 70A which has Measurement arm 71A which faces grating RG placed at fine movement stage WFS1 (or WFS2). In this case, because space is formed inside coarse movement stage WCS1 and each of the heads of fine movement stage position measurement system 70A are placed in this space, there is only space between fine movement stage WFS1 (or WFS2) and each of the heads of fine movement stage position measurement system 70A. Accordingly, each of the heads can be arranged in proximity to fine movement stage WFS1 (or WFS2) (grating RG), which allows a highly precise measurement of the positional information of fine movement stage WFS1 (or WFS2) by fine movement stage position measurement system 70A. Further, as a consequence, a highly precise drive of fine movement stage WFS1 (or WFS2) via coarse movement stage drive system 51A and/or fine movement stage drive system 52A by main controller 20 becomes possible.

Further, in this case, irradiation points of the measurement beams of each of the heads of encoder system 73 and laser interferometer system 75 configuring fine movement stage position measurement system 70A emitted from measurement arm 71A on grating RG coincide with the center (exposure position) of irradiation area (exposure area) IA of exposure light IL irradiated on wafer W. Accordingly, main controller 20 can measure the positional information of fine movement stage WFS1 (or WFS2) with high accuracy, without being affected by so-called Abbe error. Further, because optical path lengths in the atmosphere of the measurement beams of each of the heads of encoder system 73 can be made extremely short by placing measurement arm 71A right under grating RG, the influence of air fluctuation is reduced, and also in this point, the positional information of fine movement stage WFS1 (or WFS2) can be measured with high accuracy.

Further, in the embodiment, fine movement stage position measurement system 70B configured symmetric to fine movement stage position measurement system 70A is provided in measurement station 300. And in measurement station 300, when wafer alignment to wafer W on fine movement stage WFS2 (or WFS1) held by coarse movement stage WCS2 is performed by alignment systems AL1, and AL2$_1$ to AL2$_4$ and the like, positional information in the XY plane of fine movement stage WFS2 (or WFS1) held movable on coarse movement stage WCS2 is measured by fine movement stage position measurement system 70B with high precision. As a consequence, a highly precise drive of fine movement stage WFS2 (or WFS1) via coarse movement stage drive system 51B and/or fine movement stage drive system 52B by main controller 20 becomes possible.

Further, in the embodiment, because the free end and the fixed end in each of the arms are set in opposite directions in measurement arm 71A at the exposure station 200 side and measurement arm 71B at the measurement station 300 side, coarse movement stage WCS1 can approach measurement station 300 (to be more precise, relay stage DRST) and coarse movement stage WCS2 can also approach exposure station 200 (to be more precise, relay stage DRST), without being disturbed by measurement arms 71A and 71B.

Further, according to the embodiment, the delivery of fine movement stage WFS2 (or WFS1) holding the wafer which has not yet undergone exposure from coarse movement stage WCS2 to relay stage DRST, and the delivery from relay stage DRST to coarse movement stage WCS1 are performed, by making fine movement stage WFS2 (or WFS1) perform a slide movement along an upper surface (a surface (a first surface) parallel to the XY plane including the pair of stator sections 93$a$ and 93$b$) of coarse movement stage WCS2, relay stage DRST, and coarse movement stage WCS1. Further, the delivery of fine movement stage WFS1 (or WFS2) holding the wafer which has been exposed from coarse movement stage WCS1 to relay stage DRST, and the delivery from relay stage DRST to coarse movement stage WCS1 are performed, by making fine movement stage WFS1 (or WFS2) move within the space inside coarse movement stage WCS1, relay stage DRST, and coarse movement stage WCS2, which are positioned on the −Z side of the first surface. Accordingly, the delivery of the wafer between coarse movement stage WCS1 and relay stage DRST, and coarse movement stage WCS2 and relay stage DRST, can be realized by suppressing an increase in the footprint of the apparatus as much as possible.

Further, in the embodiment above, although relay stage DRST is configured movable within the XY plane, as is obvious from the description on the series of parallel processing operations previously described, in the actual sequence, relay stage DRST remains waiting at the waiting position previously described. On this point as well, an increase in the footprint of the apparatus is suppressed.

Further, according to exposure apparatus 100 of the embodiment, when the first section WCS1$a$ and the second section WCS1$b$ of coarse movement stage WCS1 are each driven by main controller 20 via coarse movement stage drive system 51A, and the first section WCS1$a$ and the second section WCS1$b$ are separated, fine movement stage WFS1 (or WFS2) held by coarse movement stage WCS1 before the separation can easily be detached from coarse movement stage WCS1, while still holding wafer W which has been exposed. That is, wafer W can be detached easily from coarse movement stage WCS1, integrally with fine movement stage WFS1.

In this case, in the embodiment, because coarse movement stage WCS1 is separated into the first section WCS1a and the second section WCS1b and fine movement stage WFS1 (or WFS2) holding wafer W which has been exposed is easily detached from coarse movement stage WCS1, after moving fine movement stage WFS1 (or WFS2) integrally with coarse movement stage WCS1 in a direction (the +Y direction) from a fixed end to a free end of measurement arm 71A which is supported in a cantilevered state with the tip inside the space within coarse movement stage WCS1, fine movement stage WFS1 (or WFS2) holding wafer W which has been exposed can be detached from coarse movement stage WCS1 without measurement arm 71A interfering the detachment.

Further, after fine movement stage WFS1 (or WFS2) holding wafer W which has been exposed is detached from coarse movement stage WCS1, coarse movement stage WCS1 is made to hold another fine movement stage WFS2 (or WFS1) which holds wafer W which has not yet undergone exposure. Accordingly, it becomes possible to detach fine movement stage WFS1 (or WFS2) holding wafer W which has been exposed from coarse movement stage WCS1, or to make coarse movement stage WCS1 hold another fine movement stage WFS2 (or WFS1) holding wafer W which has not yet undergone exposure, in a state each holding wafer W.

Further, main controller 20 drives carrier member 48 via carrier member drive system 54, and fine movement stage WFS1 (or WFS2), which still holds wafer W which has been exposed and has been detached from coarse movement stage WCS1, is housed in the space inside of relay stage DRST.

Further, main controller 20 drives carrier member 48 via carrier member drive system 54 so that the position of fine movement stage WFS1 (or WFS2) holding wafer W which has been exposed is set to a predetermined height, in a state where the first section of WCS2a and the second section WCS2b of coarse movement stage WCS2 are separated via coarse movement stage drive system 51B. And, by the first section of WCS2a being integrated with the second section WCS2b of coarse movement stage WCS2 via coarse movement stage drive system 51B by main controller 20, fine movement stage WFS1 (or WFS2) holding wafer W which has been exposed can be delivered from relay stage DRST to coarse movement stage WCS2.

Furthermore, main controller 20 moves and mounts fine movement stage WFS2 (or WFS1) holding wafer W which has not yet undergone exposure from coarse movement stage WCS2 to relay stage DRST, via fine movement stage drive systems 52B and 52C, and then further from relay stage DRST to coarse movement stage WCS1, via fine movement stage drive systems 52C and 52A.

Therefore, according to exposure apparatus 100 of the embodiment, wafer W can be delivered between the three, which are coarse movement stage WCS1, relay stage DRST, and coarse movement stage WCS2, integrally with fine movement stage WFS1 or WFS2, even if the size of wafer W increases, without any problems in particular.

Further, when fine movement stage WFS1 (or WFS2) holds liquid Lq between tip lens 191 (projection optical system PL), movable blade BL moves into a scrum state where movable blade BL is in contact or in proximity via a clearance of around 300 µm with fine movement stage WFS1 (or WFS2) in the Y-axis direction, and moves along in the Y-axis direction with fine movement stage WFS1 (or WFS2) while maintaining the scrum state from the fixed end side to the free end side of measurement arm 71A, and then holds liquid Lq with tip lens 191 (projection optical system PL) after this movement. Therefore, it becomes possible to deliver liquid Lq (the liquid immersion space formed by liquid Lq) held with tip lens 191 (projection optical system PL) from fine movement stage WFS1 (or WFS2) to movable blade BL, without measurement arm 71A disturbing the delivery.

Further, according to exposure apparatus 100 of the embodiment, because fine movement stage WFS1 (or WFS2) can be driven with good precision, it becomes possible to drive wafer W mounted on this fine movement stage WFS1 (or WFS2) in synchronization with reticle stage RST (reticle R) with good precision, and to transfer a pattern of reticle R onto wafer W by scanning exposure. Further, in exposure apparatus 100 of the embodiment, because wafer exchange, alignment measurement and the like of wafer W on fine movement stage WFS2 (or WFS1) can be performed in measurement station 300, concurrently with the exposure operation performed on wafer W mounted on fine movement stage WFS2 (or WFS2) in exposure station 200, throughput can be improved when compared with the case where each processing of wafer exchange, alignment measurement, and exposure is sequentially performed.

Incidentally, in the embodiment above, fine movement stage WFS1 holding wafer W which has been exposed was delivered first to carrier member 48 of relay stage DRST, and then fine movement stage WFS2 held by relay stage DRST was slid afterwards to be held by coarse movement stage WCS1, using FIGS. 25A to 25C. However, besides this, fine movement stage WFS2 can be delivered to carrier member 48 of relay stage DRST first, and then fine movement stage WFS1 held by coarse movement stage WCS1 can be slid afterwards to be held by relay stage DRST.

Further, in the embodiment above, while the gap (clearance) between relay stage DRST and coarse movement stages WCS1 and WCS2 was set to around 300 µm in the case of making coarse movement stages WCS1 and WCS2 proximal to relay stage DRST, respectively to replace fine movement stages WFS1 and WFS2, this gap does not necessarily have to be set small as in the case, for example, such as when blade BL and fine movement stage WFS1 are driven in proximity. In this case, relay stage DRST and coarse movement stage can be distanced within a range where fine movement stage is not tilted greatly (that is, the stator and the mover of the linear motor do not come into contact) at the time of movement of the fine movement stage between relay stage DRST and the coarse movement stage. In other words, the gap between relay stage DRST and coarse movement stages WCS2 and WCS2 is not limited to around 300 µm and can be made extremely large.

Incidentally, in exposure apparatus 100 of the embodiment, fine movement stages WFS1 and WFS2 holding wafer W are supported by coarse movement stage WCS2 at measurement station 300 at the time of wafer alignment, while at the time of exposure, fine movement stages WFS1 and WFS2 are supported by coarse movement stage WCS1 at exposure station 200. Because of this, it is conceivable that deflection of fine movement stages WFS1 and WFS2 (and wafer W which is held) caused by its own weight and the like differs at the time of exposure and at the time of wafer alignment. Taking such a case into consideration, a difference between deflection of fine movement stages WFS1 and WFS2 in a state supported by coarse movement stage WCS1 and deflection of fine movement stages WFS1 and WFS2 in a state supported by coarse movement stage WCS2 can be obtained in advance, and deviation of X, Y values of wafer W that occur due to the difference can be obtained in advance as offset information used to correct detection error of alignment marks caused due to the deflection.

Or, in order to unify the degree of deflection of fine movement stages WFS1 and WFS2, that is to say, to unify the surface position of wafer W when supported by coarse movement stages WCS1 and WCS2, and furthermore, to avoid detection errors (and focus errors and the like on exposure) of the alignment marks that accompany the deflection, fine movement stage WFS2 (WFS1) can be bent in the +Z direction (in a convex shape) or in the −X direction (a concave shape), as shown in FIG. 10.

However, in the embodiment, in both exposure station 200 and measurement station 300, the position in the XY plane of fine movement stages WFS1 and WFS2 is measured by an encoder system using grating RG placed on fine movement stages WFS1 and WFS2, and further, when fine movement stages WFS1 and WFS2 are deflected, grating RG is also similarly deflected. Therefore, even if the degree of deflection of fine movement stages WFS1 and WFS2 is actually different at the time of exposure and at the time of alignment, this does not have any substantial impact. Especially, in the case when a wafer alignment (EGA) is performed where all of the shot areas of wafer W serve as a sample shot area, no problems occur in particular even if the degree of deflection of fine movement stages WFS1 and WFS2 is different at the time of exposure and at the time of alignment. In the case of performing the wafer alignment (EGA) where all of the shot areas of wafer W serve as a sample shot area using only primary alignment system AL1, the degree of deflection of fine movement stages WFS1 and WFS2 does not have to be considered.

Incidentally, in the embodiment above, while the case has been described where the apparatus is equipped with relay stage DRST, in addition to coarse movement stages WCS1 and WCS2, relay stage DRST does not necessarily have to be provided as it will be described in a second embodiment that follows. In this case, for example, the fine movement stage can be delivered between coarse movement stage WCS2 and coarse movement stage WCS1 directly, or, for example, the fine movement stage can be delivered to coarse movement stages WCS1 and WCS2, using a robot arm and the like. In the former case, for example, a carrier mechanism, which delivers the fine movement stage to coarse movement stage WCS1 and then receives the fine movement stage and delivers the fine movement stage to an external carrier system (not shown) from coarse movement stage WCS1, can be provided in coarse movement stage WCS2. In the latter case, the fine movement stage which one of the coarse movement stage WCS1 and WCS2 supports is delivered to a support device, while the fine movement stage which the other coarse movement stage supports is delivered to the one coarse movement stage directly, and then finally, the fine movement stage supported by the support device is delivered to the other coarse movement stage. In this case, as a support device, besides a robot arm, a vertically movable table can be used, which fits inside of base board 12 at normal times so as not to project out from the floor surface, and moves upward to support the fine movement stage when coarse movement stages WCS1 and WCS2 are separated into two sections, and then moves downward while still supporting the fine movement stage. Alternatively, in the case a narrow notch is formed in the Y-axis direction in coarse movement slider section 91 of coarse movement stages WCS1 and WCS2, a table whose shaft section protrudes from the floor surface and is vertically movable can be used. In any case, the support device can have any structure as long as the section supporting the fine movement stage is movable at least in one direction, and does not interfere when the fine movement stage is delivered directly between coarse movement stages WCS1 and WCS2 in a state supporting the fine movement stage. In any case, when the relay stage is not arranged, this allows the footprint of the apparatus to be reduced.

A Second Embodiment

Hereinafter, a second embodiment of the present invention will be described, with reference to FIGS. 26 to 45. Here, the same reference numerals will be used for the same or similar sections as in the first embodiment previously described, and a detailed description thereabout will be simplified or omitted.

Figure 26:
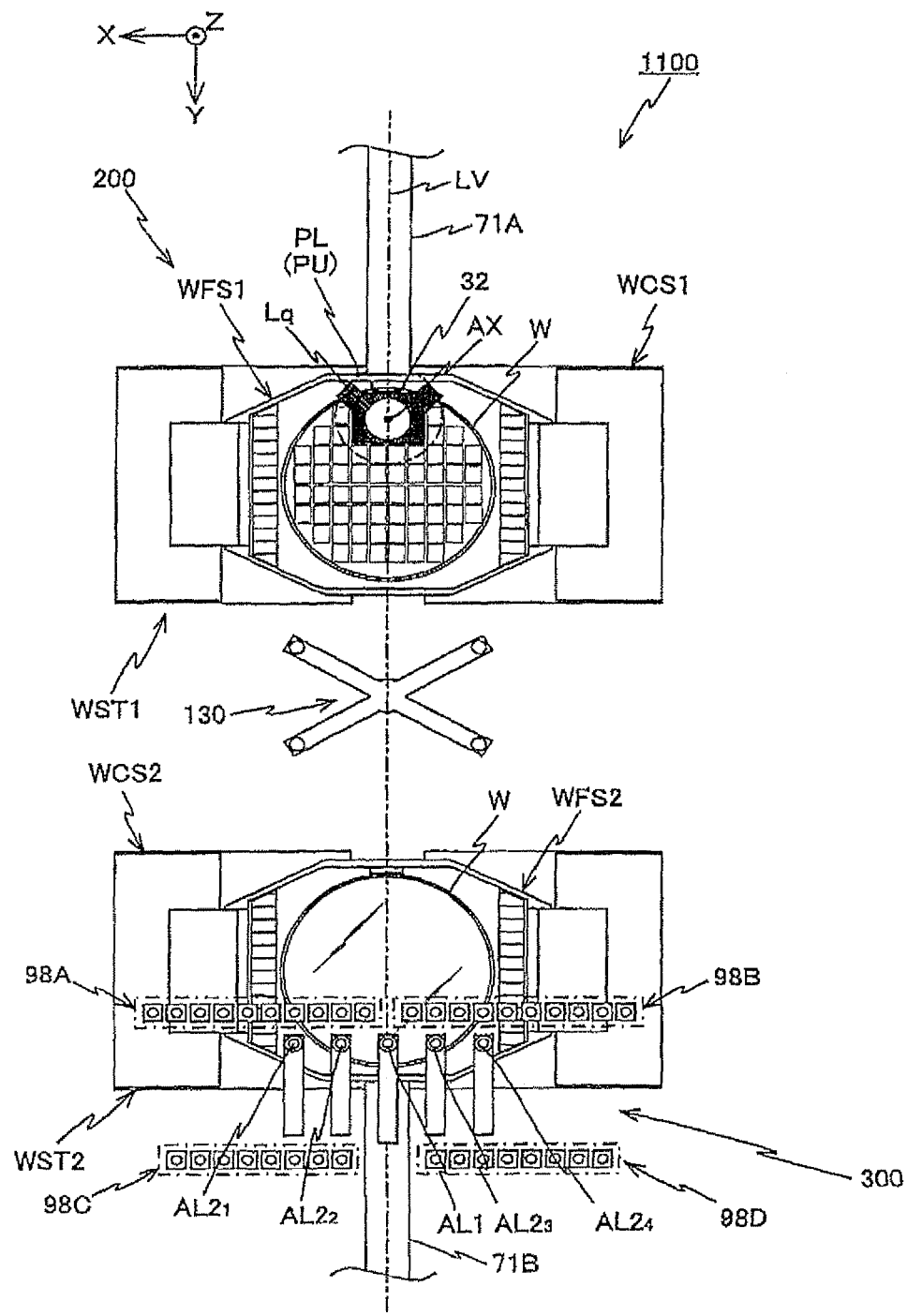
FIG. 26 is a planar view showing a schematic configuration of the exposure apparatus of the second embodiment.
Figure 27:
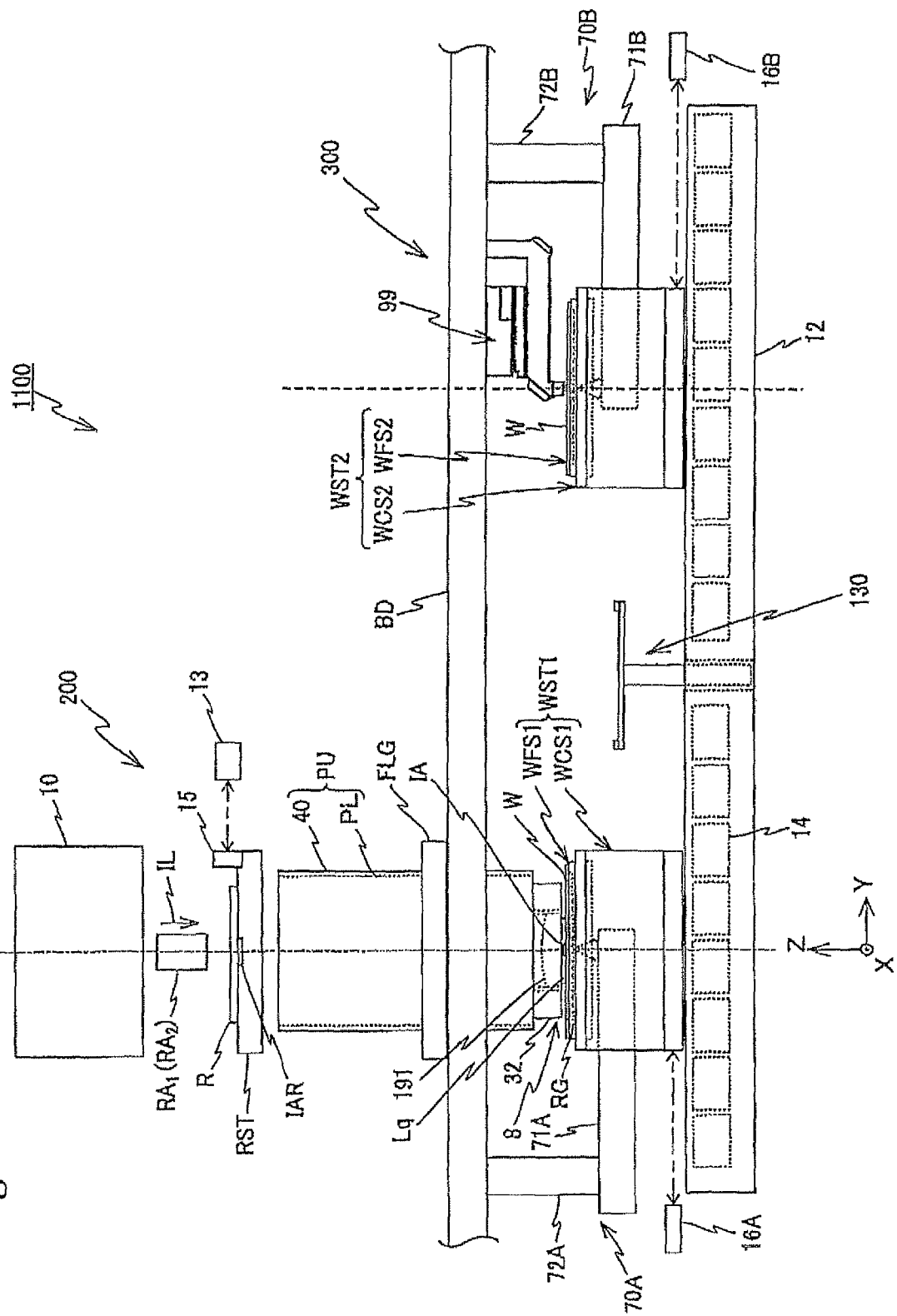
FIG. 27 schematically shows a side view of the exposure apparatus in FIG. 26.
Figure 29A:
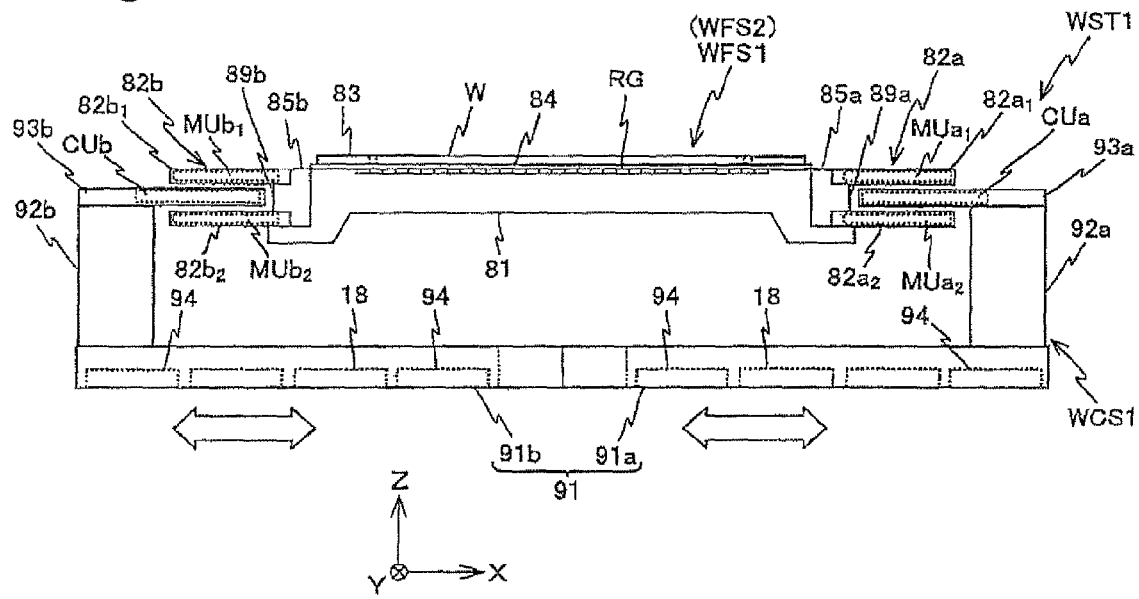
FIG. 29A is a view (front view) of a wafer stage which the exposure apparatus in FIG. 27 is equipped with when viewed from a −Y direction.
Figure 29B:
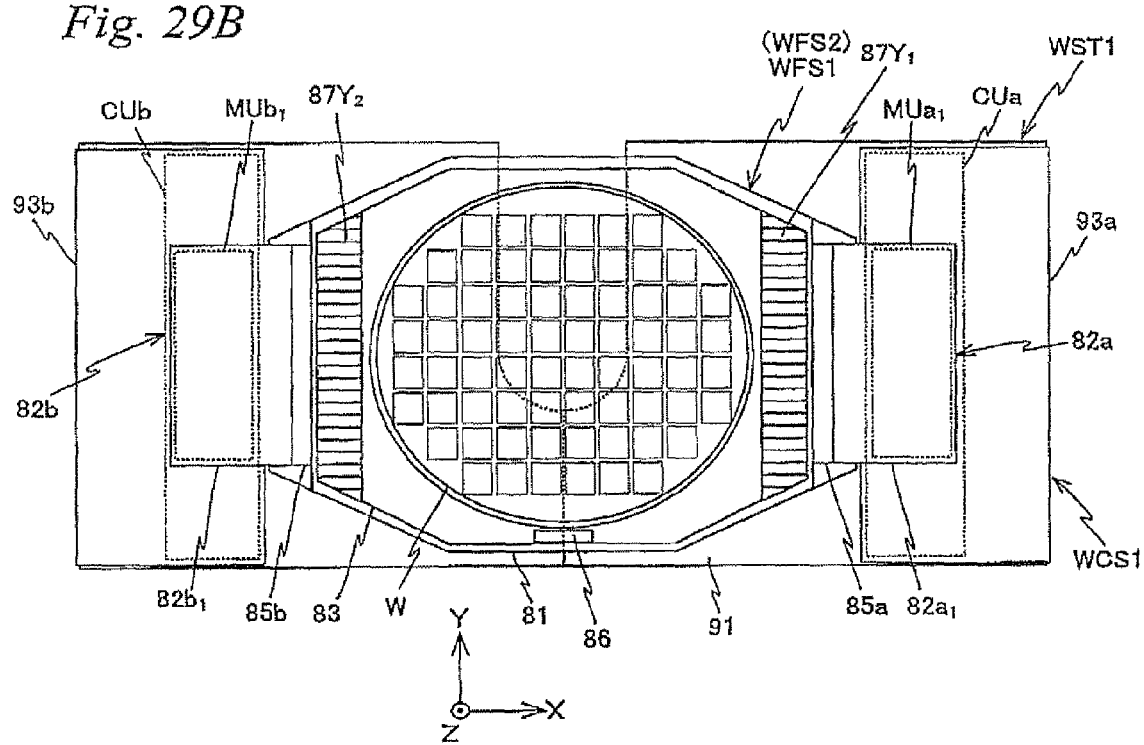
FIG. 29B is the wafer stage shown in a planar view.
Figure 30A:
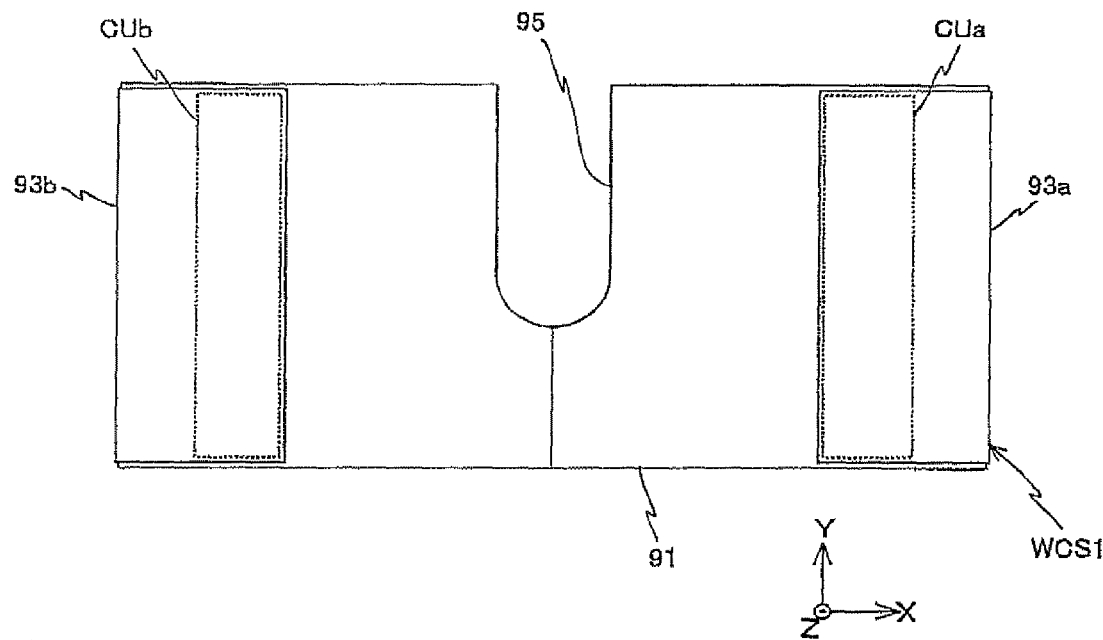
FIG. 30A is an extracted planar view of the coarse movement stage.
Figure 30B:
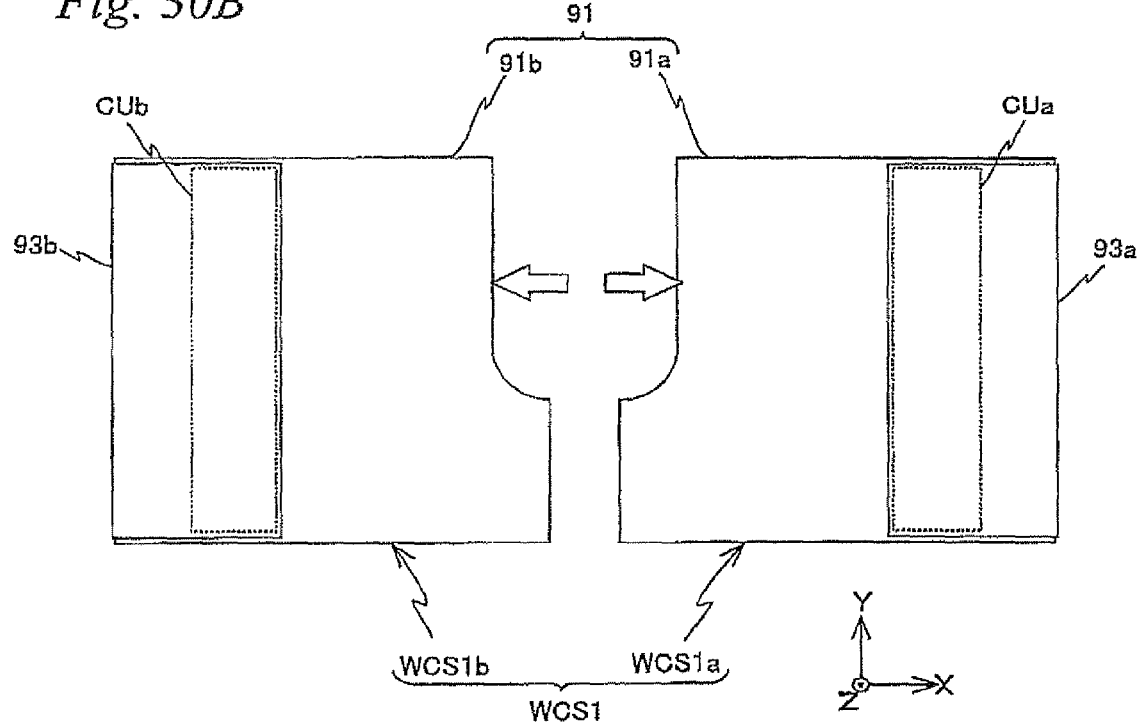
FIG. 30B is a planar view showing a state where the coarse movement stage is separated into two sections.

FIG. 26 shows a schematic configuration of exposure apparatus 1100 of the second embodiment in a planar view, and FIG. 27 schematically shows a side view of exposure apparatus 1100 in FIG. 26. Further, FIG. 29A shows a side view of a wafer stage which exposure apparatus 1100 is equipped with when viewed from the −Y direction, and FIG. 29B shows a planar view of the wafer stage. Further, FIG. 30A, shows an extracted planar view of a coarse movement stage, and FIG. 30B is a planar view in a state where the coarse movement stage is separated into two sections.

Exposure apparatus 1100 is a projection exposure apparatus by the step-and-scan method, or a so-called scanner.

As shown in FIGS. 26 and 27, exposure apparatus 1100 is equipped with a center table 130 placed on base board 12 between measurement station 300 and exposure station 200, instead of the relay stage previously described. Further, in exposure apparatus 1100, corresponding to center table 130 which has been provided, a notch 95 having a U-shape is formed in coarse movement slider section 91 of coarse movement stages WCS1 and WCS2 (refer to FIG. 30A).

In exposure apparatus 1100, in addition to fine movement stage position measurement systems 70A and 70B, a fine movement stage position measurement system 70C (refer to FIG. 32) which measures at least a σz rotation of fine movement stage WFS1 (or WFS2) is provided.

In exposure apparatus 1100, the configuration for other sections is the same as exposure apparatus 100 of the first embodiment previously described. In the following description, from a viewpoint of avoiding repetition, the description will focus mainly on the difference with exposure apparatus 100.

Figure 28:
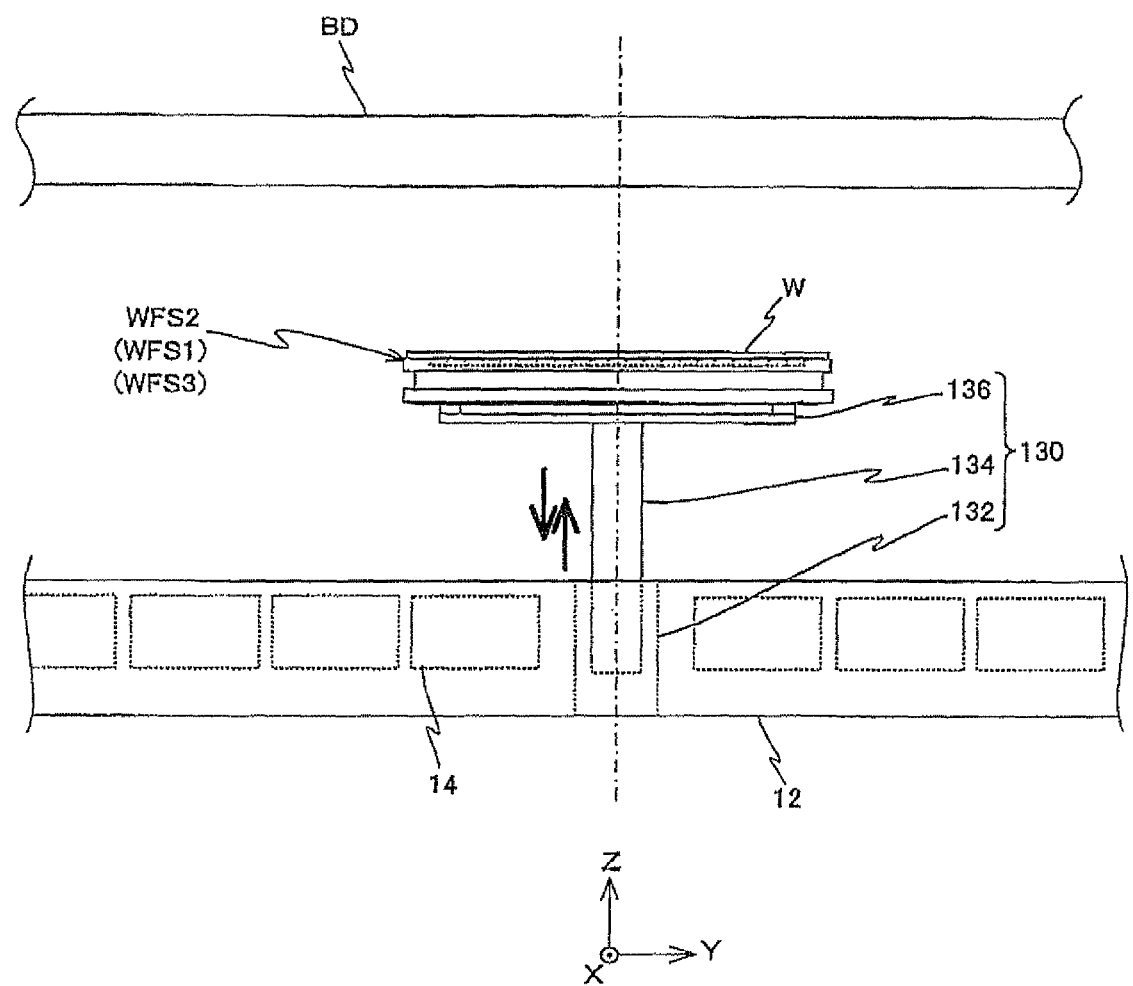
FIG. 28 is an enlarged view showing a state where a fine movement stage is mounted on the center table in FIG. 27.

As shown in FIG. 26, center table 130 is placed at a position between measurement station 300 and exposure station 200, with the center of the table substantially coinciding on reference axis LV previously described. As shown in FIG. 28, center table 130 is equipped with a drive device 132 placed inside of base board 12, a shaft 134 which is vertically driven by drive device 132, and a table main body 136 which has an X-shape in a planar view and is fixed to the upper end of shaft 134. Drive device 132 of center table 130 is controlled by main controller 20 (refer to FIG. 32).

As is shown in FIG. 30A which representatively shows coarse movement stage WCS1, coarse movement stages WCS1 and WCS2 which are equipped in exposure apparatus 1100 have a U-shaped notch 95, which is larger than the diameter of drive shaft 134 previously described, formed on one side (the +Y side) of the Y-axis direction in the center of a longitudinal direction (the X-axis direction) of coarse movement slider section 91.

The first section WCS1a and the second section WCS1b are normally locked integrally, via a lock mechanism (not shown). More specifically, the first section WCS1a and the second section WCS1b normally operate integrally. And, coarse movement stage WCS1, which consists of the first section WCS1a and the second section WCS1b that are integrally formed, is driven by coarse movement stage drive system 51A including coarse movement stage drive systems 51Aa and 51Ab (refer to FIG. 32).

Coarse movement stage WCS2 is also configured separable into two sections, which are a first section WCS2a and a second section WCS2b, similar to coarse movement stage WSC1, and is driven (refer to FIG. 32) by a coarse movement stage drive system 51B, which is configured similar to coarse movement stage drive system 51A. Incidentally, coarse movement stage WCS2 is placed on base board 12 in a direction opposite to coarse movement stage WCS2, or more specifically, in a direction where an opening of notch 95 of coarse movement slider section 91 faces the other side (the −Y side) of the Y-axis direction.

As shown in FIG. 26, fine movement stage position measurement system 70C is configured including head units 98A to 98D provided in measurement station 300. Head units 98A to 98D are placed around alignment systems AL1, and $AL2_1$ to $AL2_4$ (aligner 99), and are fixed in a suspended state to main frame BD, via a support member (not shown).

Figure 31:
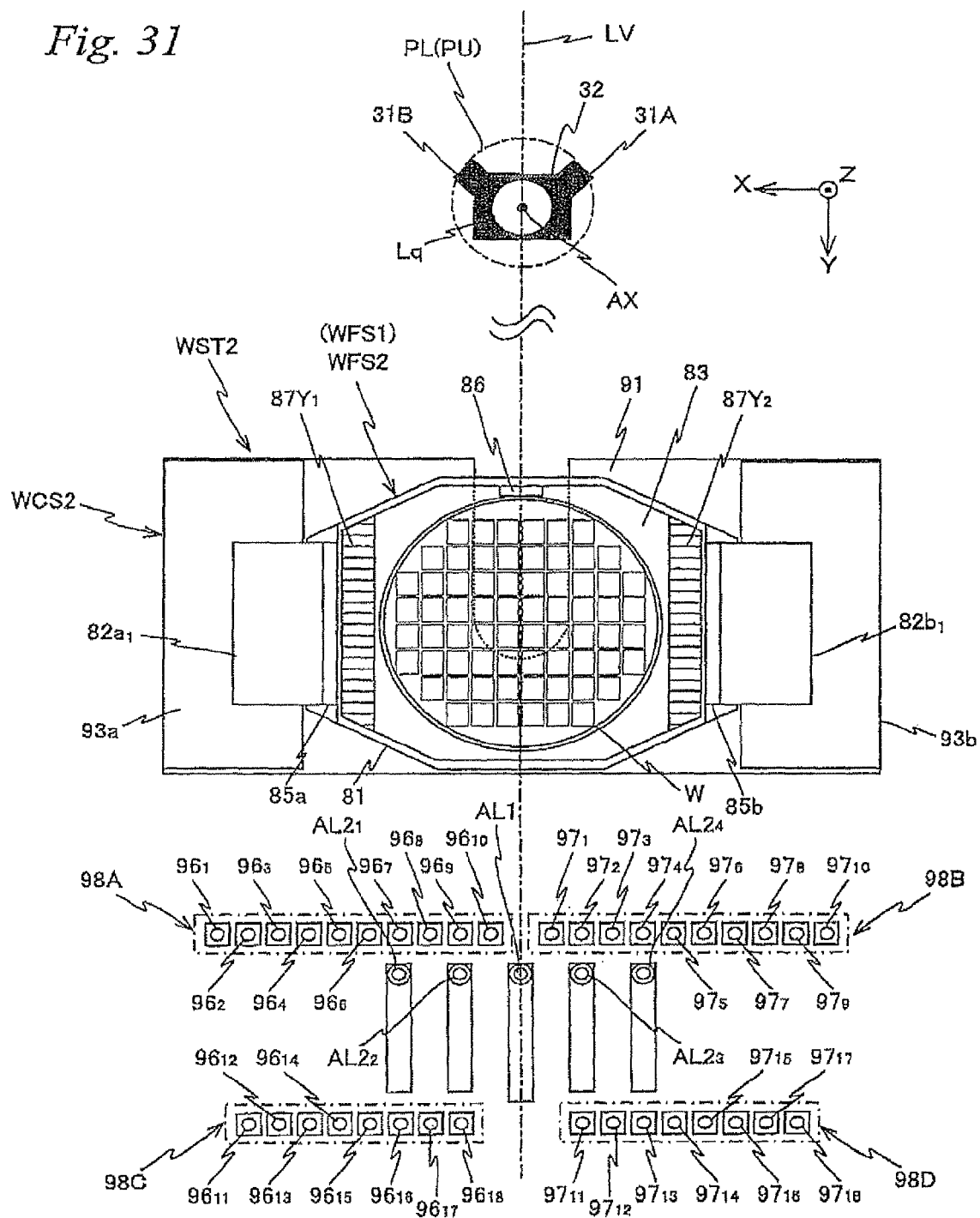

As shown enlarged in FIG. 31, head units 98A and 98B have a plurality of (ten, in this case) encoder heads (Y heads) $96_k$ and $97_k$ (k=1 to 10), respectively, whose measurement direction is in the Y-axis direction and are arranged equally spaced in the X-axis direction on the −Y side of alignment systems $AL2_1$ and $AL2_2$, and $AL2_3$ and $AL2_4$. Head unit 98C and 98D have a plurality of (eight, in this case) Y heads $96_k$ and $97_k$ (k=11 to 18), respectively, which are arranged equally spaced in the X-axis direction on the +Y side of alignment systems $AL2_1$ and $AL2_2$, and $AL2_3$ and $AL2_4$. In the following description, Y heads $96_k$ and $97_k$ will also be expressed as Y heads 96 and 97 when necessary. The placement of Y heads 96 and 97 will be described later on.

As shown in FIG. 29B, in an area on one side and the other side in the X-axis direction (the lateral direction of the page surface in FIG. 29B) on the upper surface of plate 83, Y scales $87Y_1$ and $87Y_2$ which are subject to measurement by Y heads 96 and 97 are fixed, respectively. Y scales $87Y_1$ and $87Y_2$ are each composed of a reflective grating (for example, a one-dimensional diffraction grating) having a periodic direction in the Y-axis direction in which grid lines whose longitudinal direction is in the X-axis direction are arranged in a predetermined pitch along the Y-axis direction.

Y scales $87Y_1$ and $87Y_2$ are made, with graduations of the diffraction grating marked, for example, at a pitch of 1 μm, on a thin plate shaped glass. Incidentally, in FIG. 29B, the pitch of the grating is shown much wider than the actual pitch, for the sake of convenience. The same is true also in other drawings. Incidentally, the type of diffraction gratings used for Y scales $87Y_1$ and $87Y_2$ are not limited to the diffraction grating made up of grooves or the like that are mechanically formed, and for example, can also be a grating that is created by exposing interference fringe on a photosensitive resin. Further, in order to protect the diffraction grating, the diffraction grating can be covered with a glass plate with low thermal expansion that has water repellency so that the surface of the glass plate becomes the same height (surface position) as the surface of the wafer.

Y heads 96 and 97 are placed so as to satisfy conditions a to c described below.

a. When fine movement stage WFS1 (or WFS2) moves under aligner 99 at the time of wafer alignment and the like, one head each of Y heads 96 and 97 constantly face Y scales $87Y_1$ and $87Y_2$ on each fine movement stage WFS1 (or WFS2), respectively.

b. In the case when fine movement stage WFS1 (or WFS2) moves in the X-axis direction under aligner 99 and is at a position where a linkage process (a processing to secure the continuity of position measurement information) should be performed between two Y heads 96 and 97 which are adjacent, each of the two Y heads which are adjacent simultaneously face Y scales $87Y_1$ and $87Y_2$. In other words, the array distance in the X-axis direction of Y heads 96 and 97 is shorter (smaller) than the width (the length of the grid line) of Y scales $87Y_1$ and $87Y_2$ in the X-axis direction.

c. In the case when fine movement stage WFS1 (or WFS2) moves in the Y-axis direction under aligner 99 and is at a position where a linkage process should be performed between Y heads $96_1$ to $96_{10}$ and $96_{11}$ to $96_{18}$ (between head units 98A and 98C), one Y head each belonging to head units 98A and 98C simultaneously face Y scale $87Y_1$. Similarly, when fine movement stage WFS1 (or WFS2) is at a position where a linkage process should be performed between Y heads $97_1$ to $97_{10}$ and $97_{11}$ to $97_{18}$ (between head units 98B and 98D), one Y head each belonging to head units 98B and 98D simultaneously face Y scale $87Y_2$. In other words, the separation distance in the Y-axis direction of head units 98A and 98C and the separation distance in the Y-axis direction of head units 98B and 98D are longer than the length of Y scales $87Y_1$ and $87Y_2$ in the Y-axis direction, respectively.

Incidentally, heads 96 and 97 are placed at a position around several mm above the upper surface of Y scales $87Y_1$ and $87Y_2$.

Each of the Y heads 96 irradiate a measurement beam on Y scale $87Y_1$ from above (the +Z side), receive a diffraction light generated from Y scale $87Y_1$ (diffraction grating), and measure a Y position of Y scale $87Y_1$ (in other words, the +X end of fine movement stage WFS1 (or WFS2)). Similarly, each of the Y heads 97 irradiate a measurement beam on Y scale $87Y_2$ from above (the +Z side), receive a diffraction light generated from Y scale $87Y_2$ (diffraction grating), and measure a Y position of Y scale $87Y_2$ (in other words, the −X end of fine movement stage WFS1 (or WFS2)).

When fine movement stage WFS1 (or WFS2) moves under aligner 99 as is previously described, at least one head each of Y heads 96 and 97 belonging to head units 98A and 98C, and 98B and 98D, face Y scales $87Y_1$ and $87Y_2$, respectively. Accordingly, the θz rotation (and the Y position) of fine movement stage WFS1 (or WFS2) is measured by head units 98A and 98C, and 98B and 98D. In this case, Y scale $87Y_1$ and scale $87Y_2$ are sufficiently distanced in a direction (the X-axis direction) perpendicular to the periodic direction (the Y-axis direction) of the diffraction grating. Accordingly, fine movement stage position measurement system 70C can measure the θz rotation (a position in the θz direction) of fine movement stage WFS1 (or WFS2) with high accuracy.

The information (positional information) measured by fine movement stage position measurement system 70C is supplied to main controller 20, along with information (positional information) and the like measured by fine movement stage position measurement system 70B previously described. Main controller 20 can drive (position control) fine movement stage WFS1 (or WFS2) (wafer stage WST2) within the XY plane based on positional information from fine movement stage position measurement system 70B, while controlling the rotation of fine movement stage WFS1 (or WFS2) (wafer stage WST2) inside measurement station 300 of aligner 99 and its neighboring area, based on positional information from fine movement stage position measurement system 70C.

Figure 32:
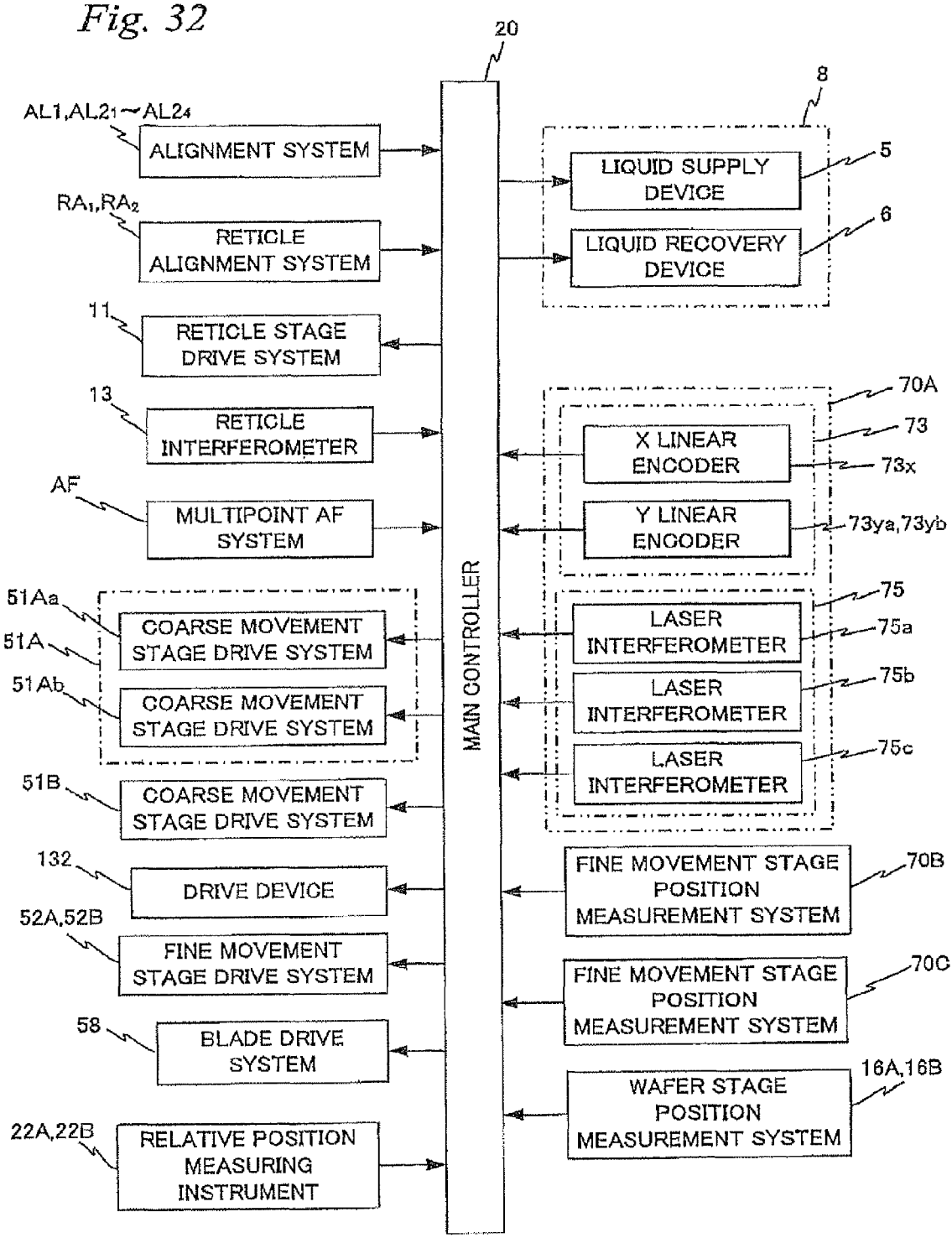
FIG. 32 is a block diagram used to explain an input/output relation of a main controller equipped in the exposure apparatus of the second embodiment (the exposure apparatus in FIG. 26)

FIG. 32 shows a block diagram showing an input/output relation of main controller 20, which centrally configures a control system of exposure apparatus 1100 and has overall control over each part. Main controller 20 includes a workstation (or a microcomputer) and the like, and has overall control over each part of exposure apparatus 1100.

In the second embodiment, similar to exposure apparatus 100 of the first embodiment previously described, in parallel with exposure to wafer W on fine movement stage WFS1, wafer exchange, wafer alignment, and the like are performed on the other fine movement stage WFS2. Wafer exchange is performed in a manner similar to exposure apparatus 100 of the first embodiment previously described.

On wafer alignment, main controller 20 selects at least one of the following two modes (each referred to as a precision priority mode and a throughput priority mode), depending on the alignment precision, throughput and the like which is required.

In the case the precision (alignment precision) of the wafer alignment is considered important, the precision priority mode is selected. In the precision priority mode, wafer alignment is performed using only primary alignment system AL1.

Figure 33:
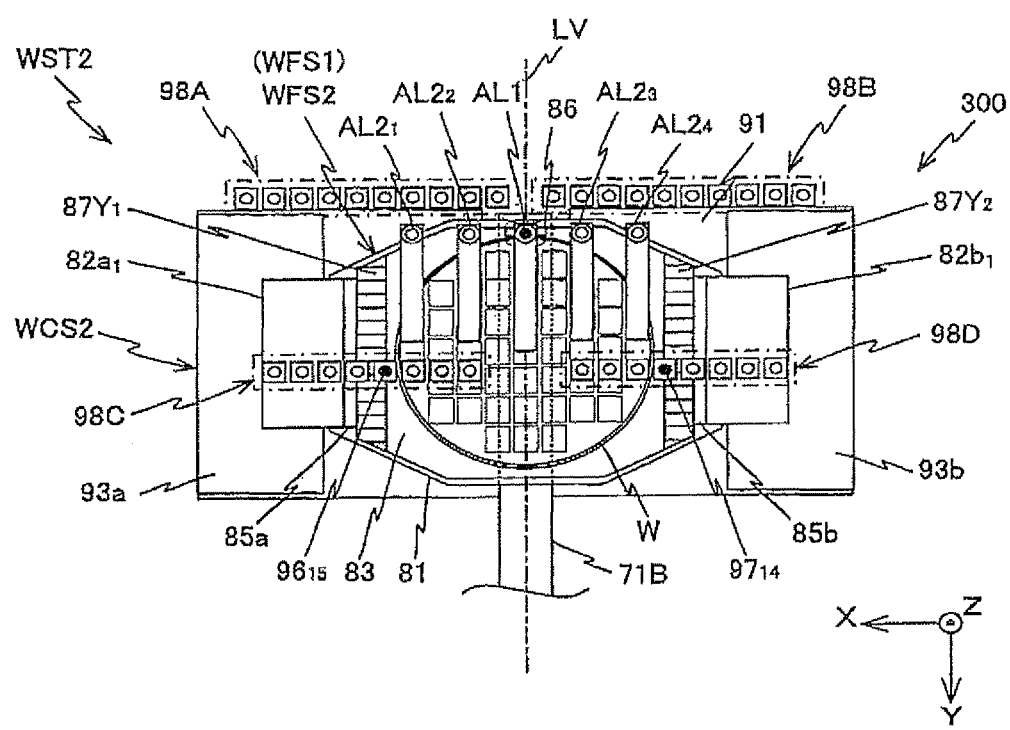
FIG. 33 is a view used to explain procedures of a first wafer alignment (precision priority mode) and a second wafer alignment (throughput priority mode) performed (No. 1) in the exposure apparatus of the second embodiment.

In the following description, a wafer alignment procedure performed in a case of the precision priority mode will be described, to wafer W having 43 shot areas arranged as shown in FIG. 33. Hereinafter, primary alignment system AL1 will be shortly referred to as alignment system AL1, as appropriate.

Main controller 20, first of all, measures the position (the position in directions of all six degrees of freedom) of fine movement stage WFS2 using fine movement stage position measurement systems 70B and 70C as shown in FIG. 33, and drives fine movement stage WFS2 in the XY direction while maintaining the θz rotation (position in the θz direction) in a reference state based on based on the measurement results, and positions measurement plate 86 on fine movement stage WFS2 directly under alignment system AL1. At this point, Y heads $96_{15}$ and $97_{14}$ configuring fine movement stage position measurement system 70C are used to measure the θz rotation of fine movement stage WFS2 (refer to the black circles in FIG. 33). After the positioning, main controller 20 detects the second fiducial mark on measurement plate 86 using alignment system AL1. Then, main controller 20 makes a link between a position coordinate (X, Y) of the second fiducial mark which uses the detection results, or namely, the detection center (the index center) of alignment system AL1 as a reference, and measurement values of fine movement stage position measurement system 70B at the time of the detection of the second fiducial mark, and stores them in memory (not shown). Incidentally, in the description below, explanation on position measurement of wafer stage WST2 (fine movement stage WFS2) using fine movement stage position measurement system 70B will be omitted, expect when especially necessary.

Figure 34A:
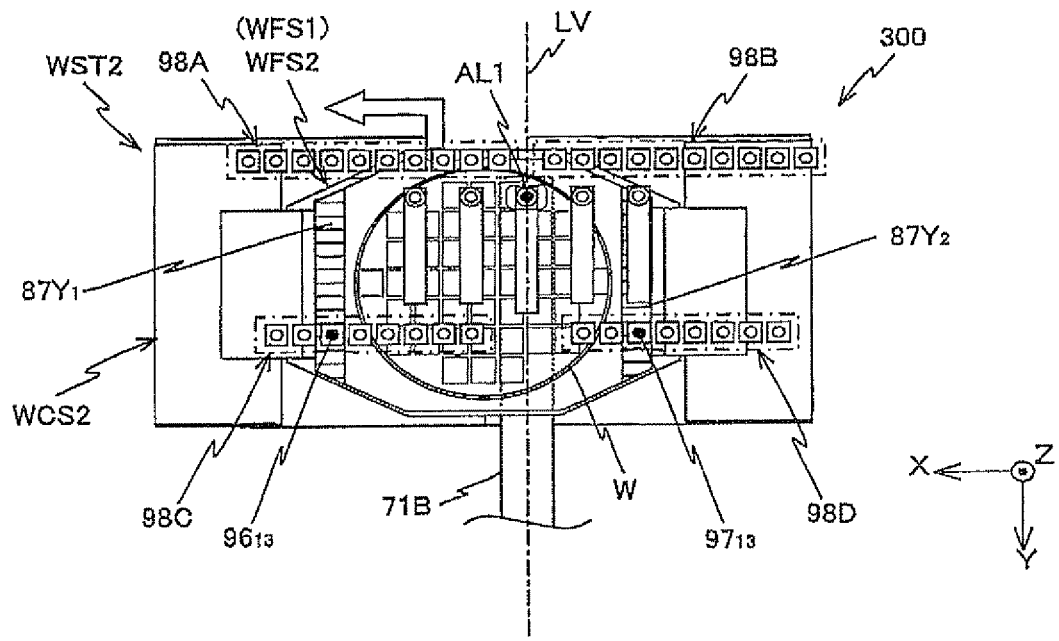
FIGS. 34A and 34B are views used to explain a first wafer alignment procedure performed (No. 2) in the exposure apparatus of the second embodiment.

After having detected the second fiducial mark, main controller 20 steps wafer stage WST2 to a position a predetermined distance in the −Y direction and a predetermined distance in the +X direction as is shown by the outlined arrow in FIG. 34A, and positions one sample mark arranged in the first shot area in the first row on wafer W so that the sample mark is within a detection field of alignment system AL1. Incidentally, the alignment mark is formed on a street (also called a scribe line) dividing the shot areas. In this case, main controller 20 can move wafer stage WST2 linearly to the position shown in FIG. 34A from the position shown in FIG. 33, or can step wafer stage WST2 in the order of the +X direction and then the −Y direction. After the positioning, main controller 20 detects the sample mark using alignment system AL1. At this point, Y heads $96_{13}$ and $97_{13}$ are used to measure the θz rotation of fine movement stage WFS2 (refer to the black circles in FIG. 34A).

Figure 34B:
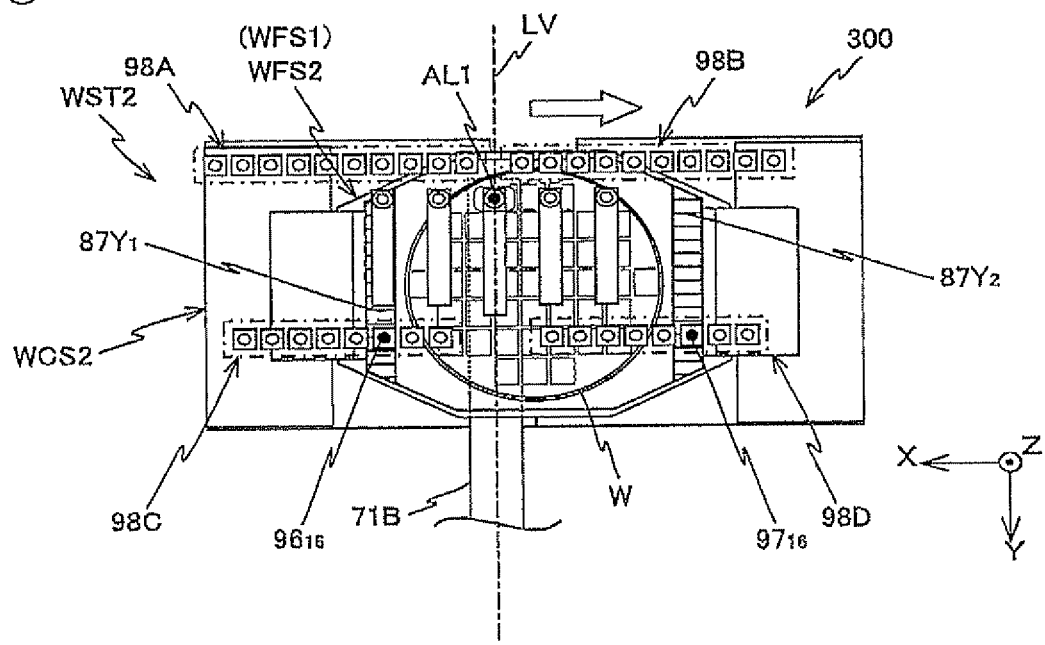

Next, main controller 20 steps wafer stage WST2 in the −X direction as is shown by the outlined arrow in FIG. 34B, and positions one sample mark each arranged in the second and third shot areas in the first row on wafer W sequentially, so that the sample marks are within a detection field of alignment system AL1, and detects the sample mark using alignment system AL1 each time the positioning is performed. In the series of this sample mark detection, Y heads $96_{13}$ to $96_{16}$, and $97_{13}$ to $97_{16}$ are sequentially switched, and are used to measure the θz rotation of fine movement stage WFS2. This completes the detection of the sample marks in the shot areas of the first row.

Figure 35A:
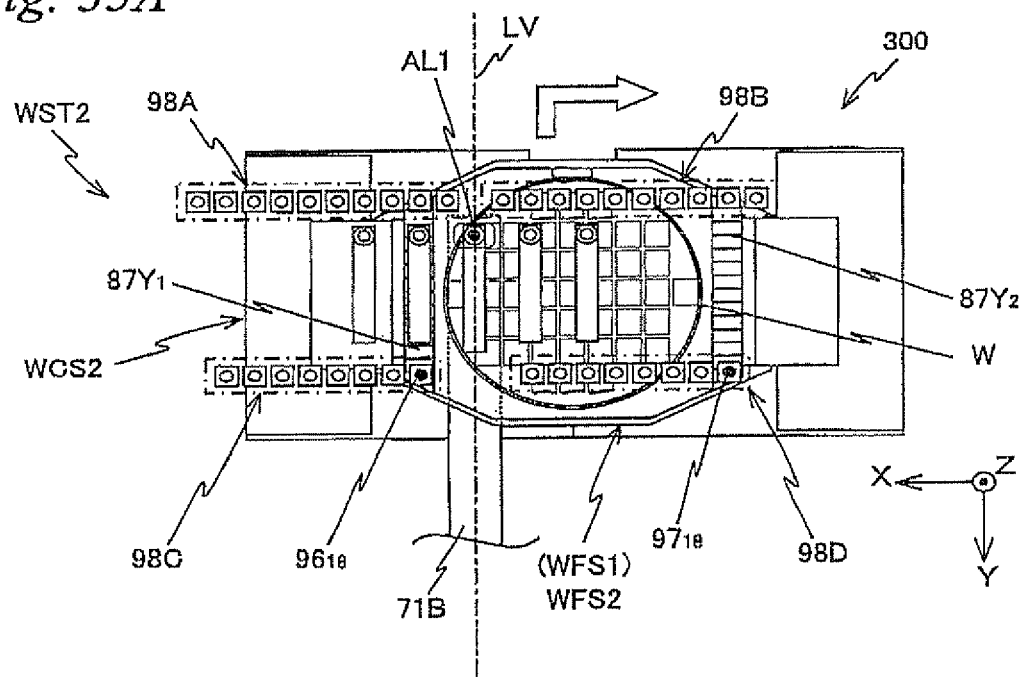
FIGS. 35A and 35B are views used to explain a first wafer alignment procedure performed (No. 3) in the exposure apparatus of the second embodiment.

Next, main controller 20 steps wafer stage WST2 by a predetermined distance in the −Y direction and a predetermined distance in the −X direction as is shown by the outlined arrow in FIG. 35A, and positions one sample mark arranged in the first shot area in the second row on wafer W so that the sample mark is within the detection field of alignment system AL1. After the positioning, main controller 20 detects the sample mark using alignment system AL1. At this point, Y heads $96_{18}$ and $97_{18}$ are used to measure the θz rotation of fine movement stage WFS2 (refer to the black circles in FIG. 35A).

Figure 35B:
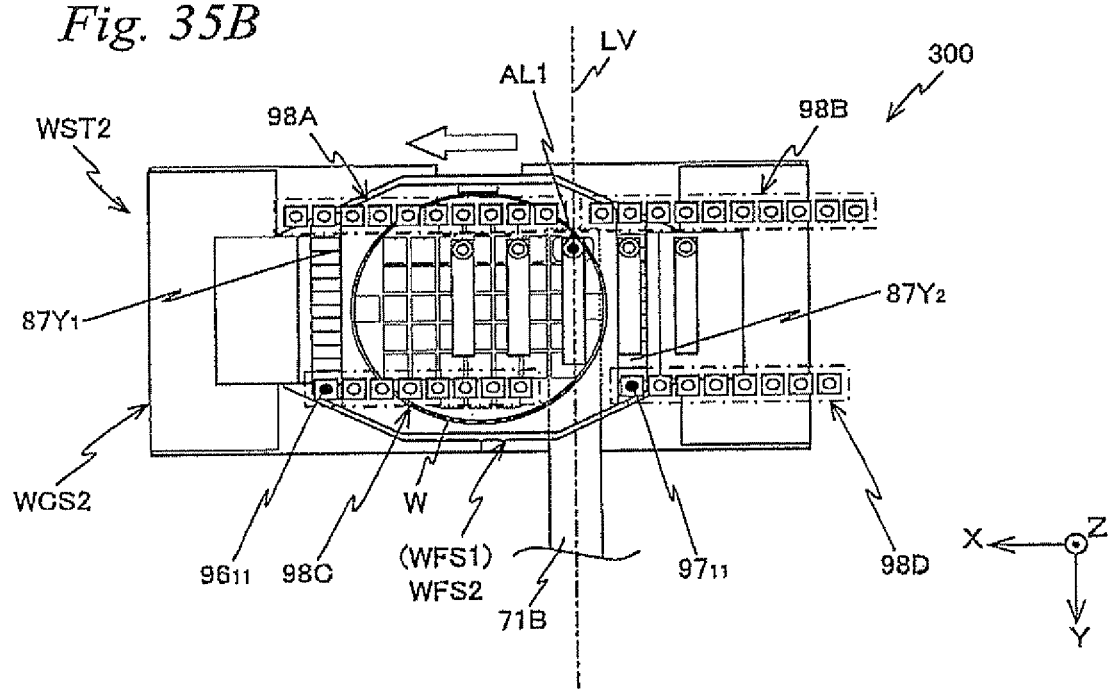

Next, main controller 20 steps wafer stage WST2 in the +X direction as is shown by the outlined arrow in FIG. 35B, and positions one sample mark each arranged in the second to seventh shot areas in the second row on wafer W so that the sample marks are sequentially within the detection field of alignment system AL1. Then, main controller 20 detects the sample mark using alignment system AL1 each time the positioning is performed. In the series of this sample mark detection, Y heads $96_{18}$ to $96_{11}$, and $97_{18}$ to $97_{11}$ are sequentially switched, and are used to measure the θz rotation of fine movement stage WFS2. This completes the detection of the sample marks in the shot areas of the second row.

Next, main controller 20 performs detection of the sample marks in the shot areas of the third row, in a procedure similar to the detection of the sample marks in the shot areas of the second row. However, the direction of the stepping drive of wafer stage WST2 will be reversed. Further, by driving wafer stage WST2 in the −Y direction prior to the mark detection, the Y heads to be used (head units) will b switched from Y heads $96_{11}$ to $96_{18}$ to $96_1$ to $96_{10}$ (from head units 98C to 98A). Similarly, the Y heads to be used (head units) will b switched from Y heads $97_{11}$ to $97_{18}$ to $97_1$ to $97_{10}$ (from head units 98D to 98B).

Figure 36A:
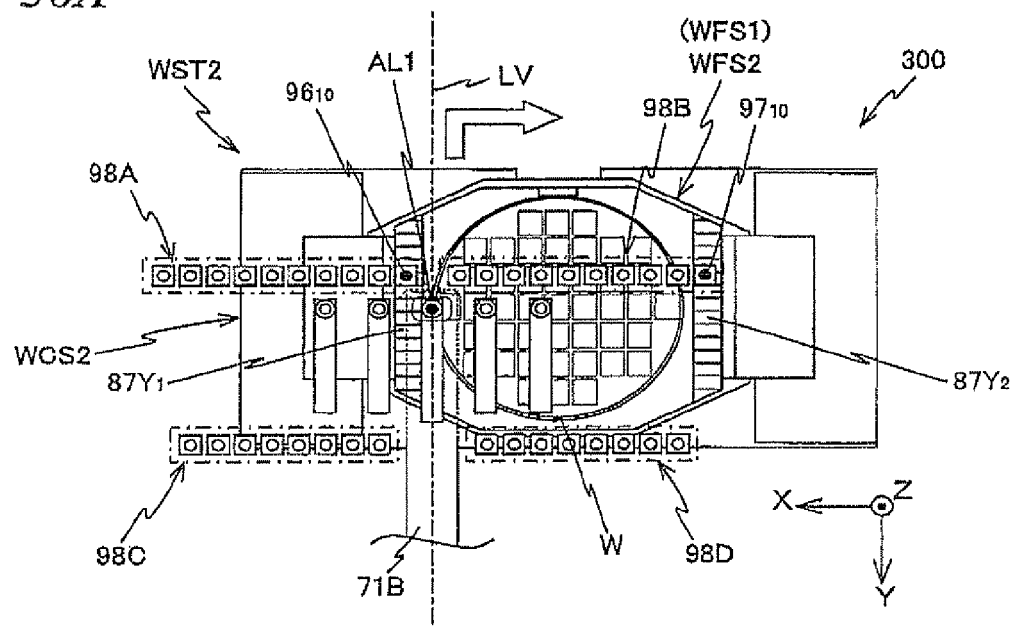
FIGS. 36A and 36B are views used to explain a first wafer alignment procedure performed (No. 4) in the exposure apparatus of the second embodiment.

And, when the detection of the sample marks in the shot areas of the third row is completed, main controller 20 steps wafer stage WST2 from the position set at that point in time by a predetermined distance in the −Y direction and a predetermined distance in the +X direction as is shown by the outlined arrow in FIG. 36A, and positions one sample mark arranged in the first shot area in the fourth row on wafer W so that the sample mark is within the detection field of alignment system AL1. After the positioning, main controller 20 detects the sample mark using alignment system AL1. At this point, Y heads 9610 and 9710 are used to measure the θz rotation of fine movement stage WFS2 (refer to the black circles in FIG. 36A).

Figure 36B:
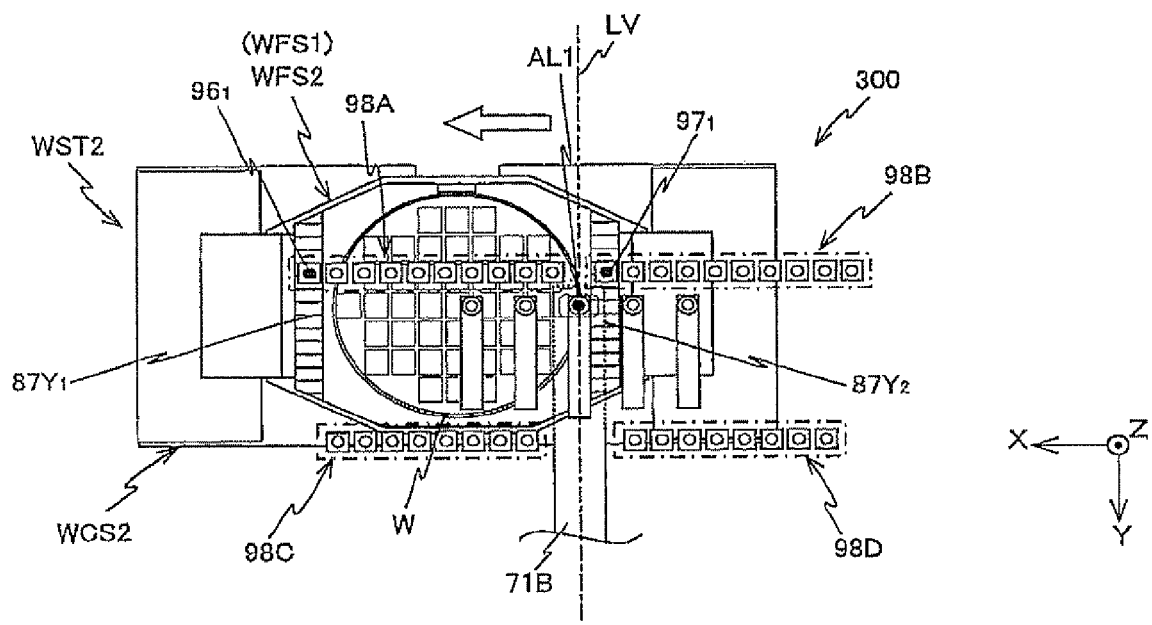

Next, main controller 20 steps wafer stage WST2 in the +X direction as is shown by the outlined arrow in FIG. 36B, and positions one sample mark each arranged in the second to ninth shot areas in the fourth row on wafer W sequentially, so that the sample marks are within the detection field of alignment system AL1. Then, main controller 20 detects the sample mark using alignment system AL1 each time the positioning is performed. In the series of this sample mark detection, Y heads $96_{10}$ to $96_1$, and $97_{10}$ to $97_1$ are sequentially switched, and are used to measure the θz rotation of fine movement stage WFS2. This completes the detection of the sample marks in the shot areas of the fourth row.

Furthermore, main controller 20 performs detection of the sample marks in the shot areas of the fifth and sixth rows, in a manner similar to the detection of the sample marks in the shot areas of the third and second rows. Finally, main controller 20 performs detection of the sample marks in the shot areas of the seventh row, in a manner similar to the detection of the sample marks in the shot areas of the first row.

When detection of the sample marks in all of the shot areas is completed in the mariner described above, main controller 20 computes array coordinates (position coordinates) of all of the shot areas on wafer W by performing a statistical computation which is disclosed in, for example, U.S. Pat. No. 4,780, 617 and the like, using detection results of the sample marks and measurement values of fine movement stage position measurement system 70B at the time of the sample mark detection. More specifically, EGA (Enhanced Global Alignment) is performed. Then, main controller 20 converts the computation results to an array coordinate (position coordinate) which uses a position of the second fiducial mark as a reference, using detection results of the second fiducial mark and measurement values of fine movement stage position measurement system 70B at the time of the detection. This array coordinate will be used as a target position information when aligning all of the shot areas on wafer W to the exposure position, which is the projection position of the pattern of reticle R, in the case of exposure.

As described above, as for the Y-axis direction, main controller 20 gradually steps wafer stage WST2 in the −Y direction, while driving wafer stage WST2 reciprocally in the +X direction and the −X direction for the X-axis direction, so as to detect the alignment marks (sample marks) provided in all of the shot areas on wafer W. In this case, because only alignment system AL1 having a detection center at a position (the XY position) the same as the reference point used on position measurement by fine movement stage position measurement system 70B is used in the precision priority mode, a one-to-one correspondency can be obtained for all of (the reference points, e.g., center point, of) the shot areas on wafer W and each point on grating RG, respectively, which allows the best precision (the best alignment precision) on wafer alignment. In this case, even if grating RG is deformed chronologically, because the one-to-one correspondency is obtained, an alignment error (an overlay error between a reticle pattern and a shot area on wafer W) caused due to deformation of grating RG will not occur in the case a shot area on wafer W is aligned with respect to exposure area IA, based on the results of the wafer alignment.

On the other hand, in the case the throughput is considered important, the throughput priority mode is selected. In the throughput priority mode, wafer alignment is performed using the five alignment systems AL1, and AL2, to AL2$_4$. In this throughput priority mode, a wafer alignment similar to the first embodiment previously described is performed.

In the following description, a wafer alignment procedure performed in a case of the throughput priority mode will be described, to wafer W having 43 shot areas arranged as shown in FIG. 33. In the following description, the secondary alignment system will be shortly described appropriately as an alignment system.

First of all, main controller 20 detects the second fiducial mark on measurement plate 86 using alignment system AL1, and then, makes a link between a position coordinate (X, Y) of the second fiducial mark which uses the detection center the index center) of alignment system AL1 as a reference, and measurement values of fine movement stage position measurement system 70B at the time of the detection of the second fiducial mark, and stores them in memory not shown).

Figure 37A:
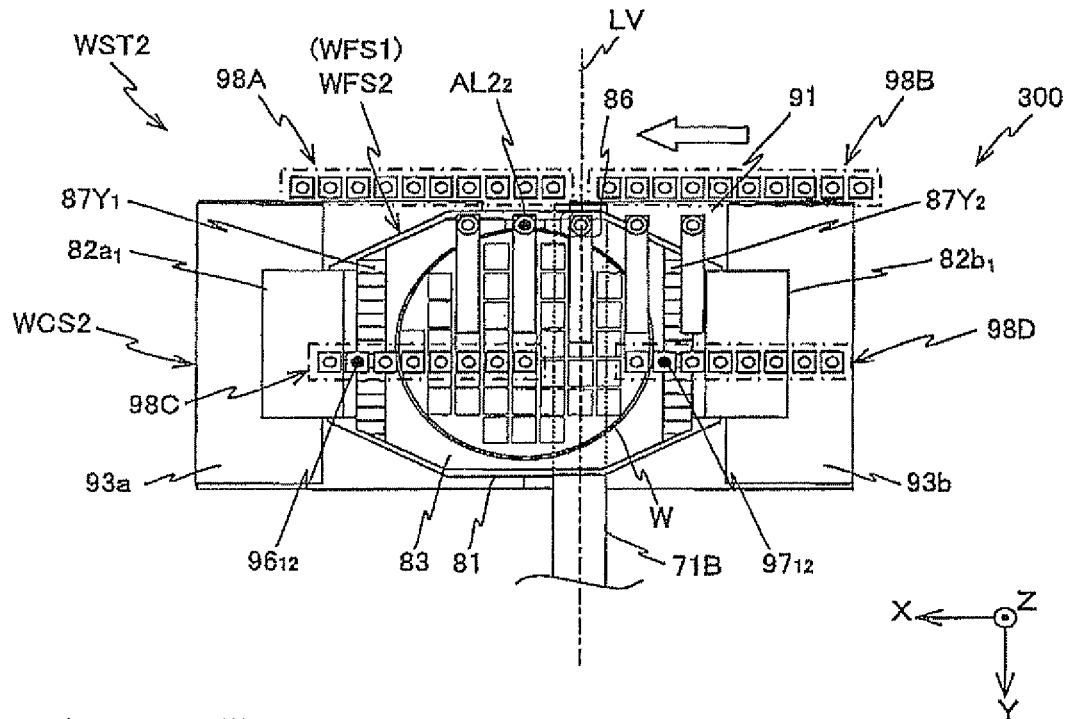
FIGS. 37A and 37B views used to explain a procedure of calibrating a detection center of an alignment system in the exposure apparatus of the second embodiment.

Next, main controller 20 drives fine movement stage WFS2 in the +X direction as is shown by the outlined arrow in FIG. 37A, and positions measurement plate 86 on fine movement stage WFS2 right under alignment system AL2$_2$. After the positioning, main controller 20 detects the second fiducial mark on measurement plate 86 using alignment system AL2$_2$. At this point, Y heads 96$_{12}$ and 97$_{12}$ of fine movement stage position measurement system 70C are used to measure the θz rotation of fine movement stage WFS2 (refer to the black circles in FIG. 37A). Similarly, main controller 20 detects the second fiducial mark using alignment system AL2$_1$. (Incidentally, another mark whose positional relation with the second fiducial mark is known can be detected.) Then, main controller 20 makes a link between a position coordinate (X, Y) of the second fiducial mark which uses the detection results, or namely, the detection center (the index center) of alignment systems AL2$_1$ and AL2$_2$ as a reference, and measurement values of fine movement stage position measurement system 70B at the time of the detection of the second fiducial mark, and stores them in memory (not shown).

Figure 37B:
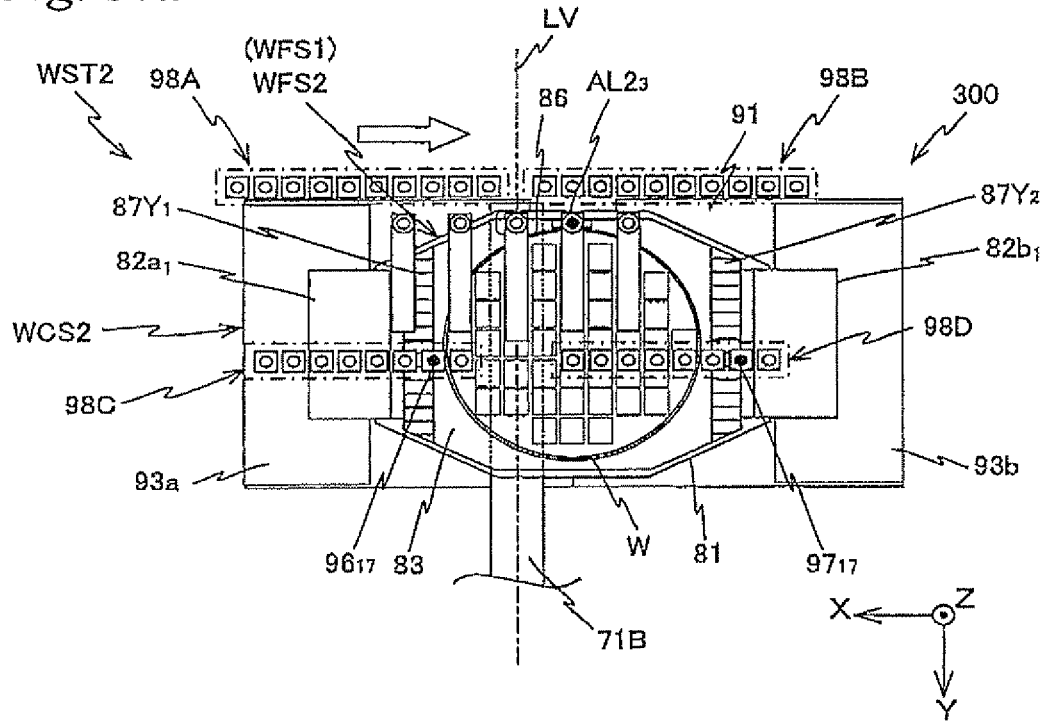

Next, main controller 20 drives fine movement stage WFS2 in the −X direction as is shown by the outlined arrow in FIG. 37B, and positions measurement plate 86 right under alignment system AL2$_3$. After the positioning, main controller 20 detects the second fiducial mark using alignment system AL2$_3$. At this point, Y heads 96$_{17}$ and 97$_{17}$ configuring fine movement stage position measurement system 70C are used to measure the θz rotation of fine movement stage WFS2 (refer to the black circles in FIG. 37B). Similarly, main controller 20 detects the second fiducial mark using alignment system AL2$_4$. (Incidentally, another mark whose positional relation with the second fiducial mark is known can be detected.) Then, main controller 20 makes a link between a position coordinate (X, Y) of the second fiducial mark which uses the detection results, or namely, the detection center (the index center) of alignment systems AL2$_3$ and AL2$_4$ as a reference, and measurement values of fine movement stage position measurement system 70B at the time of the detection of the second fiducial mark, and stores them in memory (not shown).

Main controller 20 obtains a baseline of secondary alignment systems AL2$_1$ to AL2$_4$, namely, a relative position of a detection center of secondary alignment systems AL2$_1$ to AL2$_4$ with respect to a detection center of primary alignment system AL1, using the detection results above. Further, when necessary, main controller 20 drives and controls the holding apparatus (slider) previously described, and adjusts the relative position of the detection center of secondary alignment systems AL2$_1$ to AL2$_4$.

Figure 38A:
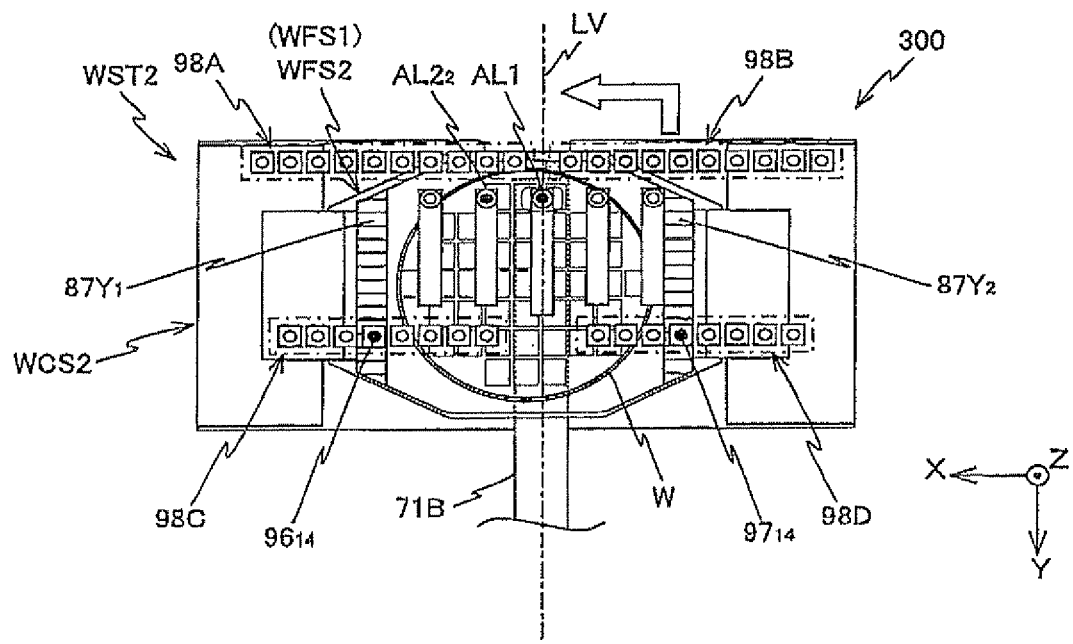
FIGS. 38A and 38B are views used to explain a second wafer alignment procedure performed (No. 2) in the exposure apparatus of the second embodiment.

After the baseline measurement, main controller 20 steps wafer stage WST2 to a position a predetermined distance in the −Y direction and a predetermined distance in the +X direction as is shown by the outlined arrow in FIG. 38A, and positions one sample mark each arranged in the first and third shot areas in the first row on wafer W so that the sample marks are within a detection field of alignment systems AL2$_2$ and AL1. Main controller 20, in this case, can move wafer stage WST2 directly (diagonally) from the position when detecting the second fiducial mark using alignment system AL2$_4$ to the position shown in FIG. 38A, or can step wafer stage WST2 in the order of the +X direction and the −Y direction. After the positioning, main controller 20 detects the two sample marks simultaneously and individually, using alignment systems AL1 and AL2$_2$. At this point, Y heads 96$_{14}$ and 97$_{14}$ are used to measure the θz rotation of fine movement stage WFS2 (refer to the black circles in FIG. 38A).

Figure 38B:
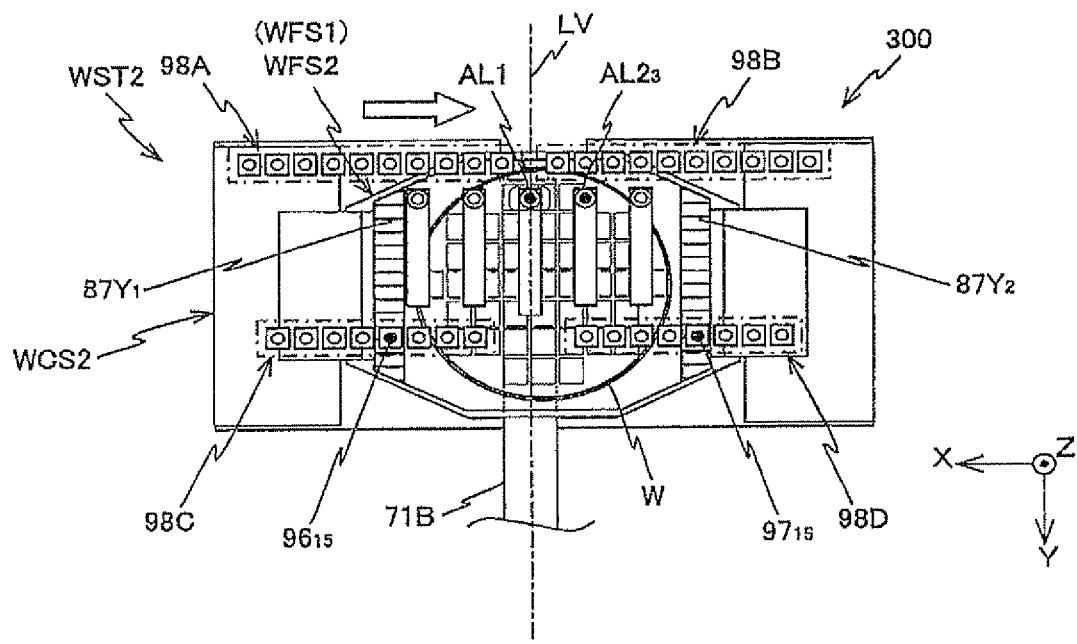

Next, main controller 20 steps wafer stage WST2 in the −X direction as is shown by the outlined arrow in FIG. 38B, and positions one sample mark each arranged in the second and third shot areas in the first row on wafer W so that the sample marks are within a detection field of alignment systems AL1 and $AL2_3$, respectively. And, main controller 20 detects the two sample marks simultaneously and individually, using alignment systems AL1 and $AL2_3$. At this point, Y heads $96_{15}$ and $97_{15}$ are used to measure the θz rotation of fine movement stage WFS2 (refer to the black circles in FIG. 38B). This completes the detection of the sample marks in the shot areas of the first row.

Figure 39A:
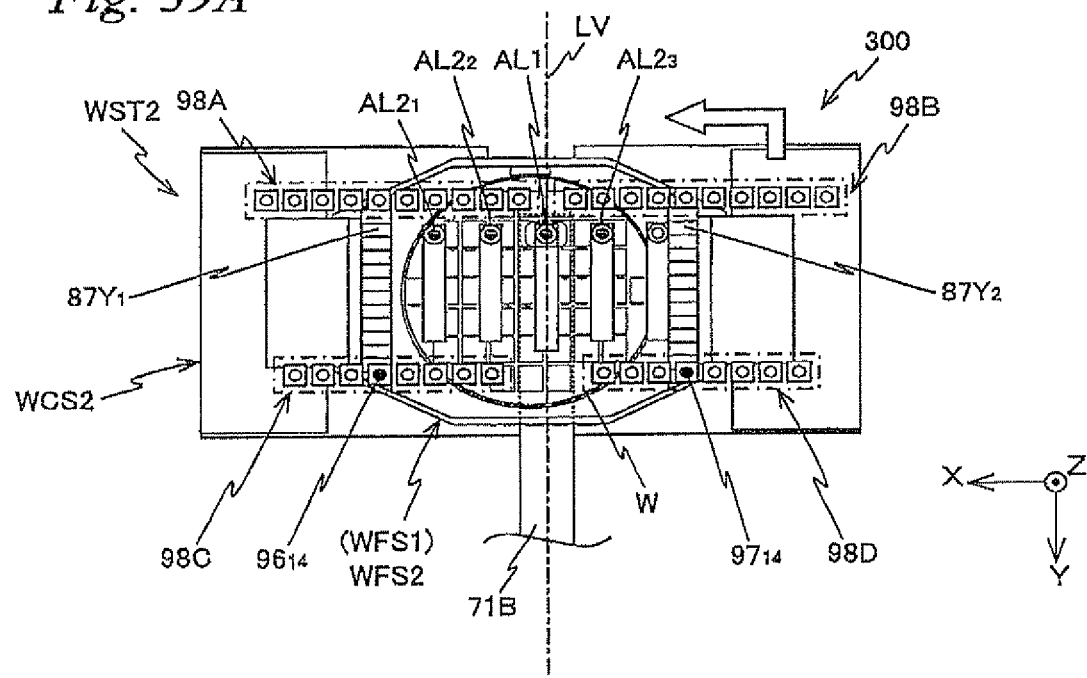
FIGS. 39A and 39B are views used to explain a second wafer alignment procedure performed (No. 3) in the exposure apparatus of the second embodiment.

Next, main controller 20 steps wafer stage WST2 by predetermined distance in the −Y direction and a predetermined distance in the +X direction as is shown by the outlined arrow in FIG. 39A, and positions one sample mark each arranged in the first, third, fifth, and seventh shot areas in the second row on wafer W so that the sample marks are within the detection field of alignment systems $AL2_1$, $AL2_2$, AL1, and $AL2_3$, respectively. After the positioning, main controller 20 detects the four sample marks simultaneously and individually, using alignment systems $AL2_1$, $AL2_2$, AL1, and $AL2_3$. At this point, Y heads $96_{14}$ and $97_{14}$ are used to measure the θz rotation of fine movement stage WFS2 (refer to the black circles in FIG. 39A).

Figure 39B:
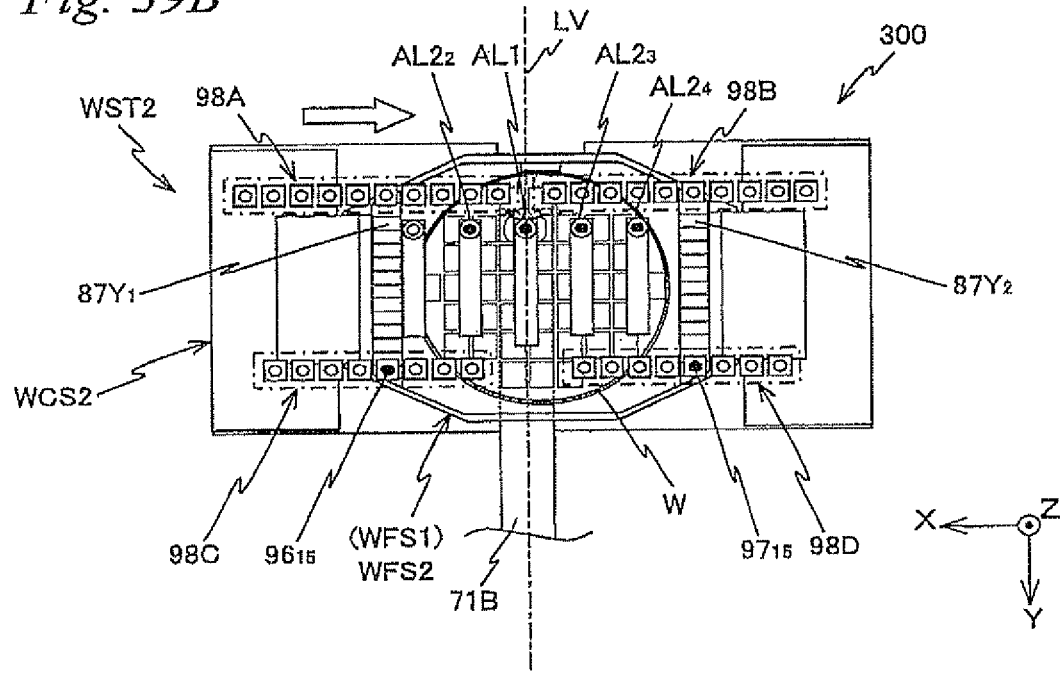

Next, main controller 20 steps wafer stage WST2 in the −X direction as is shown by the outlined arrow in FIG. 39B, and positions one sample mark each arranged in the second, fourth, sixth, and seventh shot areas in the second row on wafer W so that the sample marks are within a detection field of alignment systems $AL2_2$, AL1, $AL2_3$, and $AL2_4$, respectively. After the positioning, main controller 20 detects the four sample marks simultaneously and individually, using alignment systems $AL2_2$, AL1, $AL2_3$, and $AL2_4$. At this point, Y heads $96_{15}$ and $97_{15}$ are used to measure the θz rotation of fine movement stage WFS2 (refer to the black circles in FIG. 39S). This completes the detection of the sample marks in the shot areas of the second row.

Next, main controller 20 performs detection of the sample marks in the shot areas of the third row, in a procedure similar to the detection of the sample marks in the shot areas of the second row. However, the direction of the stepping drive of wafer stage WST2 will be reversed. Further, by driving wafer stage WST2 in the −Y direction prior to the mark detection, the Y heads to be used (head units) will b switched from Y heads $96_{11}$ to $96_{18}$ to $96_1$ to $96_{10}$ (from head units 96C to 98A). Similarly, the Y heads to be used (head units) will b switched from Y heads $97_{11}$ to $97_{18}$ to $97_1$ to $97_{10}$ (from head units 96D to 98B).

Figure 40A:
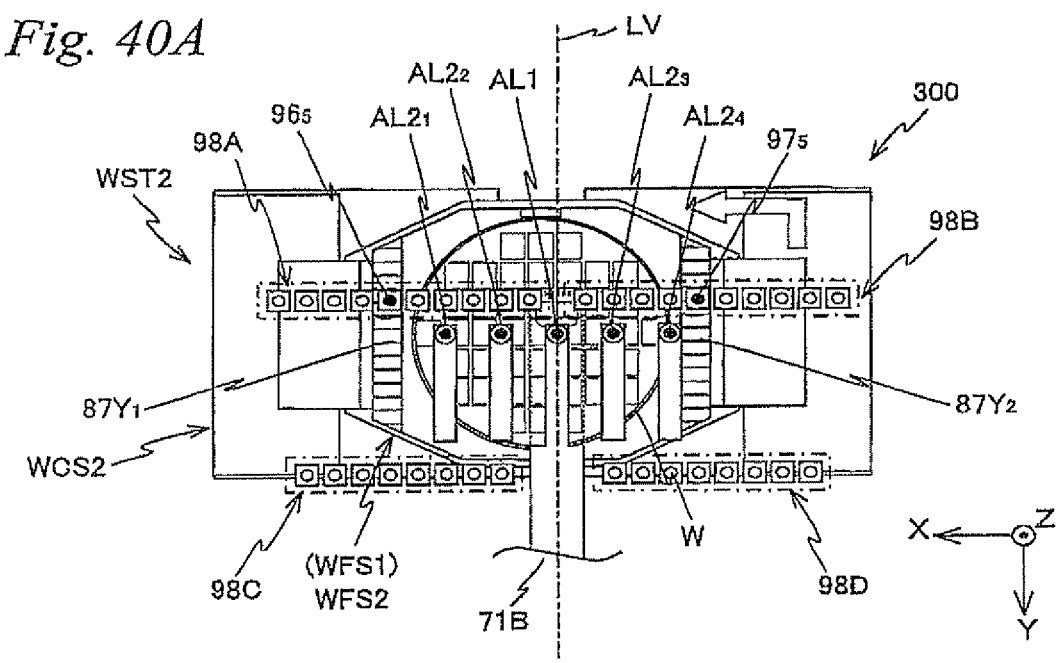
FIGS. 40A and 40B are views used to explain a second wafer alignment procedure performed (No. 4) in the exposure apparatus of the second embodiment.

And, when the detection of the sample marks in the shot areas of the third row is completed, main controller 20 steps wafer stage WST2 from the position set at that point in time to a position a predetermined distance in the −Y direction and a predetermined distance in the +X direction as is shown by the outlined arrow in FIG. 40A, and positions one sample mark each arranged in the first, third, fifth, seventh, and ninth shot areas in the fourth row on wafer W so that the sample marks are within a detection field of alignment systems $AL2_1$, $AL2_2$, AL1, $AL2_3$, and $AL2_4$, respectively. After the position setting, main controller 20 detects the five sample marks simultaneously and individually, using alignment systems $AL2_1$, $AL2_2$, AL1, $AL2_3$, and $AL2_4$. At this point, Y heads $96_5$ and $97_5$ are used to measure the θz rotation of fine movement stage WFS2 (refer to the black circles in FIG. 40A).

Figure 40B:
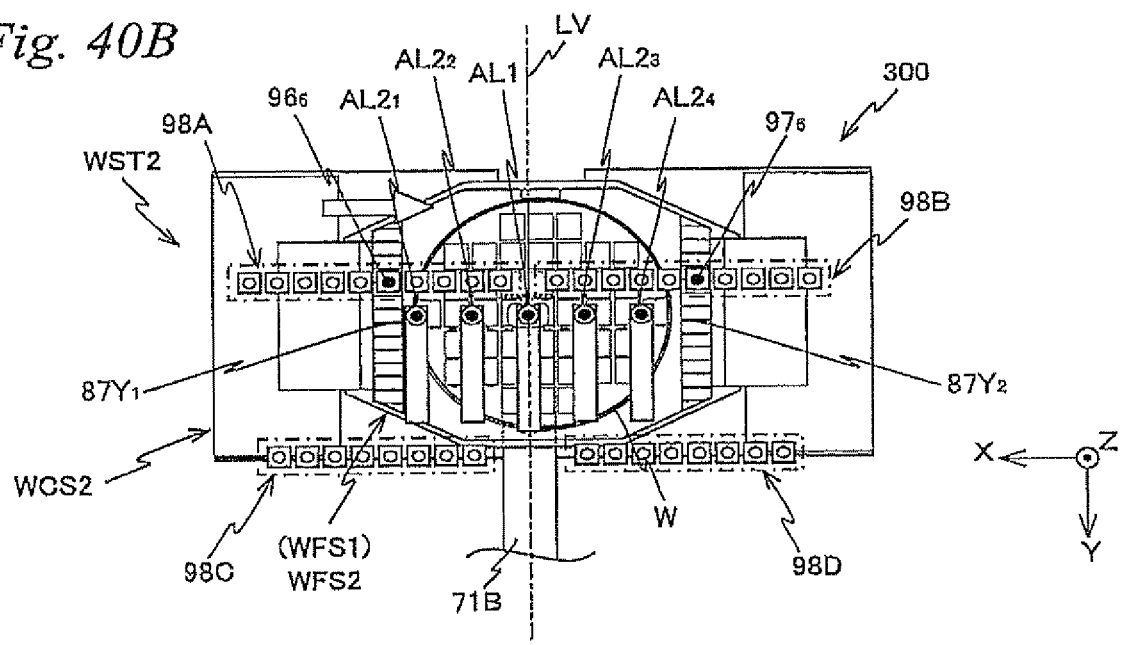

Next, main controller 20 steps wafer stage WST2 in the −X direction as is shown by the outlined arrow in FIG. 40B, and positions one sample mark each arranged in the second, fourth, sixth, eighth, and ninth shot areas in the fourth row on wafer W so that the sample marks are within a detection field of alignment systems $AL2_1$, $AL2_2$, AL1, $AL2_3$, and $AL2_4$, respectively. And, main controller 20 detects the five sample marks simultaneously and individually, using alignment systems $AL2_1$, $AL2_2$, AL1, $AL2_3$, and $AL2_4$. At this point, Y heads $96_6$ and $97_6$ are used to measure the θz rotation of fine movement stage WFS2 (refer to the black circles in FIG. 40B). This completes the detection of the sample marks in the shot areas of the fourth row.

Furthermore, main controller 20 performs detection of the sample marks in the shot areas of the fifth and sixth rows, in a manner similar to the detection of the sample marks in the shot areas of the third and second rows. Finally, main controller 20 performs detection of the sample marks in the shot areas of the seventh row, in a manner similar to the detection of the sample marks in the shot areas of the first row.

When detection of the sample marks in all of the shot areas is completed in the manner described above, main controller 20 computes array coordinates (position coordinates) of all of the shot areas on wafer W by performing a statistical computation which is disclosed in, for example, U.S. Pat. No. 4,780,617 and the like, using detection results of the sample marks, measurement values of fine movement stage position measurement system 70B at the time of the sample mark detection, and results of the baseline measurement. More specifically, EGA (Enhanced Global Alignment) is performed. Then, main controller 20 converts the computation results to an array coordinate (position coordinate) which uses a position of the second fiducial mark as a reference, using detection results of the second fiducial mark and measurement values of fine movement stage position measurement system 70B at the time of the detection.

As described above, as for the Y-axis direction, main controller 20 gradually steps wafer stage WST2 in the −Y direction, while driving wafer stage WST2 reciprocally in the +X direction and the −X direction for the X-axis direction, so as to detect the alignment marks (sample marks) provided in all of the shot areas on wafer W. In this case, in exposure apparatus 1100 of the embodiment, because five alignment systems AL1, and $AL2_1$ to $AL2_4$ can be used, the distance of the reciprocal drive in the X-axis direction is short, and the number of times of position setting in one reciprocal movement is few, which is two times. Therefore, alignment marks can be detected in quite a short amount of time when compared with the case when using a single alignment system. In this case as well, because alignment marks arranged in all the shot areas on wafer W are detected and the positional relation of alignment systems AL1, and $AL2_1$ to $AL2_4$ used for the detection of the alignment marks is obtained, a one-to-one correspondency can be substantially obtained for all of (the reference points, e.g., center point, of) the shot areas on wafer W and each point on grating RG, respectively. Accordingly, an alignment error (an overlay error between a reticle pattern and a shot area on wafer W) of a level which cannot be ignored that is caused due to deformation of grating RG hardly occurs in the case a shot area on wafer W is aligned with respect to exposure area IA, based on the results of the wafer alignment.

Incidentally, while the five alignment systems AL1, and $AL2_1$ to $AL2_4$ were used in the wafer alignment in the throughput priority mode described above, as well as this, for example, three alignment systems AL1, $AL2_1$, and $AL2_2$ can be used. Main controller 20 selects the alignment systems to be used, depending on the alignment precision, throughput, and the like which is required.

In the parallel processing of exposure to wafer W held by fine movement stage WFS1 by the step-and-scan method and wafer alignment to wafer W on fine movement stage WFS2, the wafer alignment is usually completed first. Main controller 20 waits for the exposure of wafer W on fine movement stage WFS1 to be completed, in a state where wafer stage WST2 is waiting at a predetermined waiting position.

Main controller 20 drives movable blade BL downward by a predetermined amount as is previously described, prior to the completion of exposure.

Figure 41:
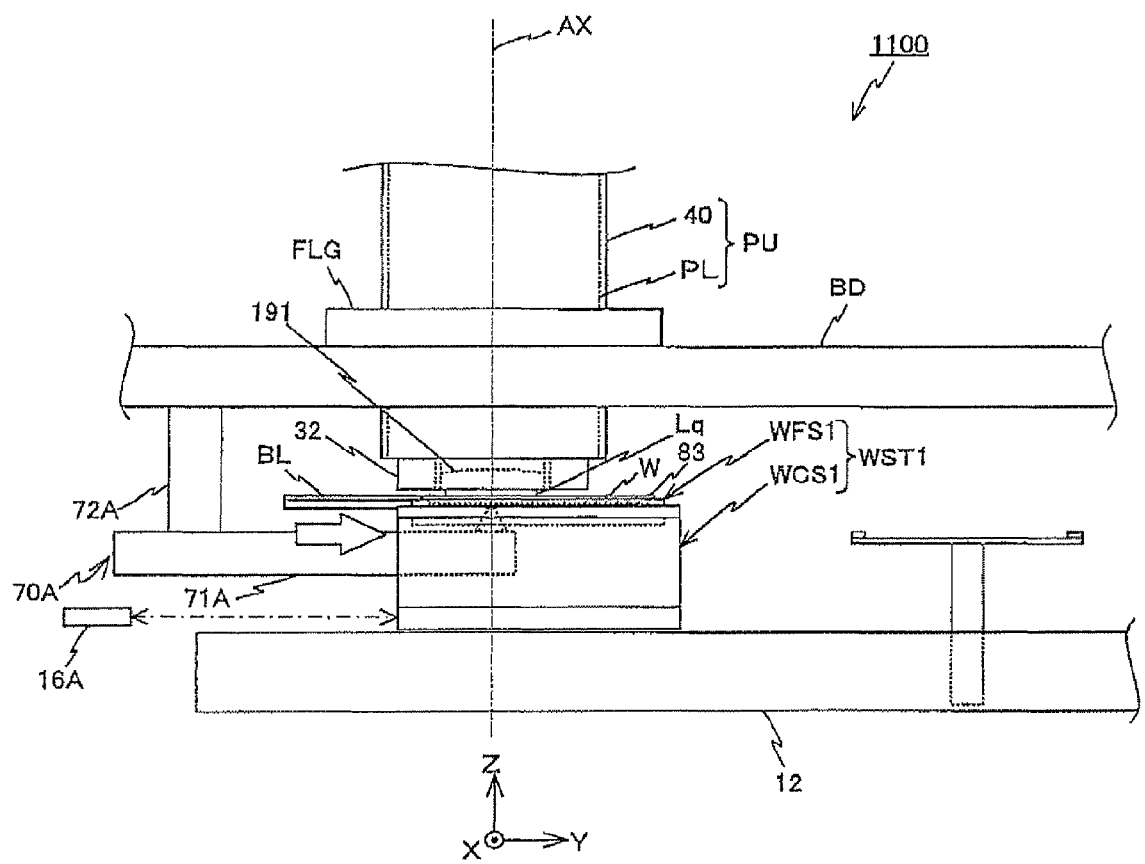
FIG. 41 is a view showing a state right after completion of exposure in the exposure apparatus of the second embodiment, and is used to explain a state at the time when a delivery of a liquid immersion space (liquid Lq) performed between a fine movement stage and a movable blade begins.

Then, when the exposure has been completed, main controller 20 starts to deliver the liquid immersion space from fine movement stage WFS1 to movable blade BL as shown in FIG. 41. This delivery is performed in a procedure similar to the one described in the first embodiment.

Figure 42:
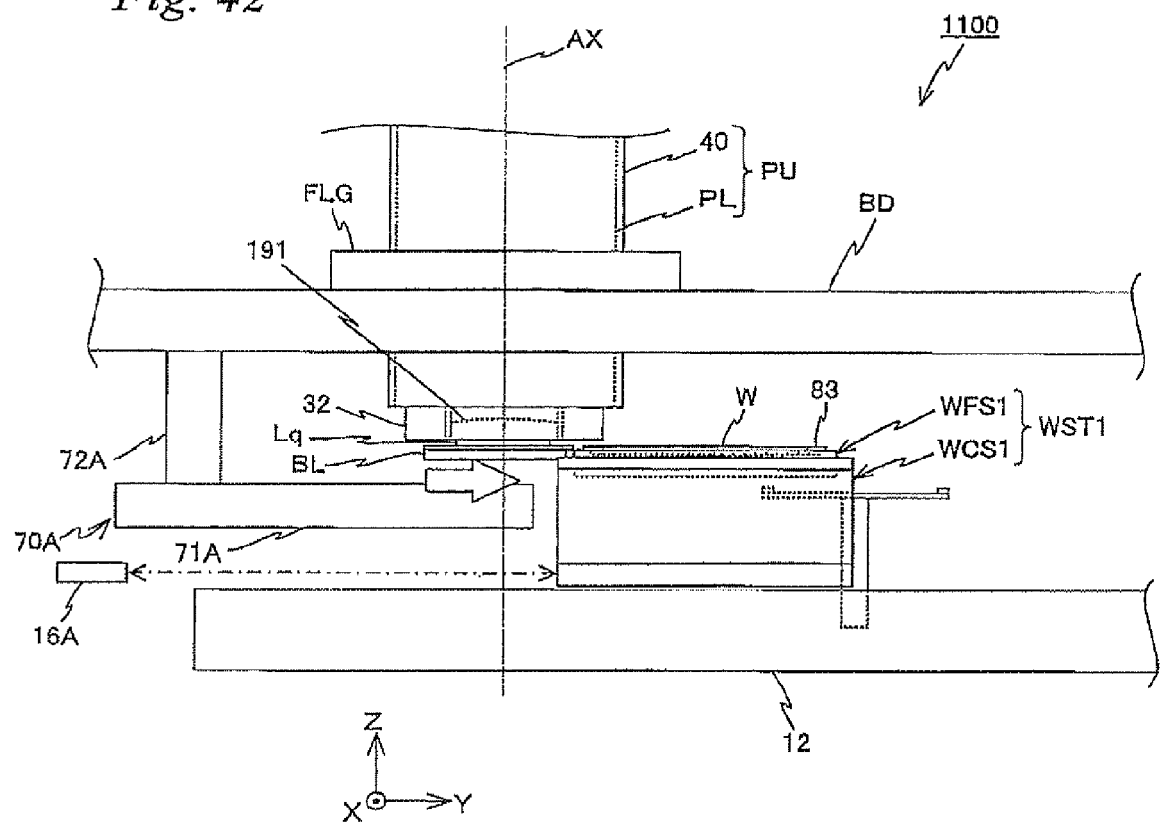
FIG. 42 is a view used to explain a state when the delivery of the liquid immersion space (liquid Lq) has been completed between the fine movement stage and the movable blade in the exposure apparatus of the second embodiment.
Figure 43:
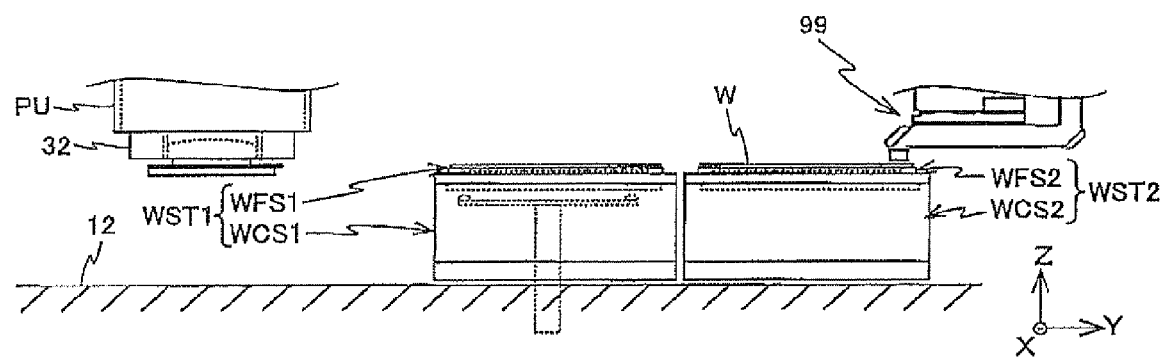
FIG. 43 is a view used to explain a parallel processing performed using fine movement stages WFS1 and WFS2 (No. 1) in the exposure apparatus of the second embodiment.
Figure 44:
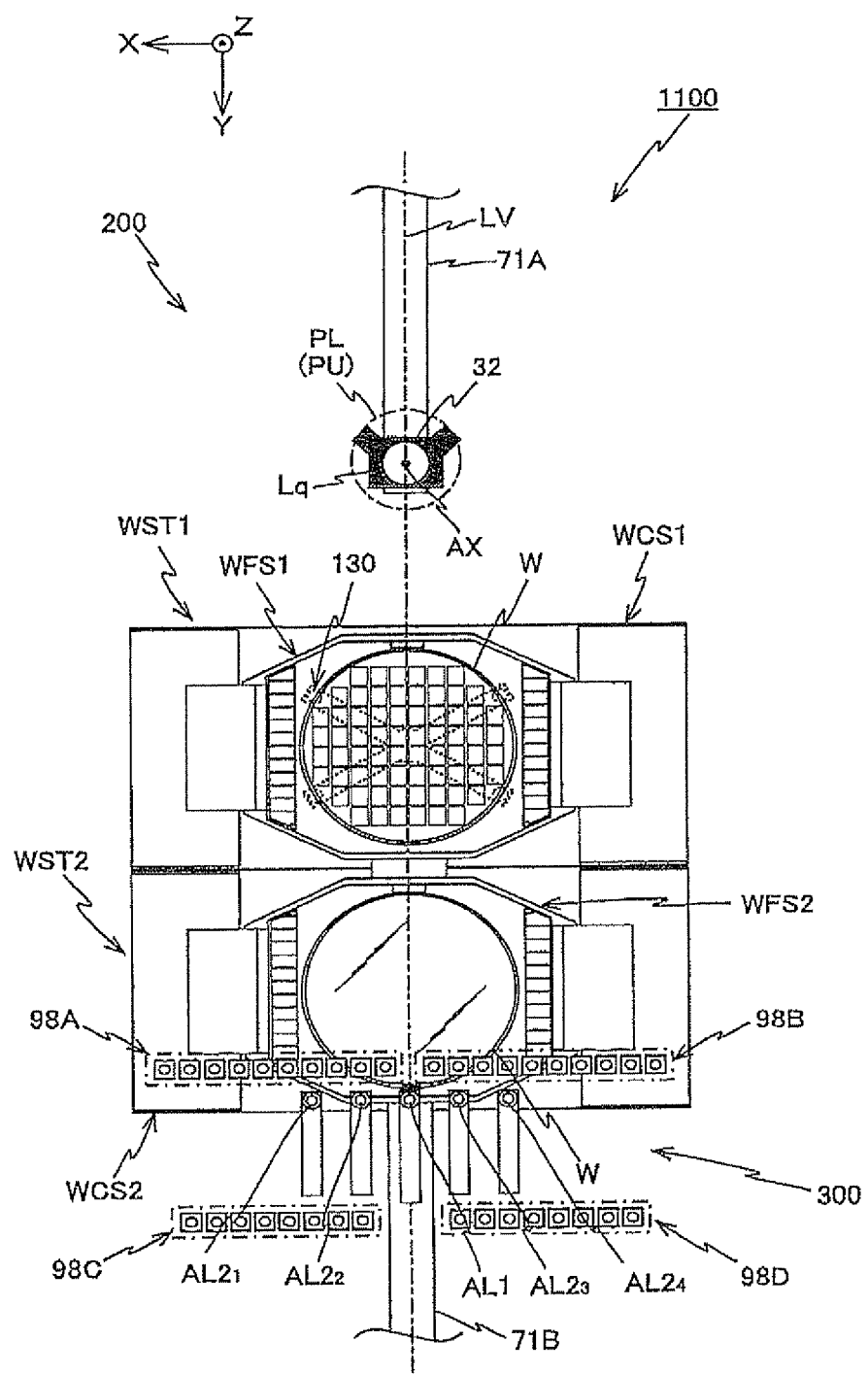
FIG. 44 is a view used to explain a parallel processing performed using fine movement stages WFS1 and WFS2 (No. 2) in the exposure apparatus of the second embodiment.

Then, when the delivery of the liquid immersion space from fine movement stage WFS1 to movable blade BL is completed as shown in FIG. 42, main controller 20 drives coarse movement stage WCS1 holding fine movement stage WFS1 further in the +X direction, and moves coarse movement stage WCS1 near coarse movement stage WCS2, which is waiting at the waiting position previously described while holding fine movement stage WFS2. This allows fine movement stage WFS1 to be carried right above center table 130 by coarse movement stage WCS1. At this point, a state occurs where coarse movement stage WCS1 houses center table 130 in its internal space, and also supports fine movement stage WFS1 right above center table 130, as shown in FIG. 43. FIG. 44 shows a state of exposure apparatus 1100 at this point in a planar view. However, illustration of movable blade BL is omitted. The same is true also in other drawings.

Then, main controller 20 drives table main body 136 upward via drive device 132 of center table 130, and supports fine movement stage WFS1 from below. And, in this state, main controller 20 releases the lock mechanism (not shown), and separates coarse movement stage WCS1 into the first section WCS1a and the second section WCS1b, via coarse movement stage drive systems 51Aa and 51Ab. By this operation, fine movement stage WFS1 is passed to table main section 136 from coarse movement stage WCS1. Thus, main controller 20 drives table main body 136 supporting fine movement stage WFS1 downward, via drive device 132.

And then, main controller 20 locks the lock mechanism (not shown) after the first section WCS1a and the second section WCS1b are joined together. This allows coarse movement stage WCS1 to return to the state before the separation (to be integrated).

Next, main controller 20 makes coarse movement stage WCS2 almost come into contact with coarse movement stage WCS1 which has been integrated, and also drives fine movement stage WFS2 in the −Y direction via fine movement stage drive systems 52A and 52B, and moves and mounts (a slide movement) fine movement stage WFS2 from coarse movement stage WCS2 onto coarse movement stage WCS1.

Figure 45:
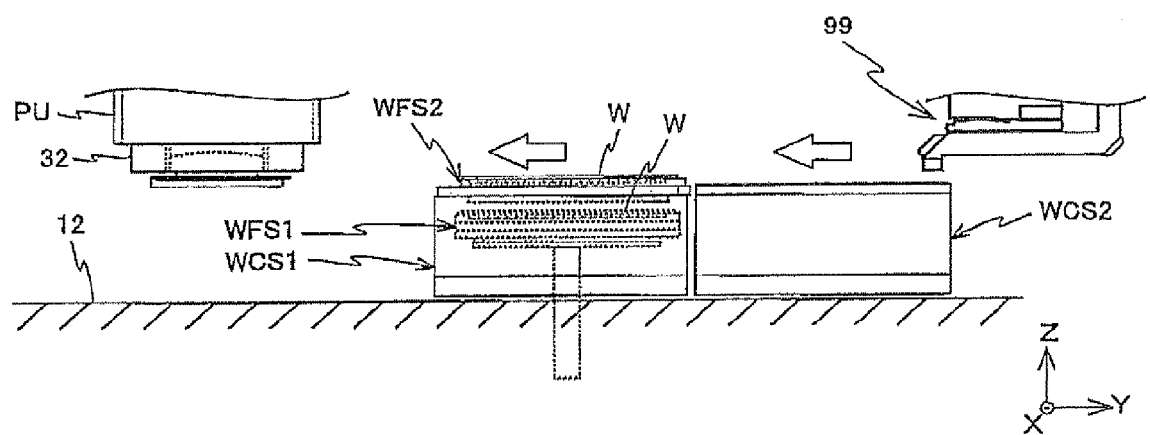
FIG. 45 is a view used to explain a parallel processing performed using fine movement stages WFS1 and WFS2 (No. 3) in the exposure apparatus of the second embodiment.

Next, main controller 20 makes coarse movement stage WCS1 which supports fine movement stage WFS2 move in the −Y direction as is shown by the outlined arrow in FIG. 45, and delivers the liquid immersion space held with tip lens 191 from movable blade BL to fine movement stage WFS2. The delivery of this liquid immersion space (liquid Lq) is performed by reversing the procedure of the delivery of the liquid immersion area from fine movement stage WFS1 to movable blade BL previously described.

Then, main controller 20 drives coarse movement stage WCS1 which holds fine movement stage WFS2 to exposure station 200, and then, exposure operation by the step-and-scan method is performed based on reticle alignment, results of the reticle alignment, and results of wafer alignment (array coordinates which are based on second fiducial marks of each shot area on wafer W).

In parallel with exposure to wafer W on fine movement stage WFS2 described above, wafer exchange, wafer alignment, and the like are performed on fine movement stage WFS1, similar to the fine movement stage WFS2 side previously described. Hereinafter, a processing similar to the one described above is repeatedly performed.

As is described in detail above, according to exposure apparatus 1100 of the second embodiment, an equivalent effect can be obtained as in the first embodiment previously described. In addition, according to exposure apparatus 1100 of the second embodiment, in the case main controller 20 selects the precision priority mode on wafer alignment, main controller 20 detects one or more alignment marks arranged in each of all the shot areas on wafer W held by fine movement stage WFS2 using only primary alignment system AL1, which has a detection center at a position (an XY position) the same as the reference point used on position measurement by fine movement stage position measurement system 70B, while measuring the position of fine movement stage WFS2 using fine movement stage position measurement system 70B. On detecting each alignment mark, main controller 20 uses fine movement stage position measurement system 70C to measure the θz rotation of fine movement stage WFS2, and performs rotation control of fine movement stage WFS2 using the results. Accordingly, by driving fine movement stage WFS2 based on results of the wafer alignment in the precision priority mode in the case of exposure, alignment of all the shot areas on wafer W to the exposure position with high precision becomes possible, which in turn allows a highly precise overlay of each of all the shot areas with the reticle pattern.

Further, in the case main controller 20 selects the throughput priority mode on wafer alignment, main controller 20 detects one or more alignment marks arranged in each of all the shot areas on wafer W held by fine movement stage WFS2 using primary alignment system AL1, which has a detection center at a position (an XY position) the same as the reference point used on position measurement by fine movement stage position measurement system 70B, and secondary alignment systems $AL2_1$ to $AL2_4$, having detection centers that have a known positional relation with the detection center of primary alignment system AL1. By driving fine movement stage WFS2 in the case of exposure based on the results of the wafer alignment in the throughput priority move, it becomes possible to achieve a sufficient overlay accuracy at a sufficient throughput.

Figure 46:
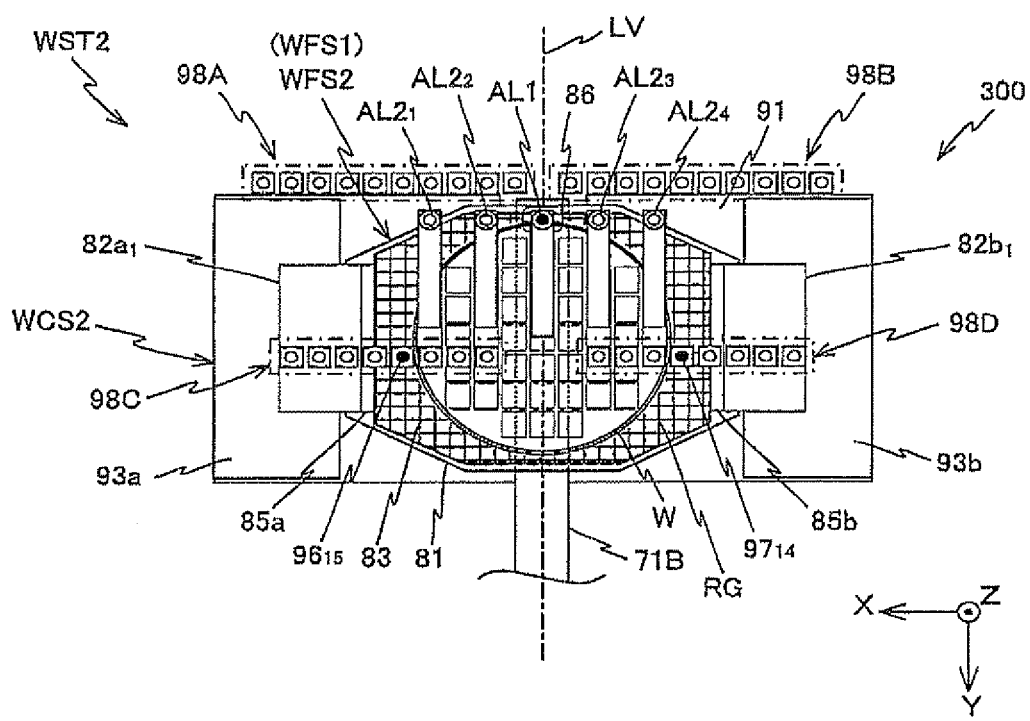
FIG. 46 is a view showing a modified example of an encoder system.

Incidentally, in the second embodiment described above, an example of a case where fine movement stage position measurement system 70C which measures the θz position of fine movement stage WFS1 (or WFS2) is configured by Y heads 96 and 97 (head units 98A to 98B) placed around aligner 99 (alignment systems AL1, and $AL2_1$ to $AL2_4$), and Y scales $87Y_1$ and $87Y_2$ provided on fine movement stage WFS1 (or WFS2) was indicated. However, as well as this, for example, a configuration using grating RG can also be employed, instead of Y scales $87Y_1$ and $87Y_2$. FIG. 46 shows an example of a case when such a configuration is employed in a fine movement stage position measurement system. In FIG. 46, grating RG previously described is formed on almost the entire area of the upper surface of main body section 81 of fine movement stage WFS1 (or WFS2), and in an area on the upper surface of main body section 81 (plate 83) corresponding to the placement area of Y scales 87Y1 and 87Y2, a liquid repellent treatment is not applied (a liquid repellent surface is not formed). In this case, each of the Y heads 96 and 97 irradiate a measurement beam on grating RG from above (the +Z side) via plate 83 and cover glass 84 (refer to FIG. 29A), receive the diffraction light which occurs from a Y diffraction grating of grating RG, and measure a Y position of grating RG (more specifically, fine movement stage WFS1 (or WFS2)) in the +X end and −X end. Accordingly, the θz rotation of fine movement stage WFS1 (or WFS2) can be obtained, based on the measurement results of Y heads 96 and 97.

Figure 47:
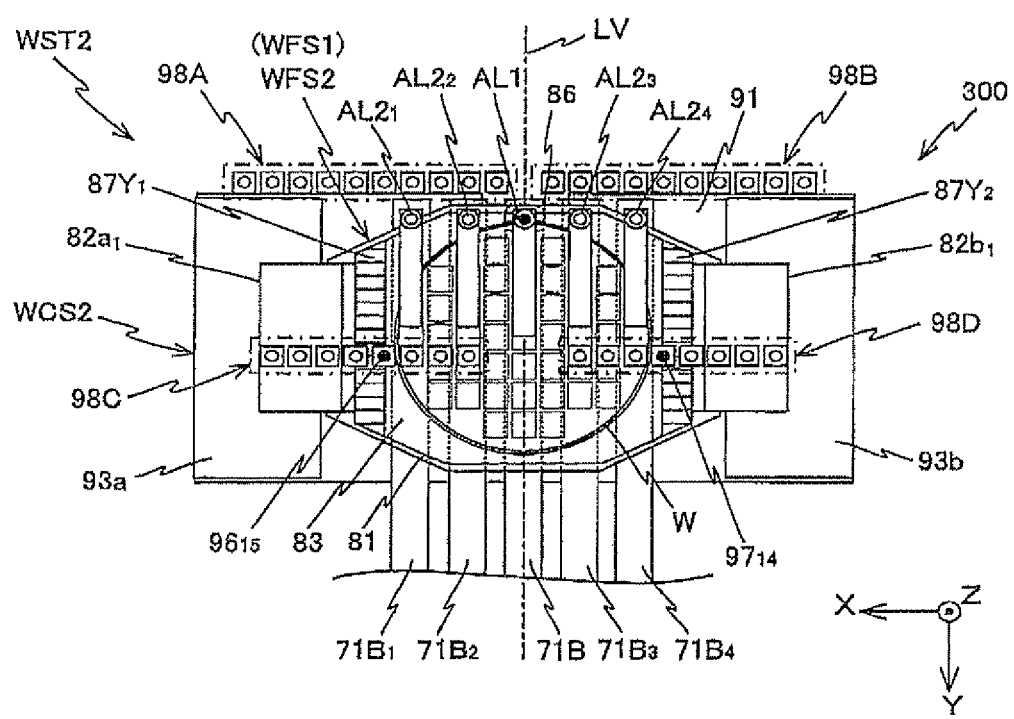
FIG. 47 is a view showing a modified example of a fine movement stage position measurement system.

Further, in the embodiment above, while an example of a case where fine movement stage position measurement system 70B is equipped with a single measurement arm 71B whose measurement reference point is at the same position (XY position) as the detection center of primary alignment system AL1 was indicated, as well as this, a fine movement stage position measurement system 70B that is further equipped with four measurement arms $71B_1$ to $71B_4$, which are each equipped with an encoder system (a head section which includes at least one X head and one Y head each) in addition to measurement arm 71B can be used, as shown in FIG. 47. The encoder system which four measurement arms $71B_1$ to $71B_4$ are each equipped with, uses the same position (XY position) as the detection center of secondary alignment systems $AL2_1$ to $AL2_4$, respectively, as a measurement reference point. Further, by performing a wafer alignment (in the throughput priority mode) using fine movement stage position measurement system 70B equipped with measurement arms $71B_1$ to $71B_4$, alignment precision at the same level as the precision priority mode and high throughput at the same level as the throughput priority mode can be achieved at the same time.

Incidentally, while in each of the first and second embodiments described above (hereinafter shortly referred to as each of the embodiments), one alignment mark each arranged in each of all the shot areas on wafer W was detected on wafer alignment, as well as this, the number of alignment marks to be detected can be selected according to the alignment precision, throughput and the like which are required.

Incidentally, in each of the embodiments above, while the case has been described where fine movement stage position measurement systems 70A and 70B are made entirely of, for example, glass, and are equipped with measurement arms 71A and 71B in which light can proceed inside, the present invention is not limited to this. For example, at least only the part where each of the laser beams previously described proceed in the measurement arm has to be made of a solid member which can pass through light, and the other sections, for example, can be a member that does not transmit light, and can have a hollow structure. Further, as a measurement arm, for example, a light source or a photodetector can be built in the tip of the measurement arm, as long as a measurement beam can be irradiated from the section facing the grating. In this case, the measurement beam of the encoder does not have to proceed inside the measurement arm.

Further, in the measurement arm, the part (beam optical path segment) where each laser beam proceeds can be hollow. Or, in the case of employing a grating interference type encoder system as the encoder system, the optical member on which the diffraction grating is formed only has to be provided on an arm that has low thermal expansion, such as for example, ceramics, Invar and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the measurement arm (and beam optical path). Furthermore, the measurement arm need not have any particular shape.

Incidentally, in each of the embodiments above, while the case has been described where measurement arms 71A and 71B are both provided on math frame BD, as well as this, measurement arms 71A and 71B and mainframe BD may be provided in different support members. For example, the projection system (projection unit PU) and the alignment system (aligner 99) can be supported by different support devices, and measurement arm 71A can be provided in the support device of the projection system whereas measurement arm 71B can be provided in support device of the alignment system.

Incidentally, in each of the embodiments above, because measurement arms 71A and 71B are fixed to main frame BD integrally, torsion and the like may occur due to internal stress (including thermal stress) in measurement arms 71A and 71B, which may change the relative position between measurement arms 71A and 71B, and main frame BD. Therefore, as countermeasures against such cases, the position of measurement arms 71A and 71B (a change in a relative position with respect to main frame BD, or a change of position with respect to a reference position) can be measured, and the position of measurement arms 71A and 71B can be finely adjusted, or the measurement results corrected, with actuators and the like.

Further, in each of the embodiments above, while the case has been described where measurement arms 71A and 71B are integral with main frame BD, as well as this, measurement arms 71A and 71B and mainframe BD may be separated. In this case, a measurement device (for example, an encoder and/or an interferometer) which measures a position (or displacement) of measurement arms 71A and 71B with respect to main frame BD (or a reference position), and an actuator and the like to adjust a position of measurement arms 71A and 71B can be provided, and main controller 20 as well as other controllers can maintain a positional relation between main frame BD (and projection optical system PL) and measurement arms 71A and 71B at a predetermined relation (for example, constant), based on measurement results of the measurement device.

Further, a measurement system (sensor), a temperature sensor, a pressure sensor, an acceleration sensor for vibration measurement and the like can be provided in measurement arms 71A and 71B, so as to measure a variation in measurement arms 71A and 71B by an optical technique. Or, a distortion sensor (strain gauge) or a displacement sensor can be provided, so as to measure a variation in measurement arms 71A and 71B. And, by using the values obtained by these sensors, positional information obtained by fine movement stage position measurement system 70A and/or wafer stage position measurement system 68A, or fine movement stage position measurement system 70B and/or wafer stage position measurement system 68B can be corrected.

Further, in the embodiment above, while the case has been described where measurement arm 71A (or 71B) is supported in a cantilevered state via one support member 72A (or 72B) from mainframe BD, as well as this, for example, measurement arm 71A (or 71B) can be supported by suspension from main frame BD via a U-shaped suspension section, including two suspension members which are arranged apart in the X-axis direction. In this case, it is desirable to set the distance between the two suspension members so that the fine movement stage can move in between the two suspension members.

Further, in each of the embodiments above, while the case has been described where fine movement stage position measurement systems 70A and 70B are equipped with measurement arms 71A and 71B which are supported in a cantilevered state, respectively, fine movement stage position measurement systems 70A and 70B do not necessarily have to be equipped with a measurement arm. In other words, it will suffice as long as at least one of the first measurement system and the second measurement system corresponding to fine movement stage position measurement systems 70A and 70B has a head which is placed facing grating RG inside the space of coarse movement stages WCS1 and WCS2 and receives a diffraction light from grating RG of at least one measurement beam irradiated on grating RG, and can measure the positional information of fine movement stage WFS1 (or WFS2) at least within the XY plane, based on the output of the head. In other words, the first measurement system (fine movement stage position measurement system 70A in the embodiment above is equivalent to this) can have any configuration, as long as when a holding member (fine movement stage) comes to an exposure station, the system can irradiate at least one first measurement beam from below on the holding member, receive a return light of the first measurement beam, and measure the positional information in the XY plane of the holding member. Further, the second measurement system (fine movement stage position measurement system 70B in each of the embodiments above is equivalent to this) can have any configuration, as long as when a holding member (fine movement stage) comes to a measurement station, the system can irradiate at least one second measurement beam from below on the holding member, receive a return light of the second measurement beam, and measure the positional information in the XY plane of the holding member.

Further, in each of the embodiments above, while an example has been shown where encoder system 73 is equipped with an X head and a pair of Y heads, besides this, for example, one or two two-dimensional heads (2D heads) whose measurement directions are in two directions, which are the X-axis direction and the Y-axis direction, can be provided. In the case two 2D heads are provided, detection points of the two heads can be arranged to be two points which are spaced equally apart in the X-axis direction on the grating, with the exposure position serving as the center.

Incidentally, fine movement stage position measurement system 70A can measure positional information in directions of six degrees of freedom of the fine movement stage only by using encoder system 73, without being equipped with laser interferometer system 75. Besides this, an encoder which can measure positional information in at least one of the X-axis direction and the Y-axis direction, and the Z-axis direction can also be used. For example, by irradiating measurement beams from a total of three encoders including an encoder which can measure positional information in the X-axis direction and the Z-axis direction and an encoder which can measure positional information in the Y-axis direction and the Z-axis direction, on three measurement points that are noncollinear, and receiving the return lights, positional information of the movable body on which grating RG is provided can be measured in directions of six degrees of freedom. Further, the configuration of encoder system 73 is not limited to the embodiment described above, and is arbitrary.

Incidentally, in each of the embodiments above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when measuring the position of the wafer holder (wafer). Further, the grating can be placed on the lower surface of the fine movement stage, and in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced.

Incidentally, in the embodiments above, while an encoder system was used in which measurement beams proceeded inside of measurement arms 71A and 71B and were irradiated on grating RG of the fine movement stage from below, as well as this, an encoder system can be used which has an optical system (such as a beam splitter) of an encoder head provided in the measurement arm, and the optical system and a light source can be connected by an optical fiber, which allows a laser beam to be transmitted from the light source to the optical system via the optical fiber, and/or the optical system and a photodetection section can be connected by an optical fiber, and the optical fiber allows a return light from grating RG to be transmitted from the optical system to the photodetection system.

Further, in the embodiment above, while the case has been described where coarse movement stages WCS1 and WCS2 were separable into the first section and the second section as well as the first section and the second section being engageable, besides this, the first section and the second section may have any type of arrangement, even when the first section and the second section are physically constantly apart, as long as they are reciprocally approachable and dividable, and on separation, a holding member (the fine movement stage in the embodiment above) is detachable, whereas when the distance is closed, the holding member is supportable.

Further, the drive mechanism of driving the fine movement stage with respect to the coarse movement stage is not limited to the mechanism described in each of the embodiments above. For example, in the embodiment, while the coil which drives the fine movement stage in the Y-axis direction also functioned as a coil which drives fine movement stage in the Z-axis direction, besides this, an actuator (linear motor) which drives the fine movement stage in the Y-axis direction and an actuator which drives the fine movement stage in the Z-axis direction, or more specifically, levitates the fine movement stage, can each be provided independently. In this case, because it is possible to make a constant levitation force act on the fine movement stage, the position of the fine movement stage in the Z-axis direction becomes stable. Incidentally, in the embodiments above, while the case has been described where mover sections 82a and 82b equipped in the fine movement stage have a U shape in a side view, as a matter of course, the mover section, as well as the stator section, equipped in the linear motor that drives the fine movement stage do not have to be U shaped.

Incidentally, in each of the embodiments above, while fine movement stages WFS1 and WFS2 are supported in a non-contact manner by coarse movement stage WCS1 or WCS2 by the action of the Lorentz force (electromagnetic force) besides this, for example, a vacuum preload type hydrostatic air bearings and the like can be arranged on fine movement stages WFS1 and WFS2 so that the stages are supported by levitation with respect to coarse movement stage WCS1 or WCS2. Further, in the embodiment above, while fine movement stages WFS1 and WFS2 could be driven in directions of all 6 degrees of freedom, the present invention is not limited to this, and fine movement stages WFS1 and WFS2 only needs to be able to move within a two-dimensional plane which is parallel to the XY plane. Further, fine movement stage drive systems 52A and 52B are not limited to the magnet moving type described above, and can also be a moving coil type as well. Furthermore, fine movement stages WFS1 and WFS2 can also be supported in contact with coarse movement stage WCS1 or WCS2. Accordingly, as the fine movement stage drive system which drives fine movement stages WFS1 and WFS2 with respect to coarse movement stage WCS1 or WCS2, for example, a rotary motor and a ball screw (or a feed screw) can also be combined for use.

Incidentally, in each of the embodiments above, the fine movement stage position measurement system can be configured so that position measurement is possible within the total movement range of the wafer stage. In this case, wafer stage position measurement system will not be required. Further, in the embodiment above, base board 12 can be a counter mass which can move by an operation of a reaction force of the drive force of the wafer stage. In this case, coarse movement stage does not have to be used as a counter mass, or when the coarse movement stage is used as a counter mass as in the embodiment described above, the weight of the coarse movement stage can be reduced.

Further, in each of the embodiments above, while the case has been described where an alignment mark measurement (wafer alignment) was performed as an example of measurement to wafer W in measurement station 300, as well as this (or instead of this), a surface position measurement to measure a position the wafer W surface in an optical axis direction AX of projection optical system PL can be performed. In this case, a surface position measurement of the upper surface of fine movement stage holding a wafer can be performed simultaneously with the surface position measurement as is disclosed in, for example, U.S. Patent Application Publication No. 2008/0088843 specification, and focus leveling control of wafer W at the time of exposure can be performed, using the results.

Incidentally, the wafer used in the exposure apparatus of the embodiment above is not limited to the 450 mm wafer, and can be a wafer of a smaller size (such as a 300 mm wafer).

Further, in each of the embodiments above, the case has been described where the exposure apparatus is a liquid immersion type exposure apparatus. However, the present invention is not limited to this, but can also be applied suitably in a dry type exposure apparatus that performs exposure of wafer W without liquid (water).

Incidentally, in the embodiment above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, this projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a non-linear optical crystal, can also be used as vacuum ultraviolet light.

Further, in the exposure apparatus of the present invention, illumination light IL is not limited to the light having a wavelength equal to or more than 100 nm, and it is needless to say that the light having a wavelength less than 100 nm can be used. For example, the present invention can be applied to an EUV exposure apparatus that uses an EUV (Extreme Ultraviolet) light in a soft X-ray range (e.g. a wavelength range from 5 to 15 nm). In addition, the present invention can also be applied to an exposure apparatus that uses charged particle beams such as an electron beam or an ion beam.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as each of the embodiments above can be obtained by measuring the position of this stage using an encoder system and a laser interferometer system.

Further, as is disclosed, in, for example, PCT International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the exposure apparatus of the present invention is not limited to a wafer, but may be other objects such as a glass plate, a ceramic substrate, a film member, or a mask blank.

In addition, the application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

Incidentally, the disclosures of all publications, the PCT International Publications, the U.S. Patent Applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in each of the embodiments previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus in each of the embodiments above, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam, the apparatus comprising:
    a holding member which holds the object, and is also movable at least within a two-dimensional plane including a first axis and a second axis that are orthogonal to each other;
    an exposure station in which an exposure processing to irradiate the energy beam on the object is performed, the exposure station having a first measurement system that irradiates at least one first measurement beam from below on the holding member, receives a return light of the first measurement beam and measures positional information of the holding member within the two-dimensional plane when the holding member is in a first area; and
    a measurement station which is placed away from the exposure station on one side in a direction parallel to the first axis and in which a measurement processing on the object is performed, the measurement station having a second measurement system that irradiates at least one second measurement beam from below on the holding member, receives a return light of the second measurement beam and measures positional information of the holding member within the two-dimensional plane when the holding member is in a second area, wherein
    the measurement station includes a plurality of mark detection systems, which has detection areas placed apart in a direction parallel to the second axis, and detects different marks, respectively, on the object.

2. The exposure apparatus according to claim 1, wherein the detection areas of the plurality of mark detection systems are set along a direction parallel to the second axis.

3. The exposure apparatus according to claim 1, wherein a relative position of the detection areas of the plurality of mark detection systems is variable at least in a direction parallel to the second axis.

4. The exposure apparatus according to claim 1, wherein the plurality of mark detection systems includes a first mark detection system having the detection area which is fixed and a second mark detection system having the detection area whose position can be adjusted at least in a direction parallel to the second axis.

5. The exposure apparatus according to claim 4, wherein the plurality of mark detection systems include at least a pair of the second mark detection systems whose detection centers can be set symmetrically with respect to a detection center of the first mark detection system.

6. The exposure apparatus according to claim 1, further comprising:
    a controller which makes the holding member move in a direction parallel to the first axis at the time of a detection operation by the plurality of mark detection systems.

7. The exposure apparatus according to claim 1, further comprising:
    a controller which detects every group of a plurality of groups of marks whose positions in a direction parallel to the first axis on the object are different by moving the holding member in a direction parallel to the first axis, using the plurality of mark detection systems, whereby
    of the plurality of groups of marks, at least one group of marks includes a plurality of marks whose positions are different in a direction parallel to the second axis.

8. The exposure apparatus according to claim 7, wherein the controller moves the holding member in a direction parallel to the second axis and detects the plurality of marks, using the plurality of mark detection systems.

9. The exposure apparatus according to claim 1, wherein a measurement plane is provided on a plane substantially parallel to the two-dimensional plane of the holding member, and
    the first measurement system irradiates at least one first measurement beam from below on the measurement plane of the holding member located in the first area, and the second measurement system irradiates at least one second measurement beam from below on the measurement plane of the holding member located in the second area.

10. The exposure apparatus according to claim 9, further comprising:
    a first movable body which is movable within the two-dimensional plane, and movably supports the holding member, wherein
    the first measurement system has a first measurement member in which at least a part of a first head that irradiates the first measurement beam on the measurement plane of the holding member supported by the first movable body and receives a return light of the first measurement beam is provided.

11. The exposure apparatus according to claim 10, further comprising:
a second movable body which is movable within the two-dimensional plane independently from the first movable body, and movably supports the holding member, wherein
the second measurement system has a second measurement member in which at least a part of a second head that irradiates the second measurement beam on the measurement plane of the holding member supported by the second movable body and receives a return light of the second measurement beam is provided.

12. The exposure apparatus according to claim 11, wherein the first and the second movable bodies each have a space inside,
the first measurement member is a first support member which can be inserted inside the space of the first movable body from a direction parallel to the first axis, and extends in the direction parallel to the first axis, and
the second measurement member is a second support member which can be inserted inside the space of the second movable body from a direction parallel to the first axis, and extends in the direction parallel to the first axis.

13. The exposure apparatus according to claim 12, wherein the first support member is inserted into the space inside the first movable body from one side of a direction parallel to the first axis, and the second support member is inserted into the space inside the second movable body from the other side of the direction parallel to the first axis.

14. An exposure apparatus that exposes an object with an energy beam via a projection optical system, the apparatus comprising:
a frame structure to support the projection optical system;
a base member placed under the projection optical system supported by the frame structure, and having a surface placed substantially parallel to a two-dimensional plane orthogonal to an optical axis of the projection optical system;
a holding member having a mounting area of the object and a measurement plane and being movable on the base member, the measurement plane being placed lower than the mounting area and having a grating;
an exposure station in which an exposure processing to irradiate the energy beam on the object via the projection optical system is performed, the exposure station having a first measurement member and a first measurement system, the first measurement member being supported by the frame structure, a part of the first measurement member being placed under the projection optical system, and the first measurement system measuring positional information of the holding member by irradiating the measurement plane with a first measurement beam from below via a first head section that is provided at the first measurement member to be placed between a surface of the base member and the measurement plane;
a measurement station which has a detection system distanced from the projection optical system and supported by the frame structure, and in which a measurement processing of the object by the detection system is performed, the measurement station having a second measurement member and a second measurement system, the second measurement member being supported by the frame structure, a part of the second measurement member being placed under the detection system, and the second measurement system measuring positional information of the holding member by irradiating the measurement plane with a second measurement beam from below via a second head section that is provided at the second measurement member to be placed between the surface of the base member and the measurement plane; and
a controller coupled to the first and the second measurement systems, that controls movement of the holding member based on the positional information measured by the first measurement system in the exposure station and controls movement of the holding member based on the positional information measured by the second measurement system in the measurement station.

15. The exposure apparatus according to claim 14, further comprising:
a liquid immersion device which has a liquid immersion member that supplies liquid to between the projection optical system and the holding member.

16. The exposure apparatus according to claim 15, further comprising:
a shutter member which holds the liquid with the liquid immersion member.

17. The exposure apparatus according to claim 14, wherein on the measurement plane, a reflective two-dimensional grating is formed, and
the first and the second measurement systems respectively detect the first and the second measurement beams reflected off the measurement plane, via the first and the second head sections, respectively.

18. The exposure apparatus according to claim 17, wherein a size of a formation area of the two-dimensional grating is larger than a size of the object held by the holding member.

19. The exposure apparatus according to claim 17, wherein the first measurement system has a detection point irradiated with the first measurement beam, within an exposure area that is irradiated with the energy beam via the projection optical system, in a first direction and a second direction orthogonal to each other within the two-dimensional plane.

20. The exposure apparatus according to claim 19, wherein the detection point substantially coincides with a center of the exposure area.

21. The exposure apparatus according to claim 19, wherein the first measurement system irradiates the measurement plane with a plurality of first measurement beams that include the first measurement beam, and
the plurality of first measurement beams are irradiated on a plurality of detection points, respectively, positions of the plurality of detection points being different in at least one of the first direction and the second direction.

22. The exposure apparatus according to claim 21, wherein the first measurement system measures the positional information of the holding member in directions of six degrees of freedom that include the first and the second directions and a third direction orthogonal to the first and the second directions.

23. The exposure apparatus according to claim 22, wherein one of the plurality of detection points substantially coincides with a center of the exposure area.

24. The exposure apparatus according to claim 23, wherein the plurality of detection points include a pair of detection points that are placed substantially symmetrical with respect to the center in the exposure area.

25. The exposure apparatus according to claim 22, wherein the exposure station and the measurement station are placed so that a position of the exposure station and a position of the measurement station are different in the first direction of the two-dimensional plane,
a part of the first measurement member is arranged extending in the first direction under the projection optical system, and
a part of the second measurement member is arranged extending in the first direction under the detection system.

26. The exposure apparatus according to claim 25, wherein the first measurement member is provided with the first head section on one side in the first direction and is supported on an other side in the first direction by the frame structure, and
the second measurement member is provided with the second head section on the other side in the first direction and is supported on the one side in the first direction by the frame structure.

27. The exposure apparatus according to claim 26, wherein each of the first and the second measurement members is supported only on one end side in the first direction by the frame structure.

28. The exposure apparatus according to claim 26, wherein the first measurement beam of the first measurement system passes through an inside of the first measurement member, and the second measurement beam of the second measurement system passes through an inside of the second measurement member.

29. A device manufacturing method, including:
exposing the object using the exposure apparatus according to claim 14; and
developing the object which has been exposed.

30. A method of making an exposure apparatus that exposes an object with an energy beam via a projection optical system, the method comprising:
supporting the projection optical system by a frame structure;
placing a base member under the projection optical system supported by the frame structure so that a surface of the base member is substantially parallel to a two-dimensional plane orthogonal to an optical axis of the projection optical system;
placing a holding member on the base member, the holding member having a mounting area of the object and a measurement plane that is placed lower than the mounting area and has a grating;
providing an exposure station in which an exposure processing to irradiate the energy beam on the object via the projection optical system is performed, the exposure station having a first measurement member and a first measurement system, the first measurement member being supported by the frame structure, a part of the first measurement member being placed under the projection optical system, and the first measurement system measuring positional information of the holding member by irradiating the measurement plane with a first measurement beam from below via a first head section that is provided at the first measurement member to be placed between a surface of the base member and the measurement plane;
providing a measurement station which has a detection system distanced from the projection optical system and supported by the frame structure, and in which a measurement processing of the object by the detection system is performed, the measurement station having a second measurement member and a second measurement system, the second measurement member being supported by the frame structure, a part of the second measurement member being placed under the detection system, and the second measurement system measuring positional information of the holding member by irradiating the measurement plane with a second measurement beam from below via a second head section that is provided at the second measurement member to be placed between the surface of the base member and the measurement plane; and
coupling a controller to the first and the second measurement systems, the controller controlling movement of the holding member based on the positional information measured by the first measurement system in the exposure station and controlling movement of the holding member based on the positional information measured by the second measurement system in the measurement station.

* * * * *

UNITED STATES PATENT AND TRADEMARK OFFICE
CERTIFICATE OF CORRECTION

Page 1 of 1

PATENT NO. : 8,773,635 B2
APPLICATION NO. : 12/640508
DATED : July 8, 2014
INVENTOR(S) : Yuichi Shibazaki It is certified that error appears in the above-identified patent and that said Letters Patent is hereby corrected as shown below:

On the title page item (54) and in the specification, column 1, line 1, the Title should read as follows:
--EXPOSURE APPARATUS WITH POSITIONING SYSTEM AND DEVICE MANUFACTURING METHOD--

The following references should be included in the "References Cited" item (56):

Under "U.S. PATENT DOCUMENTS":
--8,134,689 B2*    3/2012    Li et al.--
--8,325,325 B2*    12/2012   Shibazaki--
--2004/0080737 A1*  4/2004   Jasper et al.--

Under "OTHER PUBLICATIONS":
--U.S. Appl. No. 12/782,310, filed May 18, 2010, in the name of Yuichi Shibazaki*--
--U.S. Appl. No. 12/805,945, filed August 25, 2010, in the name of Yuichi Shibazaki*--

Signed and Sealed this
Eighth Day of March, 2016

Michelle K. Lee
*Director of the United States Patent and Trademark Office*